(12) United States Patent
Chang et al.

(10) Patent No.: US 8,796,091 B2
(45) Date of Patent: Aug. 5, 2014

(54) THREE-DIMENSIONAL SEMICONDUCTOR MEMORY DEVICES

(71) Applicant: Samsung Electronics Co., Ltd., Suwon-si (KR)

(72) Inventors: Sung-Il Chang, Hwaseong-si (KR); Youngwoo Park, Seoul (KR); Kwang Soo Seol, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/012,588

(22) Filed: Aug. 28, 2013

(65) Prior Publication Data

US 2014/0094012 A1    Apr. 3, 2014

Related U.S. Application Data

(62) Division of application No. 13/198,234, filed on Aug. 4, 2011, now Pat. No. 8,530,959.

(30) Foreign Application Priority Data

Aug. 20, 2010 (KR) ........................ 10-2010-0080954

(51) Int. Cl.
*H01L 21/336* (2006.01)
(52) U.S. Cl.
USPC .... 438/264; 438/261; 438/591; 257/E29.262; 257/329
(58) Field of Classification Search
CPC ................................................... H01L 27/115

USPC ....... 257/E29.262, E29.3, E29.309, E23.141, 257/192, 288, 315, 319, 324, 329, 786; 438/212, 216, 261, 264, 478, 591, 593, 438/594, 612, 666; 365/185.18
See application file for complete search history.

(56) References Cited

U.S. PATENT DOCUMENTS

| 7,535,051 | B2 | 5/2009 | Kim et al. | |
| 7,842,569 | B2 | 11/2010 | Kim et al. | |
| 8,173,506 | B2 | 5/2012 | Jung et al. | |
| 2008/0035984 | A1 | 2/2008 | Kim et al. | |
| 2009/0321816 | A1* | 12/2009 | Son et al. | 257/326 |
| 2011/0180941 | A1 | 7/2011 | Hwang et al. | |
| 2011/0199804 | A1 | 8/2011 | Son et al. | |
| 2011/0233648 | A1 | 9/2011 | Seol et al. | |
| 2011/0266606 | A1* | 11/2011 | Park et al. | 257/314 |
| 2011/0303970 | A1* | 12/2011 | Kim et al. | 257/324 |

(Continued)

OTHER PUBLICATIONS

Jang et al., Vertical Cell Array Using TCAT (Terabit Cell Array Transistor) Technology for Ultra High Density NAND Flash Memory; 2009 Symposium on VLSI Technology Digest of Technical Papers; pp. 192-193.

(Continued)

*Primary Examiner* — Chris Chu
(74) *Attorney, Agent, or Firm* — F. Chau & Associates, LLC

(57) ABSTRACT

Provided are three-dimensional semiconductor devices. A device includes an electrode structure including conductive patterns sequentially stacked on a substrate, a semiconductor pattern penetrating the electrode structure and including channel regions adjacent to the conductive patterns and vertical adjacent regions between the channel regions, and a semiconductor connecting layer extending from an outer sidewall of the semiconductor pattern to connect the semiconductor pattern to the substrate.

7 Claims, 52 Drawing Sheets

(56) References Cited

U.S. PATENT DOCUMENTS

| | | |
|---|---|---|
| 2012/0049268 A1 | 3/2012 | Chang et al. |
| 2012/0086048 A1 | 4/2012 | Park et al. |
| 2012/0086072 A1 | 4/2012 | Yun et al. |
| 2012/0098050 A1* | 4/2012 | Shim et al. ............ 257/324 |
| 2012/0120728 A1 | 5/2012 | Kim et al. |
| 2012/0139027 A1* | 6/2012 | Son et al. ............ 257/324 |
| 2012/0248525 A1 | 10/2012 | Lee et al. |
| 2012/0299086 A1 | 11/2012 | Lee |

OTHER PUBLICATIONS

Tanaka et al., Bit Cost Scalable Technology with Punch and Plug Process for Ultra High Density Flash Memory; 2007 Symposium on VLSI Technology Digest of Technical Papers; pp. 14-15.

* cited by examiner

THREE-DIMENSIONAL SEMICONDUCTOR MEMORY DEVICES

CROSS-REFERENCE TO RELATED APPLICATIONS

This patent application is a divisional application of U.S. patent application Ser. No. 13/198,234 filed on Aug. 4, 2011, which claims priority under 35 U.S.C. §119 to Korean Patent Application No. 10-2010-0080954, filed on Aug. 20, 2010, in the Korean Intellectual Property Office, the disclosures of which are incorporated by reference herein in their entireties.

BACKGROUND

Exemplary embodiments of the inventive concept relate to semiconductor devices, and more particularly, to three-dimensional semiconductor memory devices including three-dimensionally arranged memory cells.

A 3D-IC memory fabrication process that has memory cells stacked in 3 dimensions may be used to increase a memory capacity.

The 3D-IC memory fabrication includes a punch-and-plug process in which multiple thin layers are sequentially stacked on a substrate and then penetrated to form plugs. The punch-and-plug process may increase memory capacity without a drastic increase of manufacturing costs.

SUMMARY

Exemplary embodiments of the inventive concept may provide a three-dimensional memory device that may be fabricated by a simple process and may erase memory cells based on a body or bulk erase scheme.

According to an exemplary embodiment of the inventive concept, a three-dimensional semiconductor device may include an electrode structure including conductive patterns sequentially stacked on a substrate, a semiconductor pattern penetrating the electrode structure and including channel regions adjacent to the conductive patterns and vertical adjacent regions between the channel regions, and a semiconductor connecting layer extending from an outer sidewall of the semiconductor pattern to connect the semiconductor pattern to the substrate.

According to an embodiment, the device may further include memory elements interposed between the channel regions and the conductive patterns, respectively, wherein each of the memory elements includes a horizontal pattern and a vertical pattern. The vertical pattern may extend vertically to cover an outer sidewall of the semiconductor pattern, and the horizontal pattern may extend horizontally to cover a top surface and a bottom surface of the conductive pattern.

According to an embodiment, the vertical pattern may exposes the outer sidewall of the semiconductor pattern through a recess region, wherein the semiconductor connecting layer contacts the semiconductor pattern through the recess region.

According to an embodiment, the vertical pattern may include a lower insulating pattern covering a lower sidewall and a bottom surface of the semiconductor pattern, and a preliminary upper insulating pattern covering outer sidewalls of the vertical adjacent regions.

According to an embodiment, the lower insulating pattern may be separated from the preliminary upper insulating pattern by the semiconductor connecting layer or the semiconductor pattern.

According to an embodiment, the semiconductor pattern may be spaced apart from the substrate by the lower insulating pattern.

According to an embodiment, the semiconductor connecting layer may extend to cover a sidewall and a bottom surface of a conductive pattern closest to the substrate among the conductive patterns.

According to an embodiment, the device may further include a gate insulating layer interposed between the conductive pattern closest to the substrate and the semiconductor connecting layer, wherein the gate insulating layer may be formed of a different material from the horizontal pattern.

According to an embodiment, the device may further include an insulating layer interposed between the conductive patterns, wherein a distance between a bottom surface of a conductive pattern closest to the substrate among the conductive patterns and the semiconductor connecting layer may be greater than a distance between a top surface of the conductive pattern closest to the substrate and the insulating layer.

According to an embodiment, the device may further include a doped region that is formed in the substrate and spaced apart from the semiconductor pattern, wherein a bottom surface of the vertical pattern may be positioned at a lower level than a bottom surface of the doped region.

According to an exemplary embodiment of the inventive concept, a method of fabricating a three-dimensional semiconductor device may include forming a mold structure on a substrate, the mold structure including a first sacrificial layer and second sacrificial layers on the first sacrificial layer, forming an opening penetrating the mold structure to expose the substrate, sequentially forming a vertical pattern and a semiconductor pattern in the opening, patterning the mold structure to form a trench spaced apart from the opening and exposing the first sacrificial layer, removing the exposed first sacrificial layer and a portion of the vertical pattern contacting the first sacrificial layer to form a first recess region that exposes the substrate and a sidewall of the semiconductor pattern, and forming a semiconductor connecting layer that extends from the exposed sidewall of the semiconductor pattern to connect the semiconductor pattern to the substrate.

According to an embodiment, the first sacrificial layer may include at least one of a silicon germanium layer or a silicon carbide layer, and the second sacrificial layers each may include a silicon nitride layer.

According to an embodiment, forming the mold structure may include forming the first sacrificial layer on the substrate, and alternately forming insulating layers and the second sacrificial layers on the first sacrificial layer.

According to an embodiment, the method may further include forming a first protection layer between the first sacrificial layer and the insulating layers, wherein the first protection layer may be formed of the substantially same material as the second sacrificial layers.

According to an embodiment, the method may further include forming a gate insulating layer on the semiconductor connecting layer.

According to an embodiment, the method may further include removing the second sacrificial layers exposed by the trench to form second recess regions, and forming horizontal structures that fill the first and second recess regions. According to an embodiment, the forming the horizontal structure may include forming a horizontal pattern covering inner walls of the first and second recess regions, and forming conductive patterns that fill remaining spaces of the first and second recess regions.

According to an embodiment, the method may further include forming a second protection layer covering a sidewall and a bottom surface of the trench, which may be performed between the forming of the first recess region and the forming of the second recess regions. The second protection layer may be formed along the first recess region.

According to an embodiment, the method may further include forming a third protection layer on an inner wall of the trench, which may be performed between the forming of the trench and the removing of the first sacrificial layer.

According to an embodiment, the method may further include removing the second sacrificial layers exposed by the trench to form second recess regions, and forming horizontal structures in the first and second recess regions. Here, forming the horizontal structures may include forming horizontal patterns covering inner walls of the second recess regions and first conductive patterns filling remaining spaces of the second recess regions, forming a gate insulating layer on the semiconductor connecting layer, and forming a second conductive pattern to fill a remaining space of the first recess region.

According to an embodiment, the first conductive pattern may be formed of a different material from the second conductive pattern.

According to an embodiment, there is provided a three-dimensional semiconductor device comprising a plurality of conductive patterns sequentially stacked on a substrate, a vertical pattern and a semiconductor pattern sequentially covering an inner wall of an opening that penetrates the plurality of conductive patterns perpendicular to the plurality of conductive patterns, and a semiconductor connecting layer connecting the semiconductor pattern to the substrate, wherein a portion of the vertical pattern is replaced by a portion of the semiconductor connecting layer which contacts the semiconductor pattern. The portion of the vertical pattern is located between the semiconductor pattern and a conductive pattern closest to the substrate among the plurality of conductive patterns.

BRIEF DESCRIPTION OF THE DRAWINGS

Exemplary embodiments will be more clearly understood from the description taken in conjunction with the accompanying drawings.

DETAILED DESCRIPTION

Figure 1:
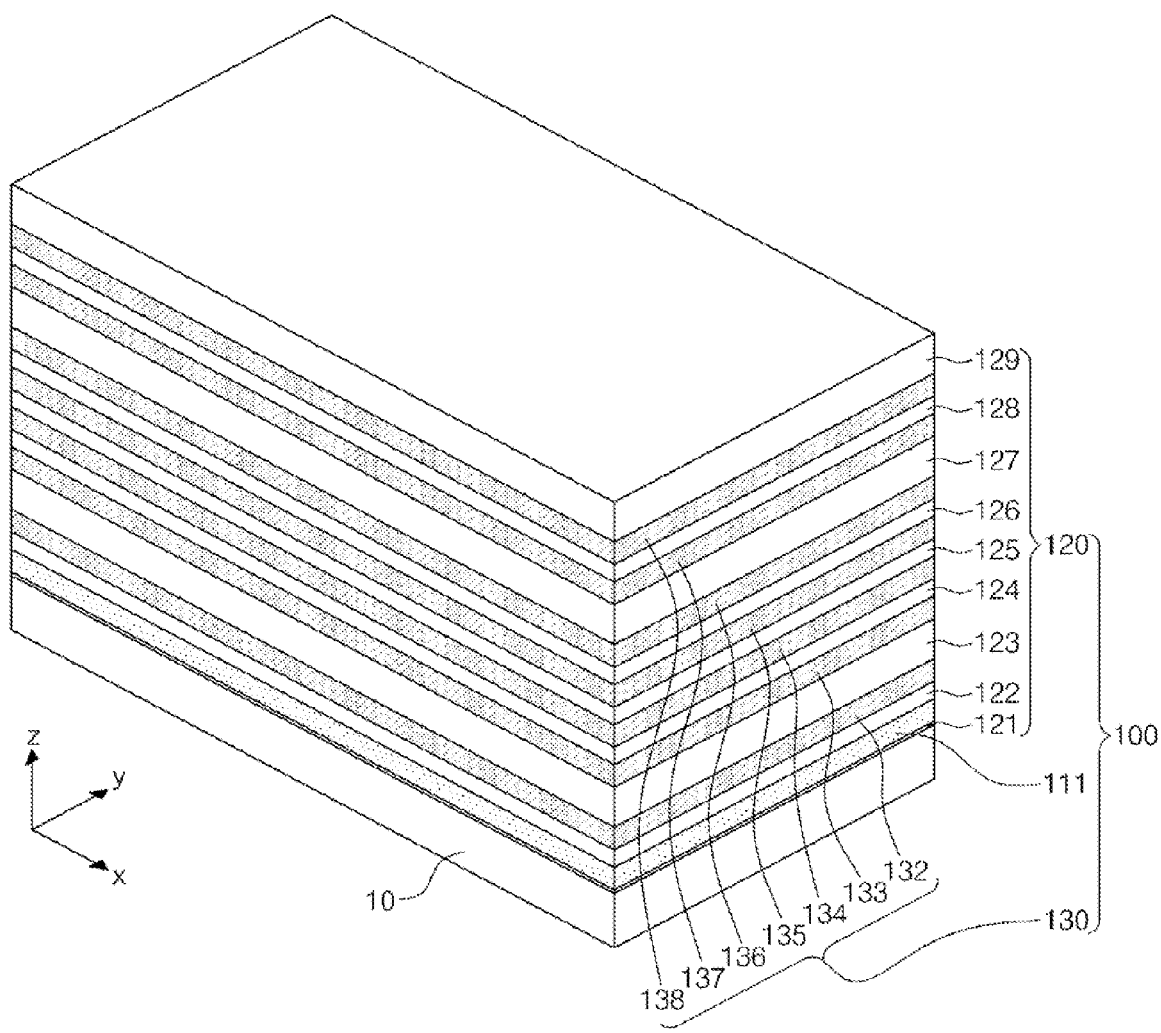
FIGS. 1 through 6, 7A, 7B, 8A, 8B, 9A, 9B, 10, 11A, 11B, 12, 13A, and 13B are perspective views illustrating a three-dimensional semiconductor device and a method of fabricating the three-dimensional semiconductor device according to an exemplary embodiment of the inventive concept.

Exemplary embodiments of the inventive concept will now be described more fully with reference to the accompanying drawings, in which the same reference numerals may be used to denote the same or substantially the same elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

A three-dimensional semiconductor device according to an exemplary embodiment of the inventive concept includes a cell array region, a peripheral circuit region, a sense amp region, a decoding circuit region, and a connection region. A plurality of memory cells and bit lines and word lines for electrical connection to the plurality of memory cells are in the cell array region. Circuits for driving the plurality of memory cells are in the peripheral circuit region, and circuits for reading information stored in the plurality of memory cells are in the sense amp region. The connection region is located between the cell array region and the decoding circuit region, and a wiring structure for electrically connecting the word lines with the decoding circuit region is located between the word lines and the decoding region.

FIGS. 1 through 13 are perspective views illustrating a three-dimensional semiconductor device and a method of fabricating the three-dimensional semiconductor device according to an exemplary embodiment of the inventive concept.

Referring to FIG. 1, a mold structure 100 is formed on a substrate 10. For example, according to an embodiment, the substrate 10 may include a material having semiconductor properties, an insulating material, a conductor, and/or one or more of these materials covered by an insulating material. For example, according to an embodiment, the substrate 10 may be a silicon wafer.

The mold structure 100 includes a first sacrificial layer 111, an insulating layer group 120 including insulating layers 121 to 129, and a second sacrificial layer group 130 including second sacrificial layers 132 to 138. The insulating layers 121 to 129 and sacrificial layers including the first and second sacrificial layers 111 and 132 to 138 are alternately stacked on each other.

The first sacrificial layer 111, the second sacrificial layers 132 to 138, and the insulating layers 121 to 129 are formed of materials having an etch selectivity to each other. For instance, according to an embodiment, the insulating layer group 120 may include a material that is etched by a specific etchant at a slower rate than an etch rate of a material of the second sacrificial layer group 130. According to an embodiment, the first sacrificial layer 111 may include at least a material having an etch selectivity to the second sacrificial group 130. For instance, according to an embodiment, the second sacrificial layer group 130 may include at least a layer formed of silicon, silicon oxide, or silicon nitride, and the first sacrificial layer 111 may include at least a layer formed of silicon germanium or silicon carbide. The first sacrificial layer 111 includes at least a material having an etch selectivity to the insulating layer group 120. For instance, according to an embodiment, the insulating layer group 120 may include at least a layer formed of silicon oxide or silicon nitride, and the first sacrificial layer 111 may include at least a layer formed of silicon germanium or silicon carbide. Hereafter, an exemplary embodiment will be described that includes a silicon oxide insulating layer group 120, a silicon nitride second sacrificial layer group 130, and a silicon germanium first sacrificial layer 111. However, the exemplary embodiments of the present inventive concept are not limited thereto. Nor is each layer group limited to a single material.

According to an embodiment, the first and second sacrificial layers 111 and 132 to 138 are formed to have the same or substantially the same thickness. According to an embodiment, the first sacrificial layer 111 may be thicker than each of the second sacrificial layers 132 to 138. For instance, according to an embodiment, a thickness of the first sacrificial layer 111 may be two times greater than a thickness of each of the second sacrificial layers 132 to 138. According to an embodiment, thicknesses of the insulating layers 121 to 129 may be different from each other. For instance, according to an embodiment, the insulating layer 121 may be thinner in thickness than each of the first and second sacrificial layers 111 and 132 to 138, and the insulating layer 123 and the insulating layer 127 may be thicker in thickness than each of the first and second sacrificial layers 111 and 132 to 138. According to embodiments, the thicknesses of the insulating layers 121 to 129 and the number of layers constituting the mold structure 100 may be changed. Hereinafter, for ease of description, each of the insulating layers 121 to 129 is collectively referred to as an insulating layer 120, and each of the second sacrificial layers 132 to 138 is collectively referred to as a second sacrificial layer 130.

Figure 2:
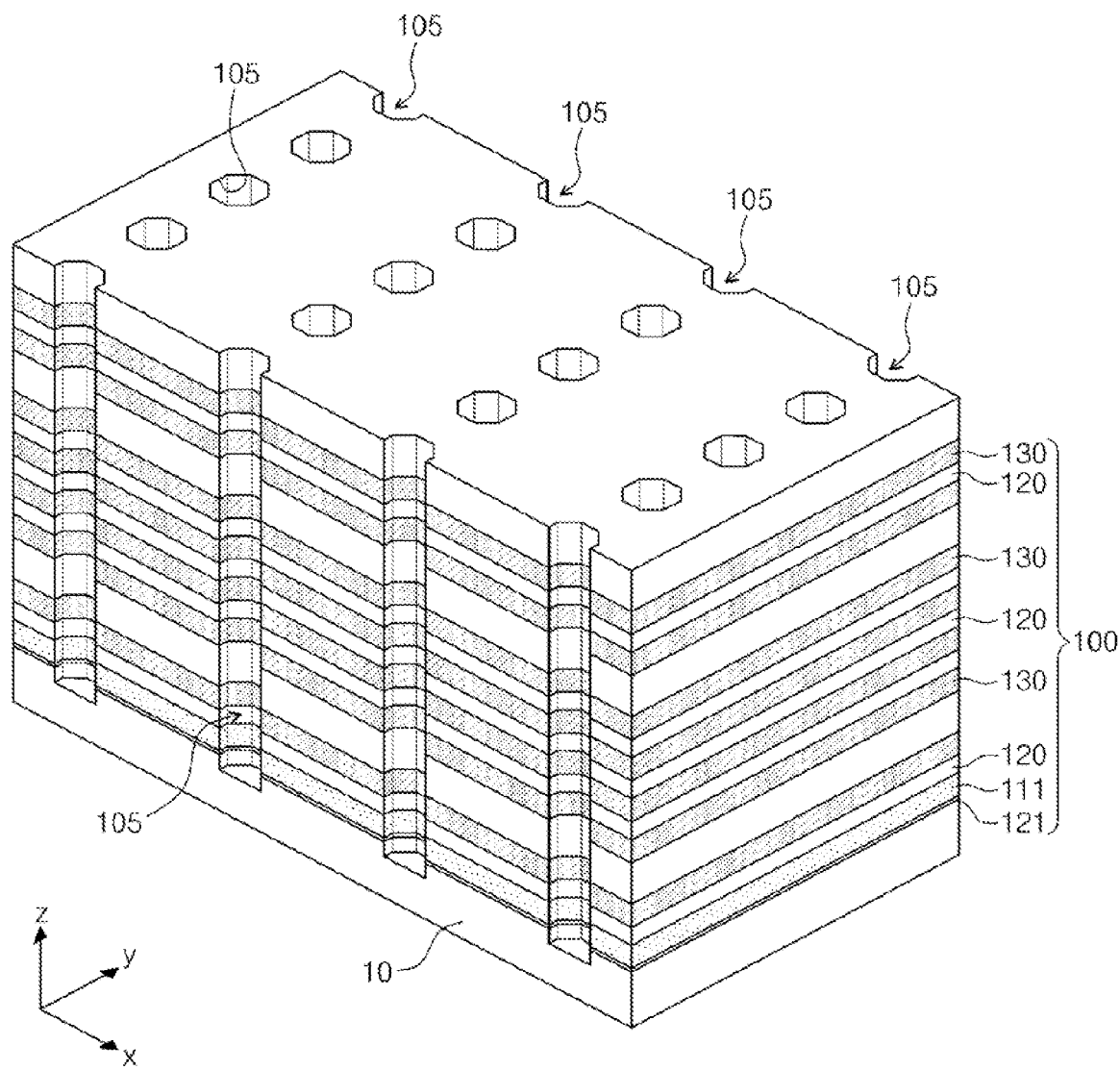
Figure 3:
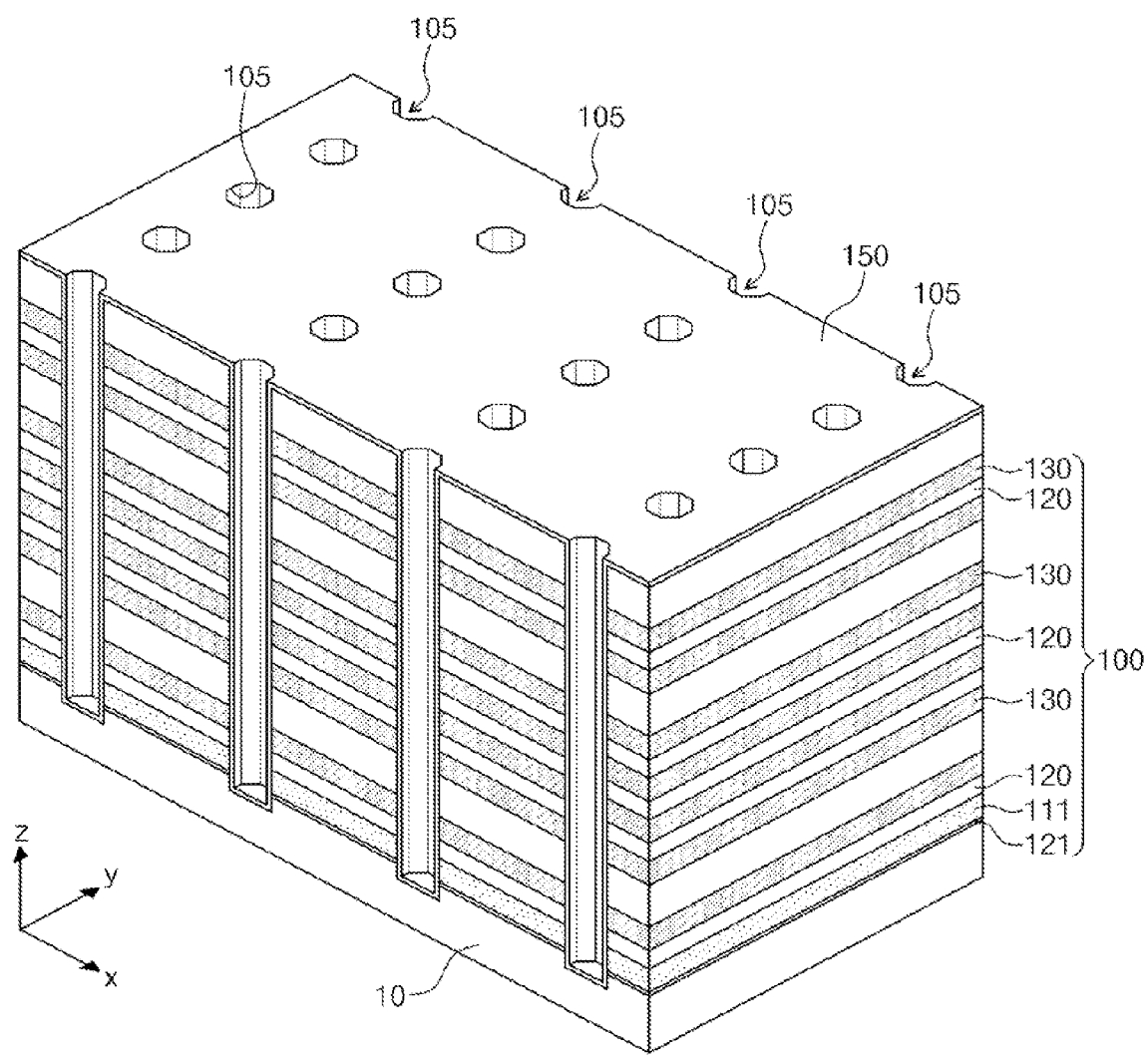

Referring to FIGS. 2 and 3, openings 105 are formed to penetrate the mold structure 100. A vertical layer 150 is formed to cover the inner walls of the openings 105. The vertical layer 150 horizontally extends from the openings 105 to cover the top surface of the mold structure 100. As used herein, the term "vertical" is used to represent verticality of the vertical layer 150 or a vertical structure VS to be described below. However, the vertical layer 150 or the vertical structure VS is not limited to having a sidewall perpendicular to a top surface of the substrate 10. According to an embodiment, the vertical layer 150 and the vertical structure VS may be formed to have a sidewall substantially not perpendicular to the top surface of the substrate 10 while central axes of the vertical layer 150 and vertical structure VS may be substantially perpendicular to the top surface of the substrate 10. For instance, according to an embodiment, the vertical layer 150 may be conformally formed on inner walls of the downwardly tapered openings 105. According to an embodiment, a sidewall of the vertical layer 150 may not be perpendicular to the top surface of the substrate 10 while a central axis of the vertical layer 150 may be substantially perpendicular to the substrate 10.

According to an exemplary embodiment, the openings 105 may be formed to have a hole shape. According to an embodiment, each of the openings 105 may be formed so that a depth may be at least five times its width (e.g., an aspect ratio of 5). The openings 105 are two-dimensionally arranged on the top surface (e.g., on the xy plane) of the substrate 10. For example, according to an embodiment, each opening 105 may be spaced apart from the other openings 105 along x and y directions.

The forming of the openings 105 includes forming a mask pattern defining positions of the openings 105 on the mold structure 100 and, for example, anisotropically etching the mold structure 100 using the mask pattern as an etch mask. The mold structure 100 includes two kinds of different layers, and as a consequence, the sidewalls of the openings 105 may not be completely uniform. For example, as the openings 105 are closer to the substrate 10, the width of the openings 105 may decrease.

The openings 105 are formed to expose the top surface of the substrate 10 as illustrated in FIG. 2. According to an embodiment, as shown in FIG. 2, the substrate 10 may be recessed from below the openings 105 to a certain depth due to over-etch during the anisotropic etching of the mold structure 100.

The vertical layer 150 includes a thin layer or a plurality of thin layers. For example, according to an embodiment, the vertical layer 150 may include at least one of thin layers used as a memory element of a charge trap type nonvolatile memory transistor. As will be described in detail with reference to FIGS. 41 through 56, exemplary embodiments of the inventive concept may be diversely classified according to the thin layers of the vertical layer 150.

Figure 4:
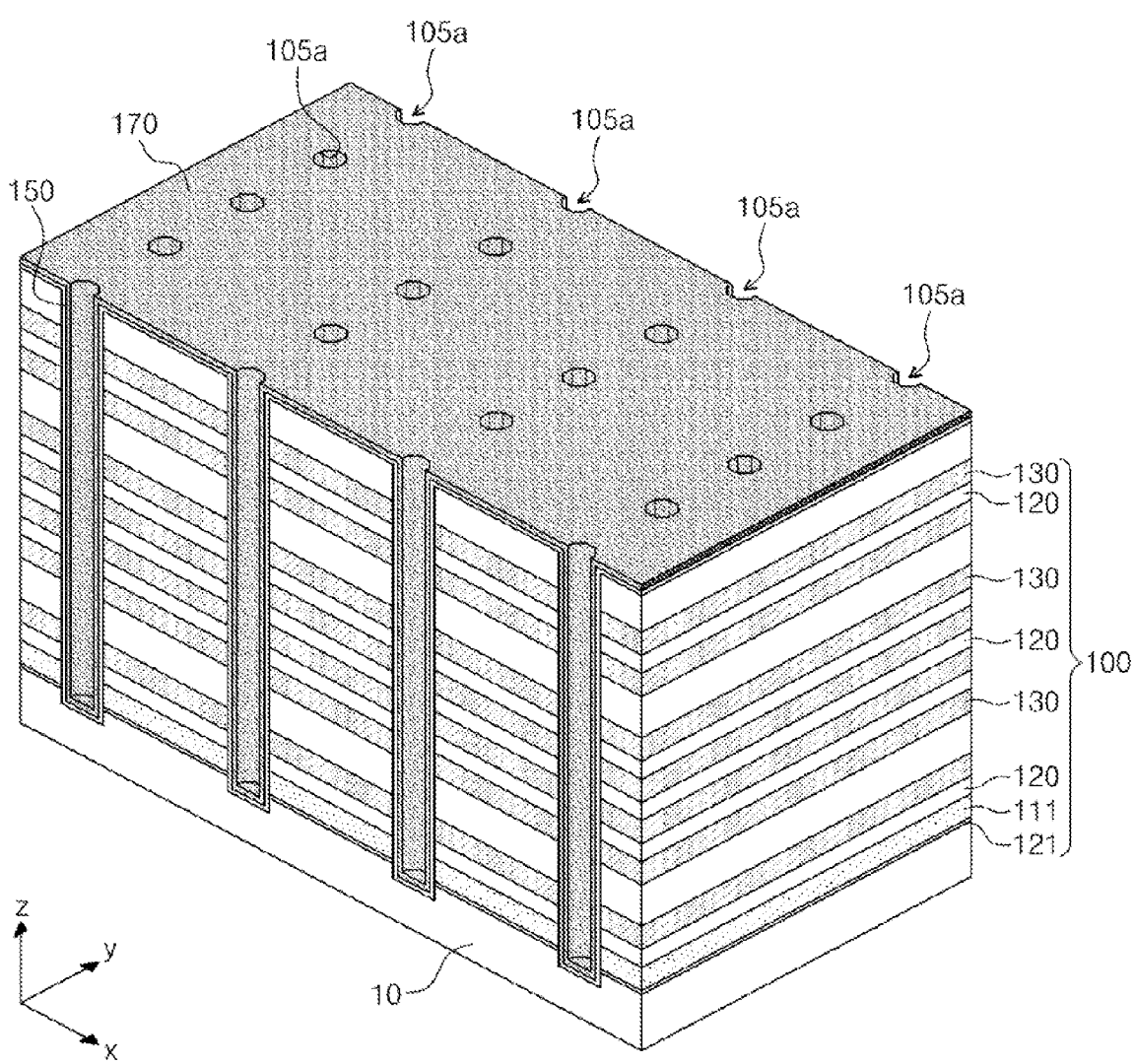

Referring to FIG. 4, a first semiconductor layer 170 is formed on the vertical layer 150. The first semiconductor layer 170 is a silicon layer (e.g., a polycrystalline silicon layer) formed using one of, for example, atomic layer deposition (ALD) and chemical vapor deposition (CVD). According to an embodiment, the first semiconductor layer 170 may be conformally formed to have a thickness that does not completely fill the opening 105 so that holes 105a remain in the openings 105. According to an embodiment, the first semiconductor layer 170 may be formed to have a thickness ranging from about $1/50$ to $1/5$ of a width of the opening 105. According to an embodiment, the first semiconductor layer 170 may include one of, for example, an organic semiconductor layer and carbon nano structures.

Figure 5:
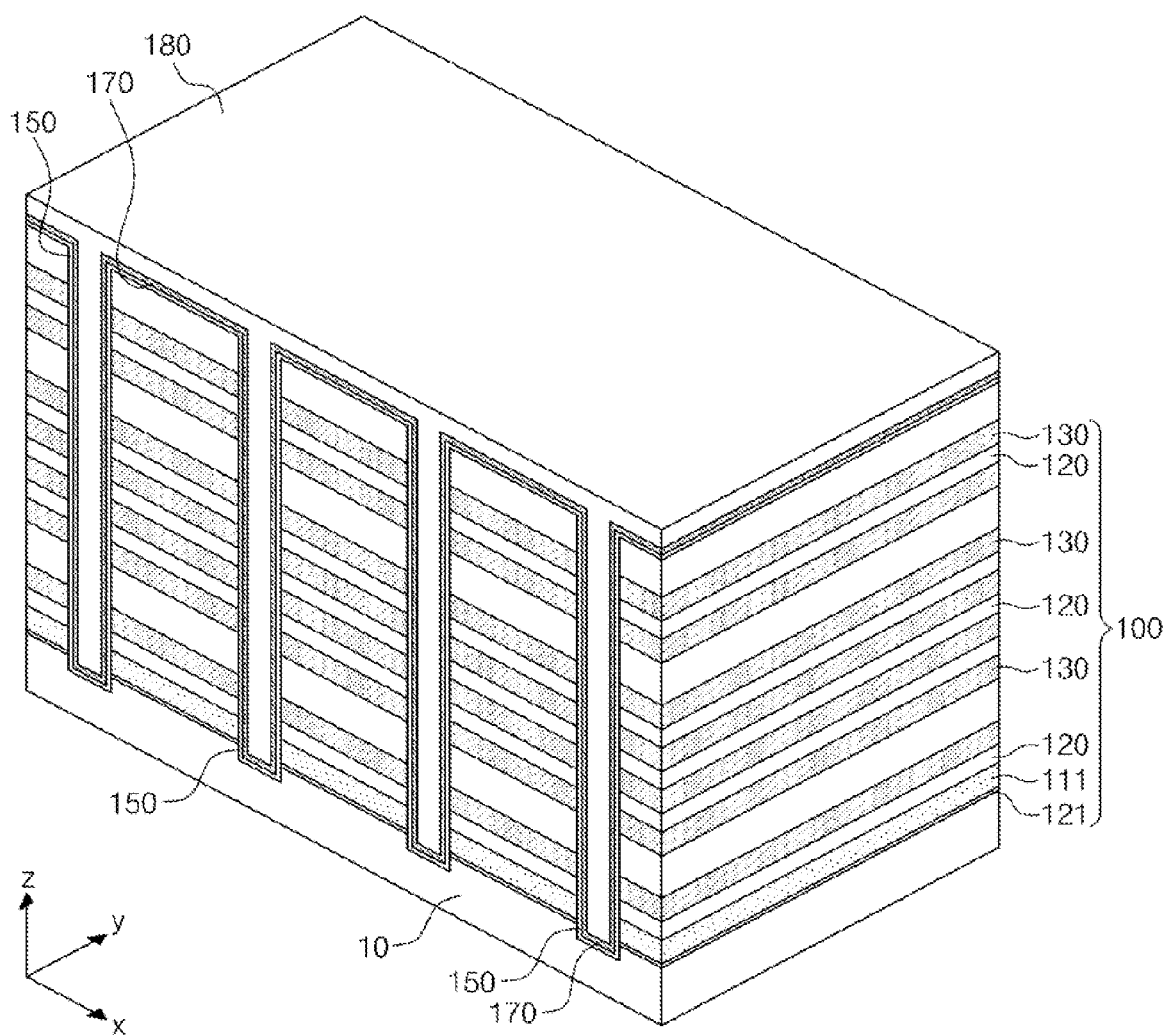

Referring to FIG. 5, an insulative filling layer 180 is formed on the resultant structure having the first semiconductor layer 170 to fill the holes 105a. According to an embodiment, the insulative filling layer 180 may be an insulating material formed by using a spin-on-glass (SOG) method and/or a silicon oxide layer. According to an embodiment, the structure including the first semiconductor layer 170 may be thermally annealed under a gas atmosphere including hydrogen and/or deuterium (e.g., before the forming of the insulative filling layer 180). According to an embodiment, crystal defects in the first semiconductor layer 170 may be cured and/or reduced during hydrogen annealing.

According to an embodiment of the inventive concept, the first semiconductor layer 170 may be formed to fill the openings 105, and the forming of the insulative filling layer 180 may be omitted.

Figure 6:
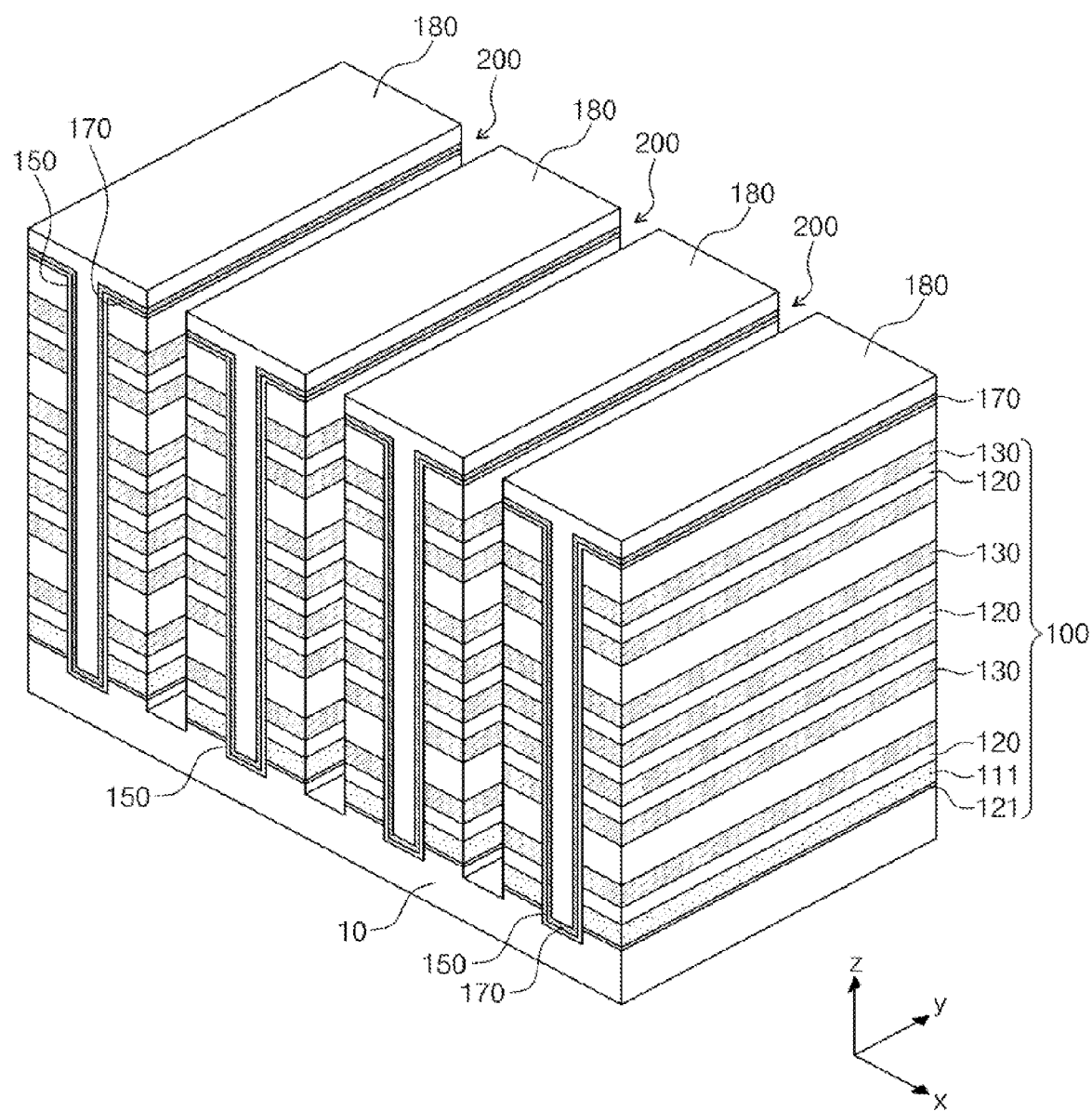

Referring to FIG. 6, the mold structure 100 is patterned to form trenches 200 that are spaced apart from the openings 105 and expose the first sacrificial layer 111. According to an embodiment, the trenches 200 may be formed to expose the substrate 10. According to an embodiment, the formation of the trenches 200 may include forming an etch mask on the mold structure 100 and/or on the insulative filling layer 180 and anisotropically etching layers below the etch mask to expose the top surface of the substrate 10. According to an embodiment, top entrances of the trenches 200 may be defined by the first semiconductor layer 170, the vertical layer 150, and the insulative filling layer 180, which are patterned during the anisotropic etching of the layers below the etch mask. The substrate 10 is recessed from under the trench 200 to a certain depth, as shown in FIG. 6, by over-etch during the anisotropic etching of the layers below the etch mask. According to an embodiment, a pair of the trenches 200 may be formed at both sides of each of the openings 105.

Figure 7A:
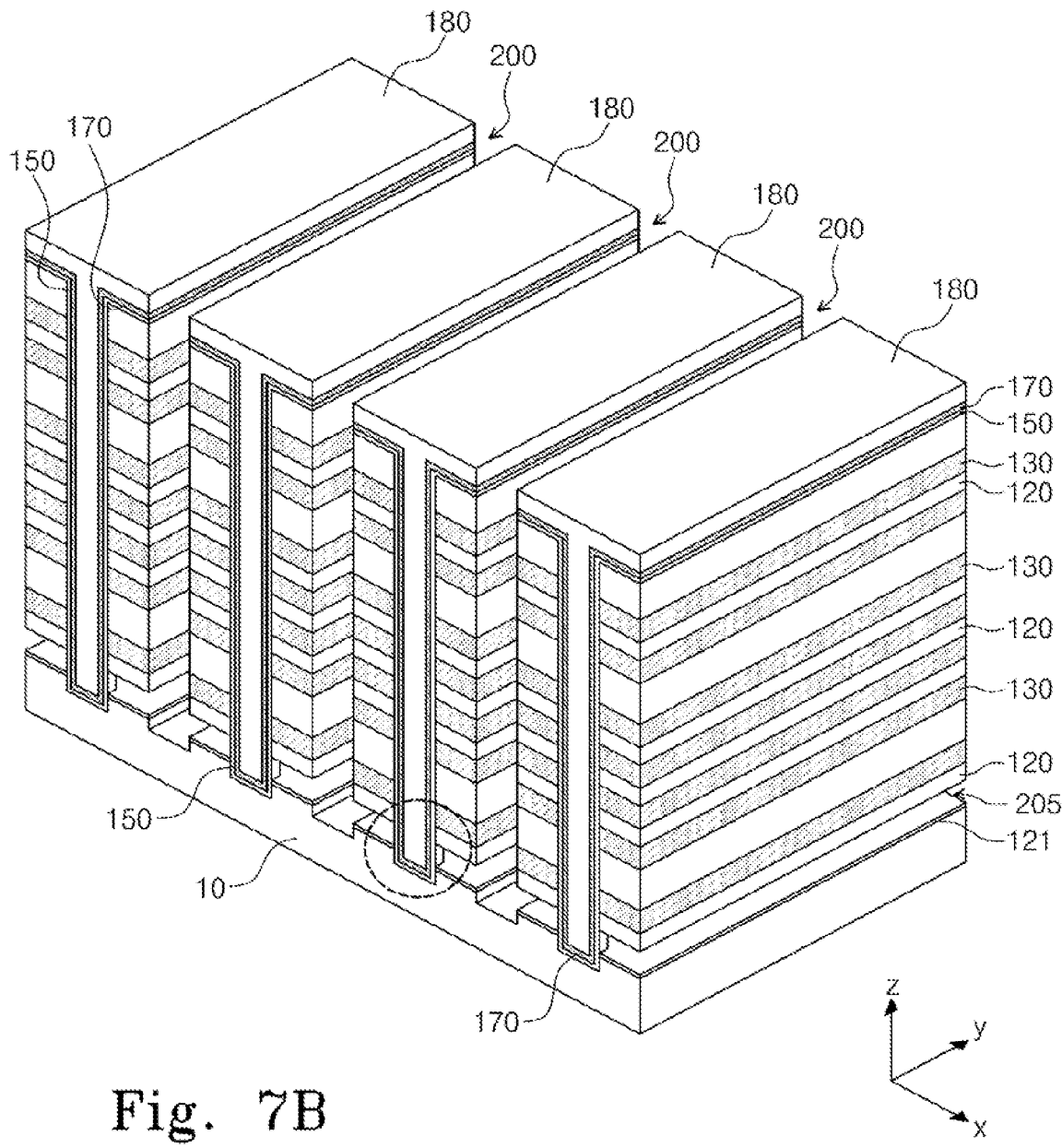
Figure 7B:
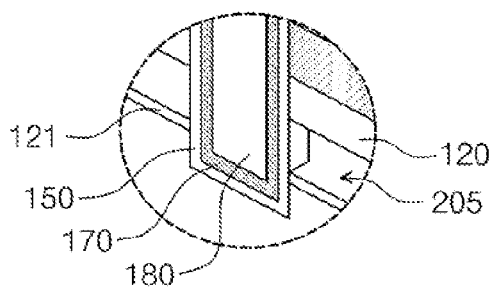

Referring to FIG. 7, first recess regions 205 are formed by selectively removing the first sacrificial layer 111 exposed by the trenches 200. The first recess regions 205 are gap regions laterally extending from the trenches 200, and are formed to expose sidewalls of the vertical layers 150. The first recess regions 205 are formed to extend along the y-direction. According to an embodiment, the selective removal of the first sacrificial layer 111 may include laterally etching the first sacrificial layer 111 using, for example, an etchant and/or etch process having an etch selectivity to the insulating layers 120 and the second sacrificial layers 130. Sidewalls of the mold structure 100 exposed by the trenches 200 are partially removed during the formation of the first recess region 205. During the selective removal of the first sacrificial layer 111, the second sacrificial layers 130 exhibit a different etching characteristic from the insulating layers 120. According to an embodiment, sidewalls of the mold structure 100 exposed by the trenches 200 may be formed to have a concavo-convex profile. The lowermost insulating layer 121 remains after the removal of the first sacrificial layer 111 as shown in FIG. 7. Alternatively, the lowermost insulating layer 121 may be at least partially removed along with the first sacrificial layer 111.

Figure 8A:
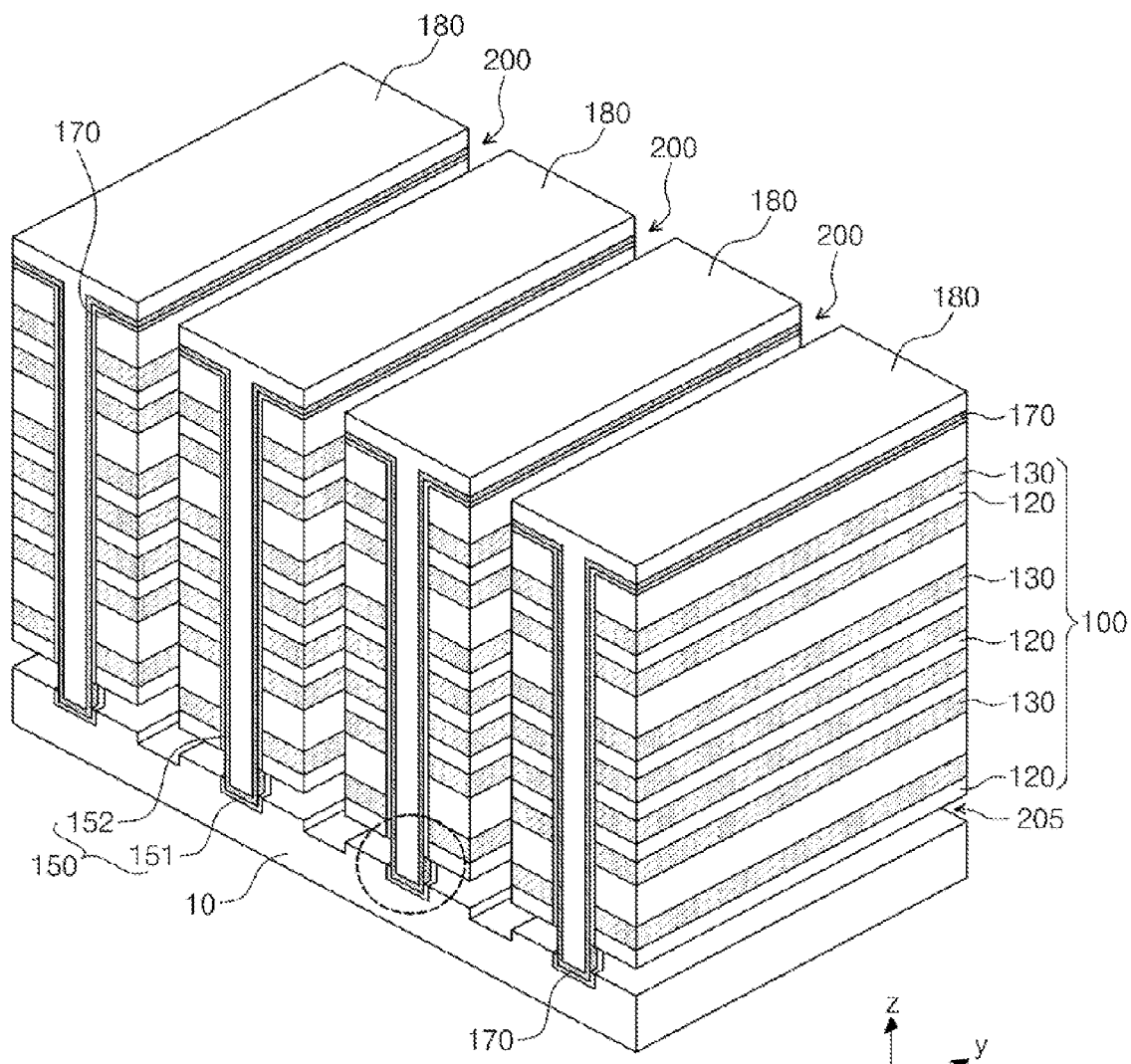
Figure 8B:
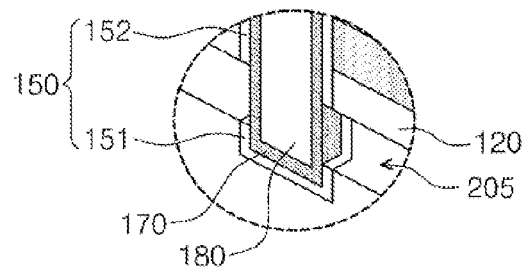

Referring to FIG. 8, a portion of the vertical layer 150 exposed by the first recess region 205 is removed to partially expose sidewalls of the first semiconductor layer 170. Due to the removal process, the vertical layer 150 is divided into a lower insulating pattern 151 disposed in the substrate 10 and a preliminary upper insulating pattern 152 spaced apart from the substrate 10. The lower insulating pattern 151 covers lower sidewalls and a bottom surface of the first semiconductor layer 170.

The separation of the vertical layer 150 is performed depending on a material of the vertical layer 150 to be described below. In the case that the vertical layer 150 includes a plurality of layers, the separation of the vertical layer 150 may include a plurality of etching steps, each of which is selected depending on materials and/or thicknesses the layers constituting the vertical layer 150. As described above, the sidewall of the first semiconductor layer 170 is partially exposed by removing the portion of the vertical layer 150. While removing the vertical layer 150, the lowermost insulating layer 121 is removed along with the vertical layer 150 to expose a top surface of the substrate 10. For instance, according to an embodiment, when both the lowermost insulating layer 121 and the vertical layer 150 are formed of the same or substantially the same material (e.g., silicon oxide), the vertical layer 150 and the lowermost insulating layer 121 may be simultaneously etched. According to an embodiment, the first semiconductor layer 170 may be partially etched during etching of the vertical layer 150. According to embodiments, the first sacrificial layer 111 and the vertical layer 150 may be sequentially etched during an etching process, or may be etched using separate etching processes as described above.

Figure 9A:
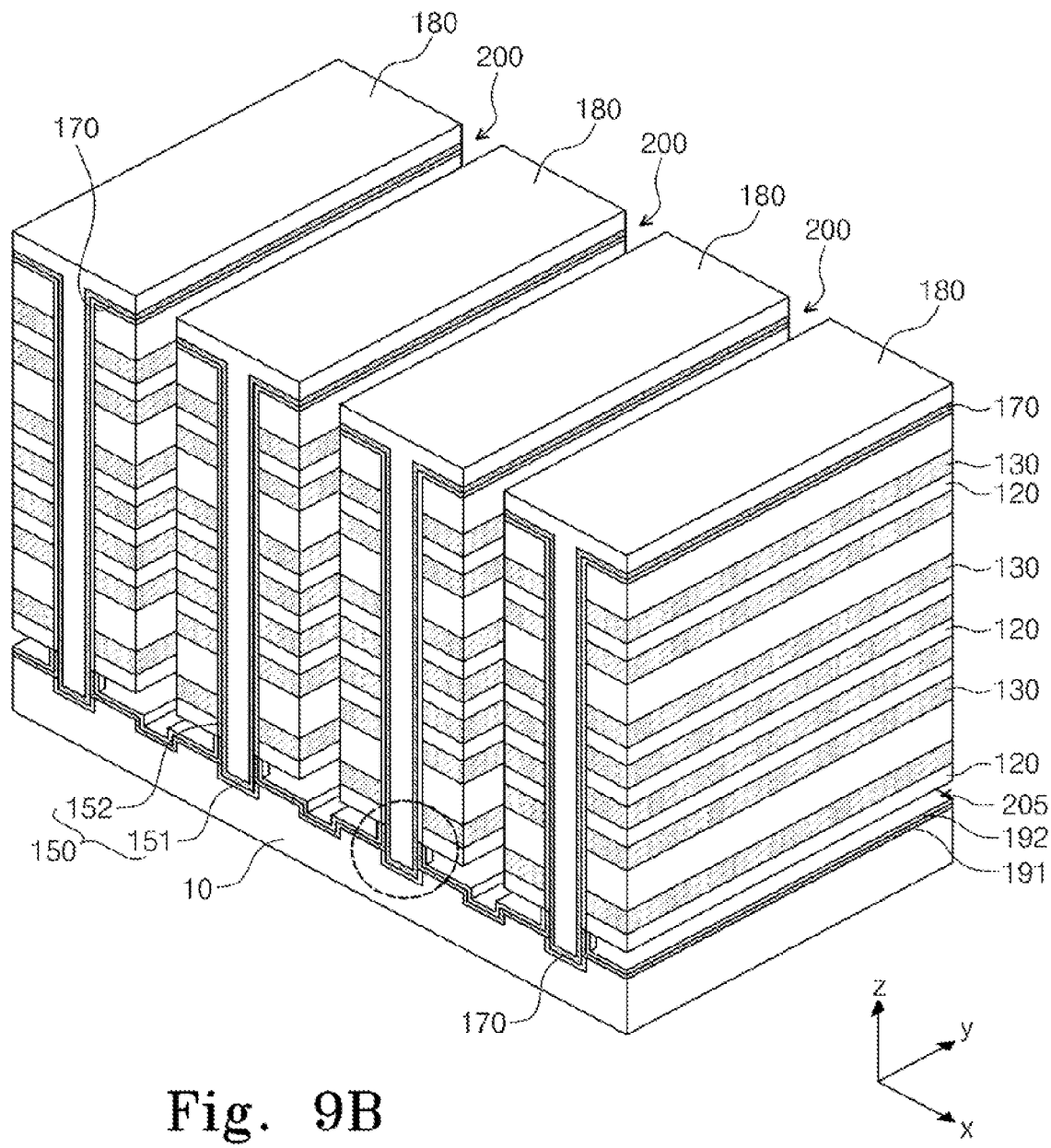
Figure 9B:
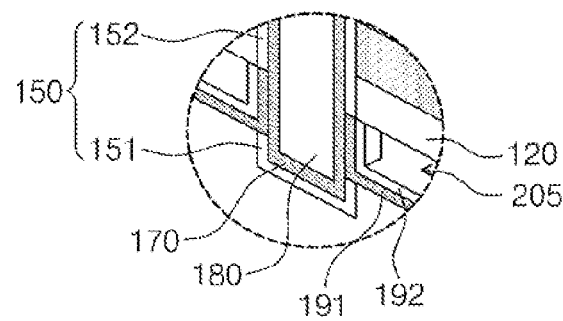

Referring to FIG. 9, a semiconductor connecting layer 191 is formed on the first semiconductor layer 170 and the substrate 10 exposed by the etching processes. The semiconductor connecting layer 191 extends from an exposed outer sidewall of the first semiconductor layer 170 to the exposed top surface of the substrate 10. Thus, the first semiconductor layer 170 is connected to the substrate 10 via the semiconductor connecting layer 191. According to an embodiment of the inventive concept, the semiconductor connecting layer 191 may penetrate the vertical layer 150 to be connected to the substrate 10. For instance, the vertical layer 150 exposes the outer sidewall of the semiconductor layer 170 by a recessed region, the semiconductor connecting layer 191 contacts the semiconductor layer 170 through the recess region.

The semiconductor connecting layer 191 is formed using an epitaxial process, in which the first semiconductor layer 170 and/or the substrate 10 are used as a seed layer. Alternatively, the semiconductor connecting layer 191 may be formed using an ALD or CVD process. According to an embodiment, the semiconductor connecting layer 191 may be formed on a bottom surface of the insulating layer 120 exposed by the first recess region 205. According to an embodiment, a thickness of the semiconductor connecting layer 191 may be greater than a thickness of the first semiconductor layer 170. According to an embodiment, the semiconductor connecting layer 191 may be formed of the same or substantially the same material as the first semiconductor layer 170.

A gate insulating layer 192 is formed on the semiconductor connecting layer 191. The gate insulating layer 192 is a thermal oxide layer formed by thermally oxidizing an exposed surface of the semiconductor connecting layer 191. Alternatively, the gate insulating layer 192 may be an insulating layer formed using an ALD or CVD process. According to an embodiment, the gate insulating layer 192 may be formed on the bottom surface of the insulating layer 120 exposed by the first recess region 205. According to an embodiment, the gate insulating layer 192 may be different in material and/or thickness from the vertical layer 150.

Figure 10:
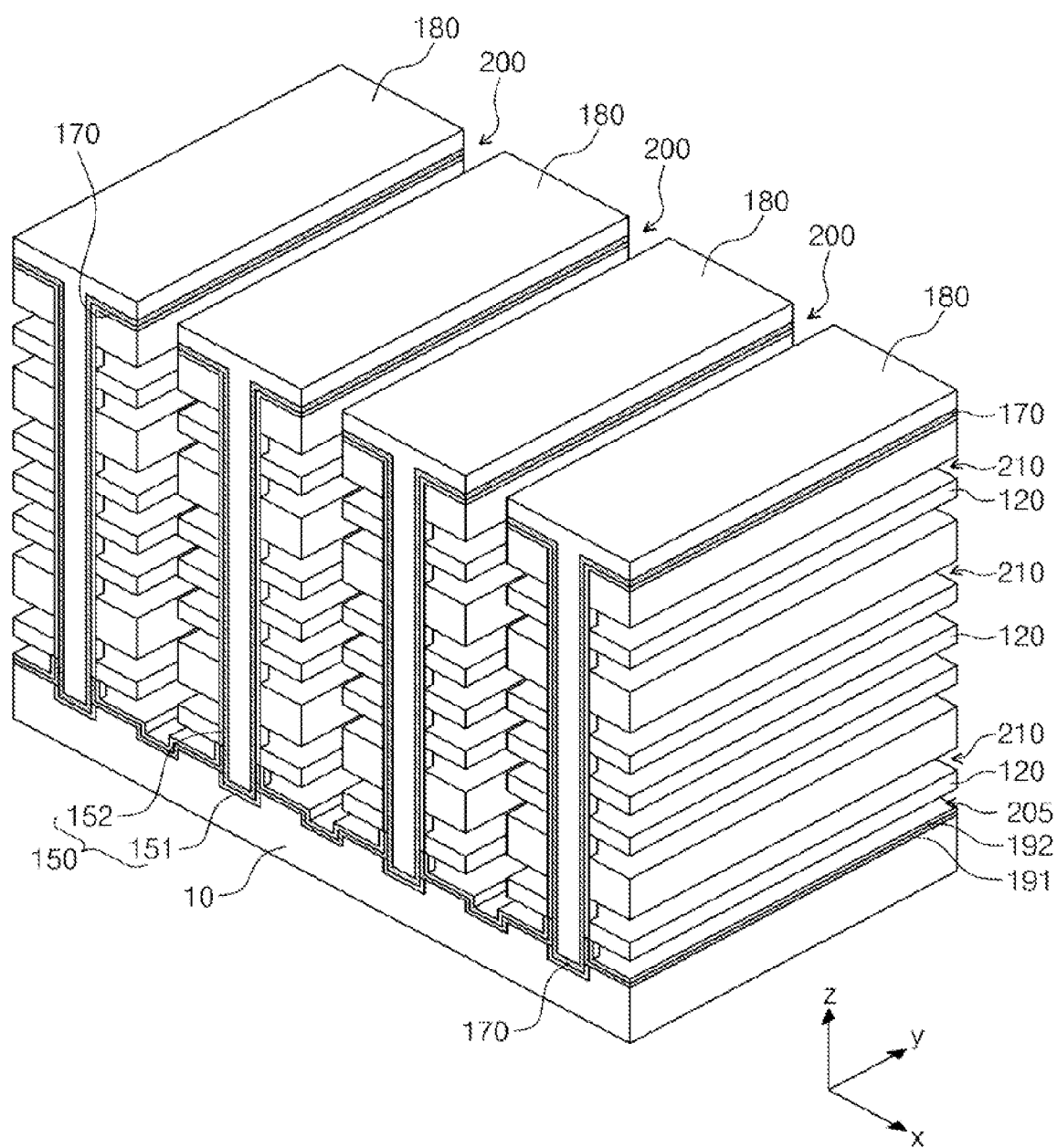

Referring to FIG. 10, second recess regions 210 are formed between the insulating layers 120 by selectively removing the exposed sacrificial layers 130. The second recess regions 210 are gap regions extending laterally from the trenches 200, and are formed to expose the sidewalls of the preliminary upper insulating patterns 152. An outer boundary of the second recess region 210 is defined by the insulating layers 120 and the trenches 200, and an internal boundary of the second recess region 210 is defined by the preliminary upper insulating pattern 152 vertically penetrating the second recess region 210.

The formation of the second recess regions 210 includes horizontally etching the second sacrificial layers 130 using, for example, an etchant and/or etch process having an etch selectivity to the insulating layers 120 and the preliminary upper insulating patterns 152. For example, in the case that the second sacrificial layers 130 are silicon nitride layers, and the insulating layers 120 are silicon oxide layers, the horizontally etching of the second sacrificial layers 130 may be performed using a wet etchant including a phosphoric acid.

Figure 11A:
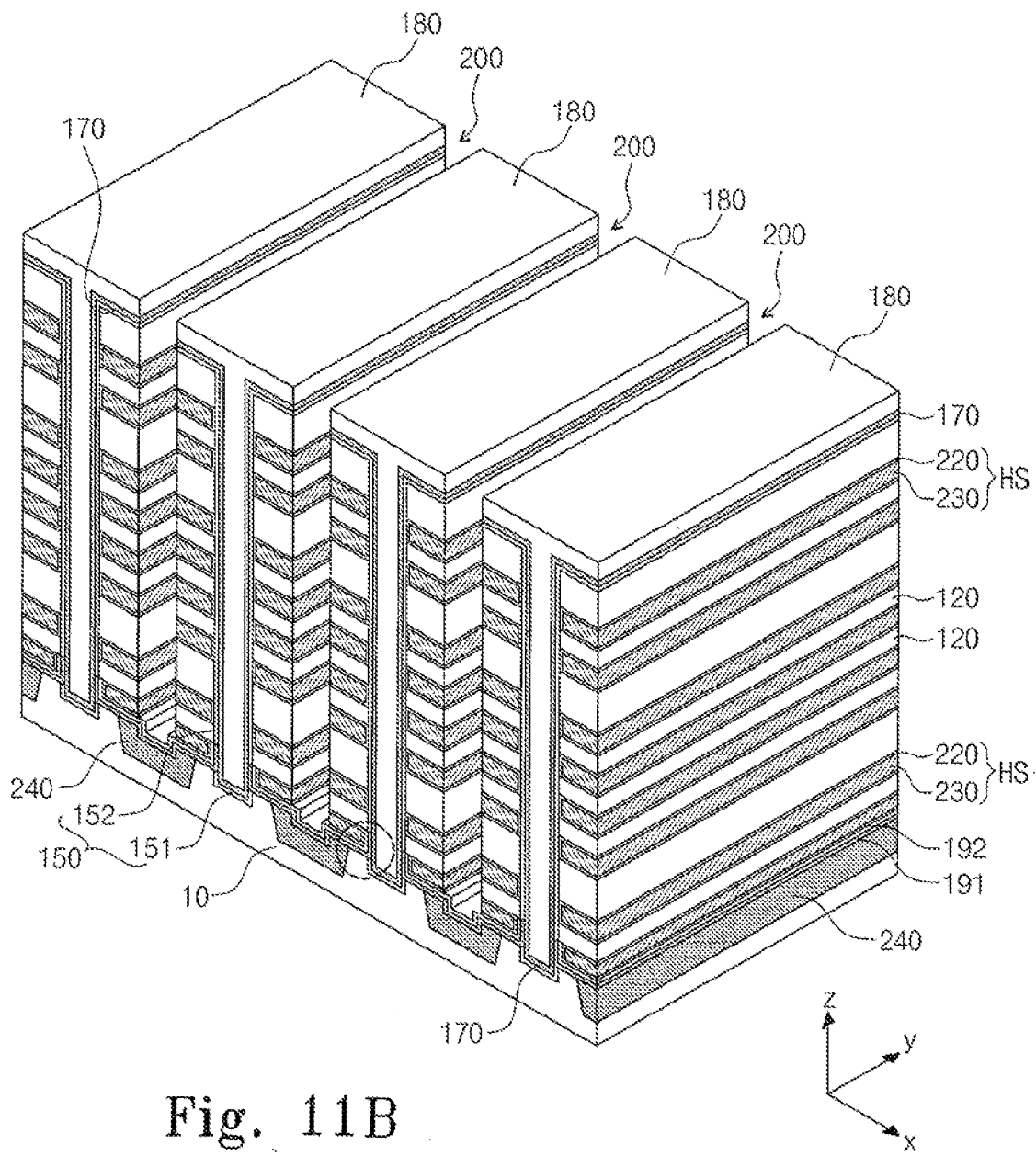
Figure 11B:
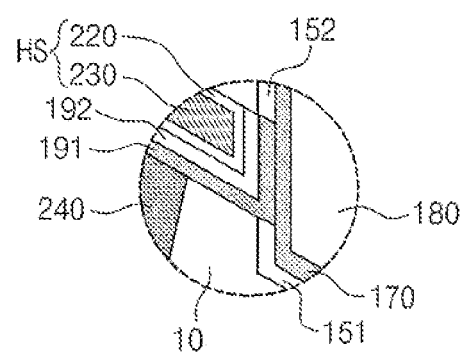

Referring to FIG. 11, horizontal structures HS are formed in the first and second recess regions 205 and 210. Each of the horizontal structures HS includes a horizontal pattern 220 covering the inner wall of the first or second recess regions 205 or 210 and a conductive pattern 230 filling the remaining space of the first or second recess regions 205 or 210.

The formation of the horizontal structures HS includes sequentially forming a horizontal layer and a conductive layer to fill the first and second recess regions 205 and 210, and removing the conductive layer from the trenches 200 so that the conductive patterns 230 remain in the first and second recess regions 205 and 210.

According to an embodiment, the horizontal layer or the horizontal pattern 220 may be one layer and/or a plurality of layers (e.g., similarly to the vertical layer 150). According to an embodiment, the horizontal pattern 220 may include a blocking dielectric layer of a charge trap type nonvolatile memory transistor. As will be described again in detail with reference to FIGS. 41 through 56 later, exemplary embodiments of the inventive concept may be diversely classified according to the layers used as the vertical layer 150 and the horizontal patterns 220.

The conductive layer is formed to fill the first and second recess regions 205 and 210 covered by the horizontal layer. According to an embodiment, the trenches 200 may be fully and/or partially filled by the conductive layer. According to an embodiment, the conductive layer may include at least a layer formed of doped silicon, metallic materials, metal nitride layers, and/or metal silicides. For example, according to an embodiment, the conductive layer may include a tantalum nitride layer and/or a tungsten layer. According to an embodiment, the conductive layer may be formed to conformally cover the inner walls of the trenches 200 but not to fully fill the trenches 200. According to an embodiment, the formation of the conductive pattern 230 may include removing the conductive layer from the trench 200 using, for example, an isotropic etching method. According to an embodiment, the conductive layer may be formed to fill the trenches 200. According to an embodiment, the formation of the conductive pattern 230 may include removing the conductive layer from the trench 200 using, for example, an anisotropic etching method. According to an embodiment, the semiconductor connecting layer 191 and the gate insulating layer 192 may be partially removed during the formation of the horizontal structures HS. According to an exemplary embodiment of the inventive concept with respect to a flash memory, the conductive patterns 230 may be classified into some groups according to their function. For instance, according to an embodiment, the lowermost two layers of the conductive patterns 230 may serve as gate electrodes of lower selection transistors, the uppermost two layers of the conductive patterns 230 may serve as gate electrodes of upper selection transistors, and the remaining layers of the conductive patterns 230 may serve as gate electrodes of memory cell transistors.

The semiconductor connecting layer 191 is formed to cover a sidewall and a bottom surface of the lowermost conductive pattern 230 of the conductive patterns 230. The gate insulating layer 192 is formed between the lowermost conductive pattern and the semiconductor connecting layer 191. A distance between the bottom surface of the lowermost conductive pattern and the semiconductor connecting layer 191 is greater than a distance between a top surface of the lowermost conductive pattern and the insulating layer 120.

According to an exemplary embodiment of the inventive concept with respect to a flash memory, impurity regions 240 may be formed in the substrate 10. According to an embodiment, the impurity regions 240 may be formed in the substrate 10 exposed by the trenches 200 by an ion implantation process. According to an embodiment, the impurity regions 240 may be of a different conductive type than the substrate 10.

According to an embodiment, the impurity regions 240 may be connected to each other to be in an equipotential state. According to an embodiment, the impurity regions 240 may be electrically separated from each other to have different electric potentials. According to an embodiment, the impurity regions 240 may form a plurality of source groups, each of which includes a plurality of spatially separated impurity regions, and the source groups may be electrically separated from each other to have different electric potentials.

Figure 12:
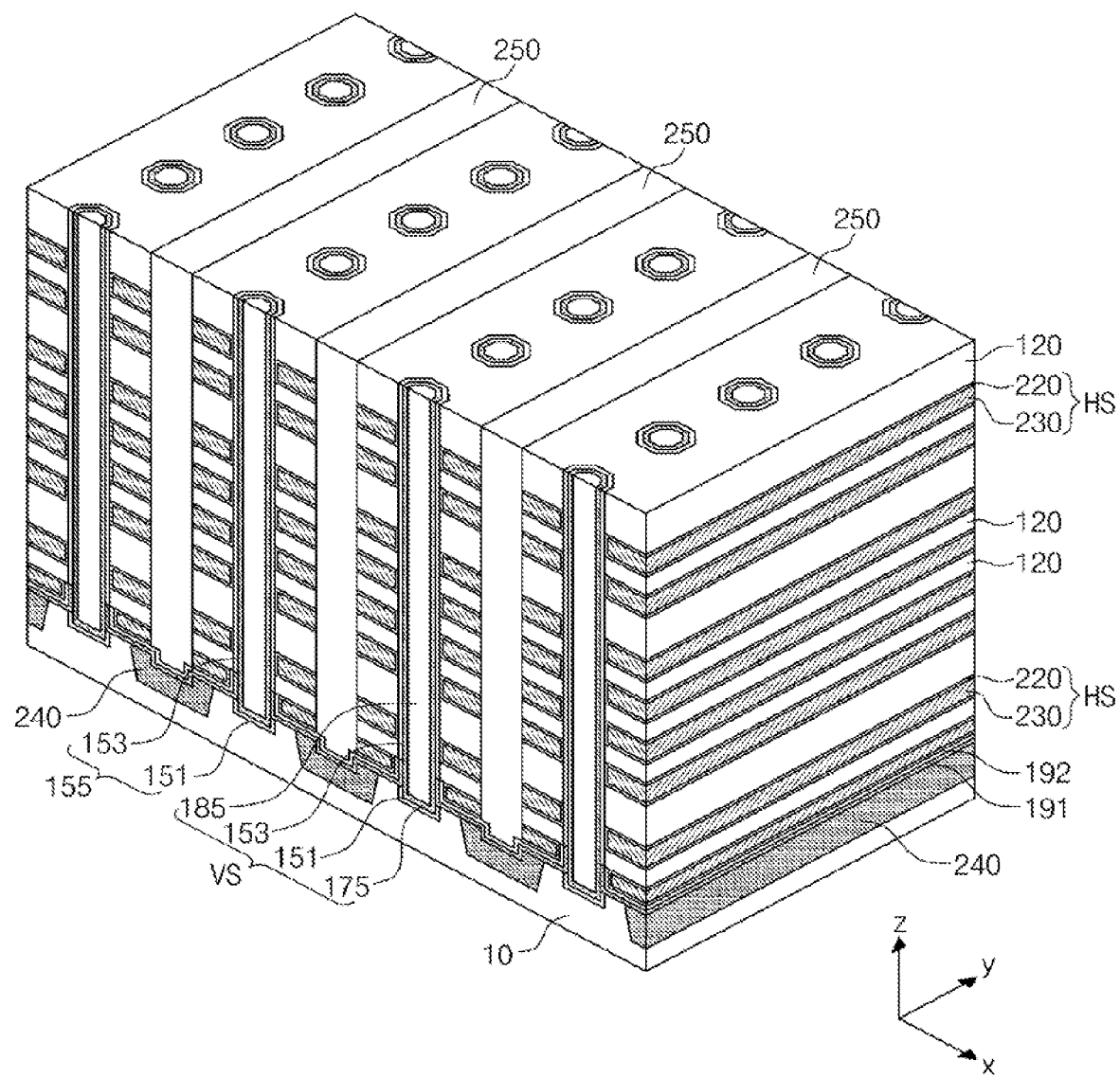

Referring to FIG. 12, electrode separation patterns 250 are formed in the trenches 200. The formation of the electrode separation patterns 250 includes forming an electrode separation layer (not shown) on the resultant structure provided with the impurity regions 240 and etching the electrode separation layer to expose the top surface of the insulating layer 120. The electrode separation layer is formed of, for example, at least one of a silicon oxide layer, a silicon nitride layer, and a silicon oxynitride layer. According to an embodiment, the etching of the electrode separation layer may be performed using a planarization technique, for example, a chemical-mechanical polishing technique and/or an etch-back technique. As a result of the etching of the electrode separation layer, as shown in FIG. 12, the insulative filling layer 180, the preliminary upper insulating patterns 152, and the first semiconductor layer 170 form filling patterns 185, upper insulating patterns 153, and semiconductor patterns 175 in the openings 105. According to an embodiment, the upper insulating pattern 153 and the lower insulating pattern 151 may form a vertical pattern 155.

According to an exemplary embodiment of the inventive concept, a plurality of vertical structures VS penetrating the mold structure 100 may be two-dimensionally formed on the substrate 10. Each of the vertical structures VS includes the vertical pattern 155 and the semiconductor pattern 175.

According to an embodiment, each of the vertical structure VS may further include the filling pattern 185. According to an exemplary embodiment of the inventive concept, positions of the vertical structures VS may be defined by the openings 105.

Figure 13A:
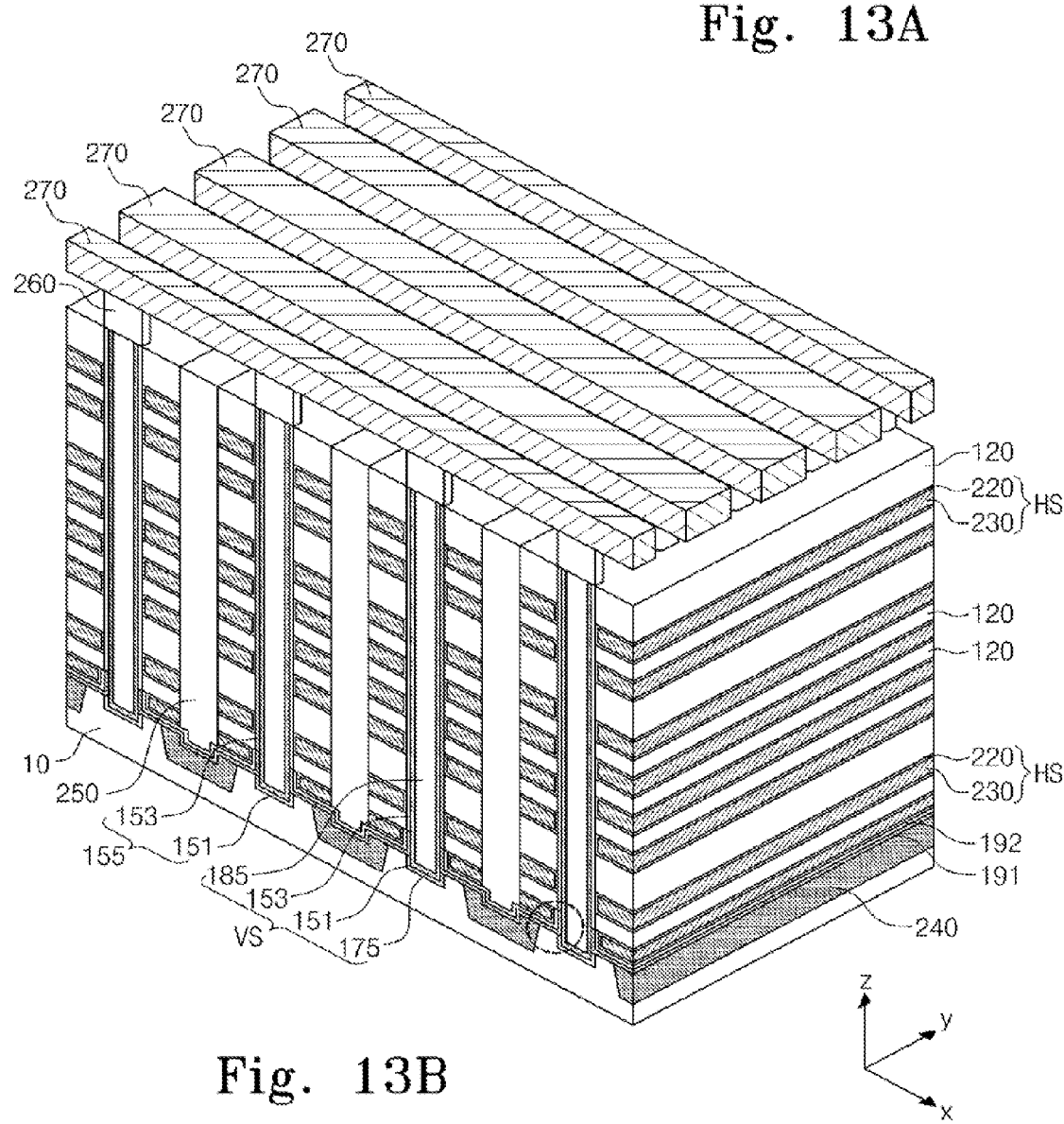
Figure 13B:
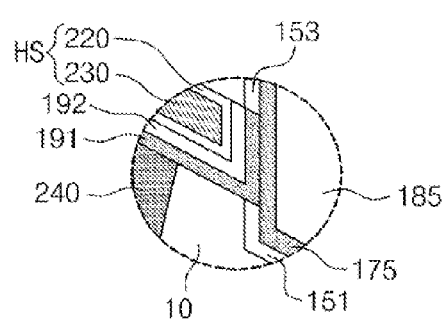

Referring to FIG. 13, upper plugs 260 are formed on the vertical structures VS, respectively, and upper lines 270 are formed on the upper plugs 260 to connect the upper plugs 260 with each other.

According to an embodiment, a top portion of the semiconductor pattern 175 may include an upper impurity region (not shown). A bottom surface of the upper impurity region is positioned at a higher level than a top surface of the uppermost layer in the horizontal structures HS. The upper impurity region is doped with a different conductive type from a conductive type of a main portion of the semiconductor pattern 175 disposed below the upper impurity region. As a result, the upper impurity region and the main portion of the semiconductor pattern 175 may form a diode. According to an embodiment, the upper plugs 260 may be formed of, for example, doped silicon and/or metallic materials.

According to an embodiment, the upper plugs 260 may be formed of, for example, a silicon layer of a different conductive type from a conductive type of the semiconductor pattern 175. According to an embodiment, each upper plug 260 and its corresponding semiconductor pattern 175 may form a PN junction.

Each of the upper lines 270 is electrically connected to the semiconductor pattern 175 via the upper plug 260, and is formed to cross the horizontal structures HS. According to an exemplary embodiment of a NAND flash memory, the upper lines 270 may be electrically coupled to a plurality of cell strings, thereby serving as bit lines.

According to an exemplary embodiment of the inventive concept, a memory element including the horizontal pattern 220 and the vertical pattern 155 may be disposed between the semiconductor pattern 175 and the conductive pattern 230. The horizontal pattern 220 laterally extends to cover top and bottom surfaces of the conductive pattern 230, and the vertical pattern 155 vertically extends to cover at least a portion of the semiconductor pattern 175. The semiconductor connecting layer 191 extends from an outer sidewall of the semiconductor pattern 175 to the substrate 10, such that the first semiconductor layer 170 is connected to the substrate 10 via the semiconductor connecting layer 191. The lower insulating pattern 151 is spatially separated from the upper insulating pattern 153 by the semiconductor connecting layer 191 and the semiconductor pattern 175. The semiconductor pattern 175 is spatially separated from the substrate 10 by the lower insulating pattern 151.

In 3D semiconductor devices produced based on a punch-and-plug scheme, a semiconductor pattern is used as an active pattern connected to a semiconductor substrate. For an electric connection between the semiconductor pattern and the semiconductor substrate, an insulating layer which is interposed between the semiconductor pattern and the semiconductor substrate needs to be etched out. For instance, according to an embodiment, such electric connection may be achieved by forming a spacer on an inner wall of the semiconductor pattern, removing a portion of the insulating layer under the semiconductor pattern using the spacer as an etch mask, and forming an additional semiconductor layer that connects the semiconductor pattern with the semiconductor substrate. According to an exemplary embodiment of the inventive concept, the semiconductor connecting layer 191 may form an electric connection between the semiconductor pattern and the semiconductor substrate without the step of forming the spacer. Accordingly, it is possible to simply fabricate a 3D NAND FLASH memory device capable of erasing memory cells in the memory device based on the body or bulk erase scheme.

Hereinafter, modifications to the embodiments described with reference to FIGS. 1 through 13 will be described with reference to FIGS. 14 through 22.

Figure 14:
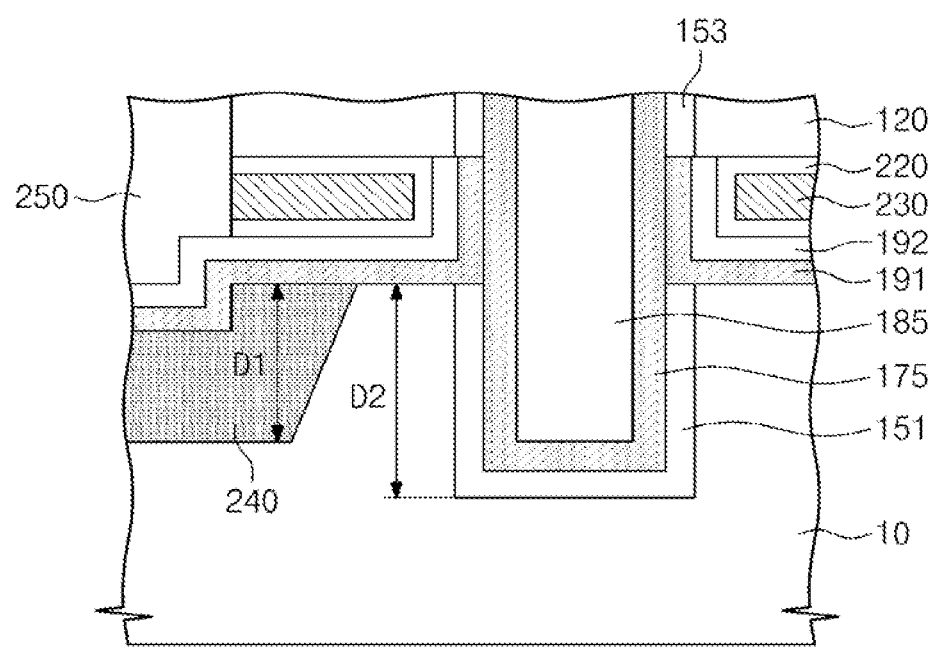
FIGS. 14 through 16, 17A, 17B, 18 through 21, 22A, and 22B are a sectional view and perspective views illustrating three-dimensional semiconductor devices and methods of fabricating the three-dimensional semiconductor devices according to embodiments of the inventive concept.

FIG. 14 illustrates a modification to the embodiment described with reference to FIGS. 1 through 13. Referring to FIG. 14, the lower insulating pattern 151 has a bottom surface positioned at a lower level than a bottom surface of the impurity regions 240. For instance, according to an embodiment, a distance D2 from a top surface of the substrate 10 to a bottom surface of the lower insulating pattern 151 may be greater than a distance D1 from a top surface of the substrate 10 to a bottom surface of the impurity region 240. In the case that the lower insulating pattern 151 is positioned deep into the substrate 10, the mold structure 100 may be firmly supported by the vertical structure VS while fabricating the semiconductor device.

Figure 15:
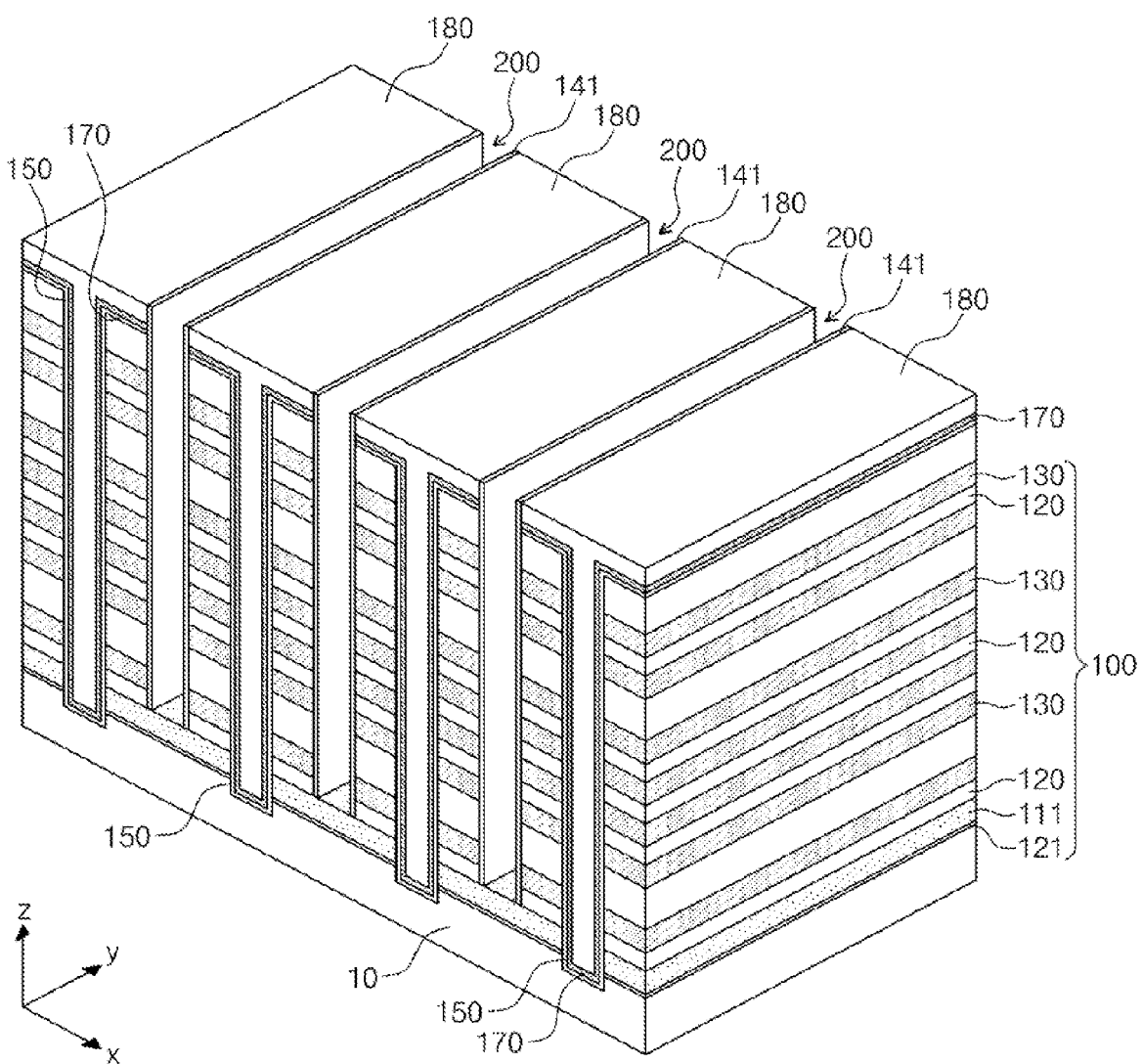
Figure 16:
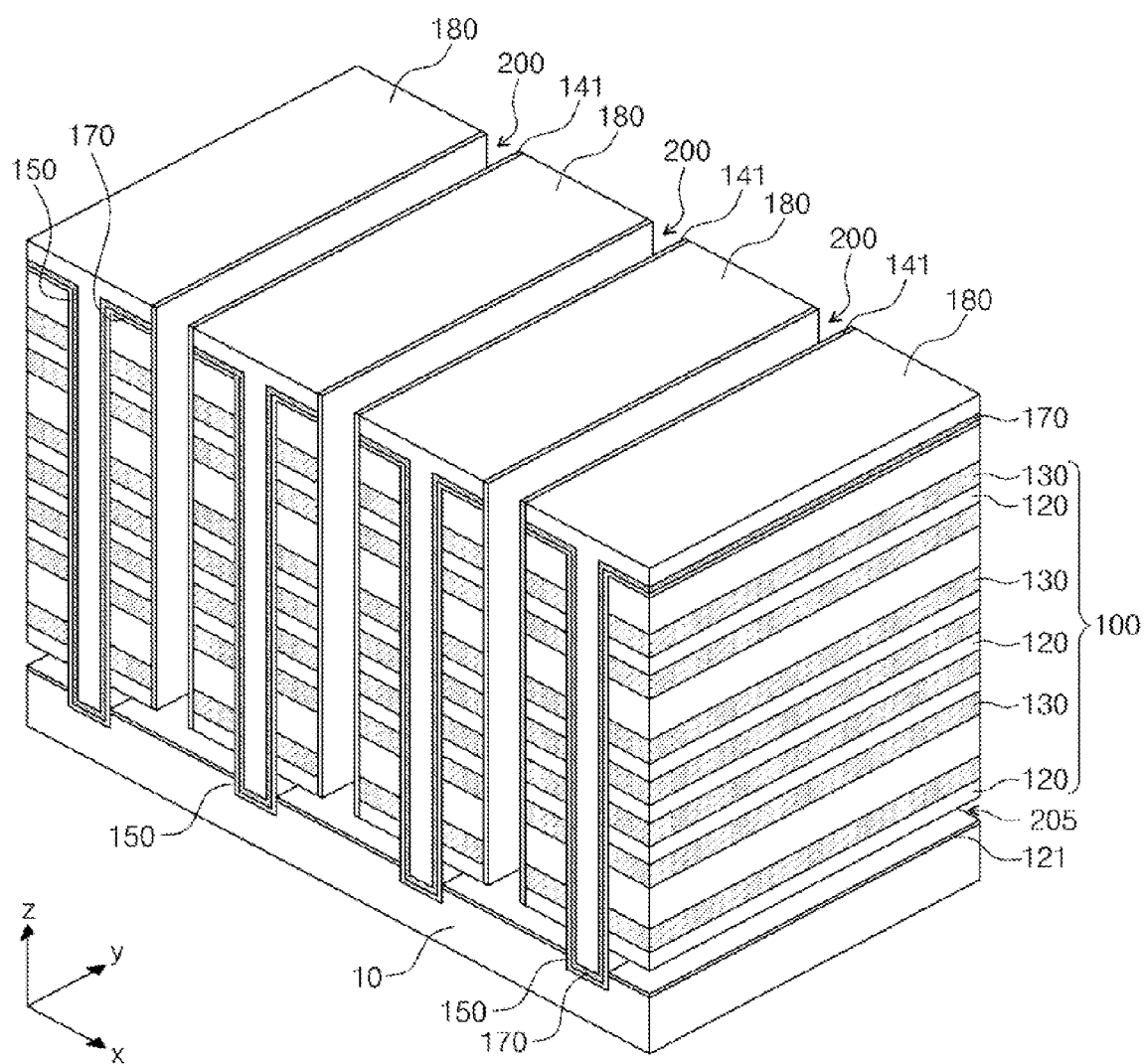
Figure 17A:
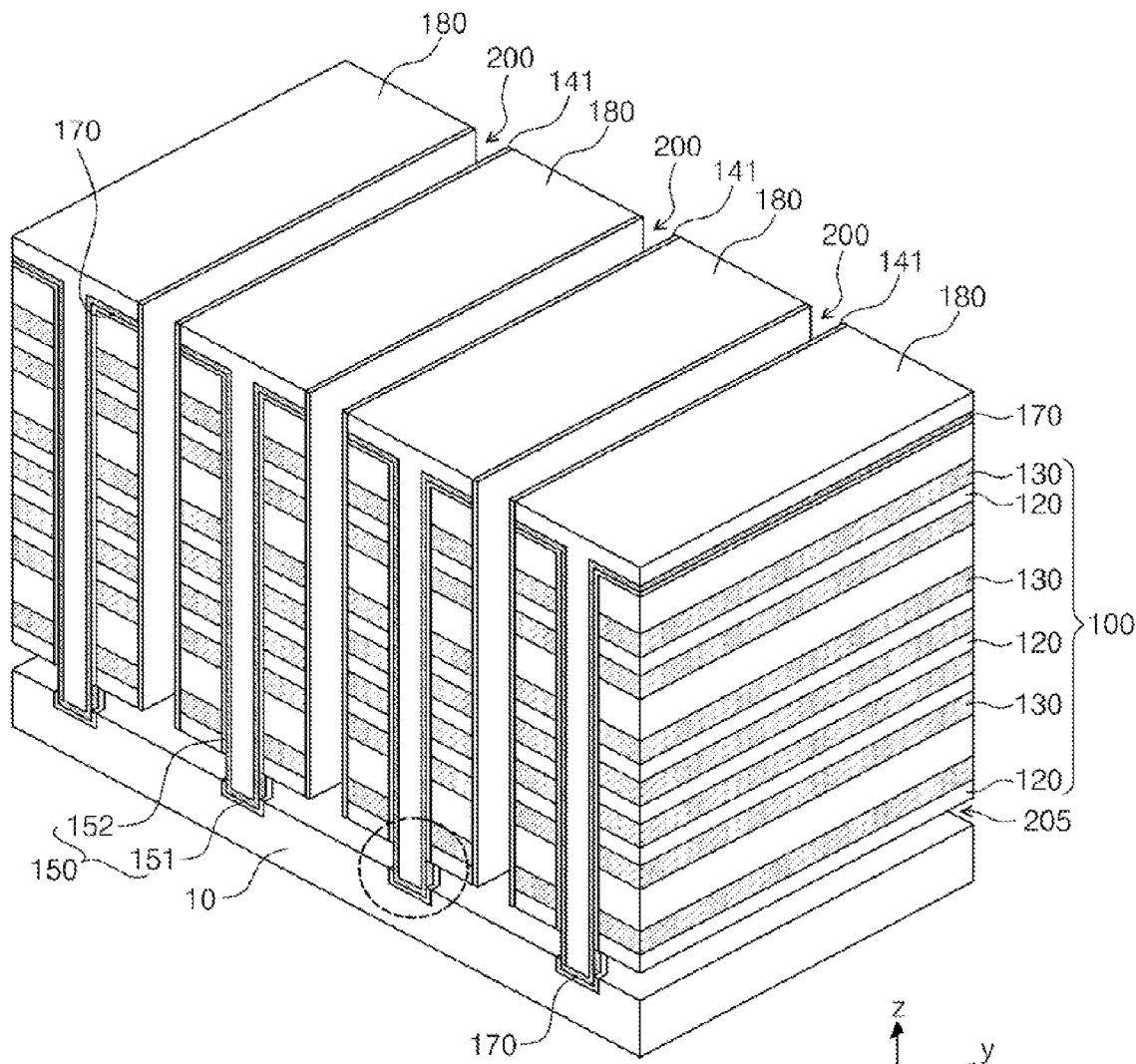
Figure 17B:
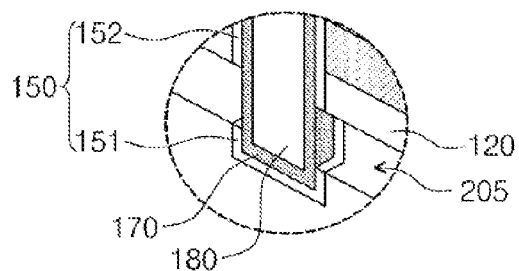

FIGS. 15 through 17 illustrate some modifications to the embodiments described with reference to FIGS. 1 through 13. Referring to FIG. 15, the mold structure 100 is patterned to form trenches 200 spaced apart from the openings 105 and exposing the first sacrificial layer 111. According to an embodiment, the trenches 200 may be formed to expose a top surface of the first sacrificial layer 111. For instance, at least a portion of the first sacrificial layer 111 may remain under the trenches 200. Due to the remaining portion of the first sacrificial layer 111, the substrate 10 is not exposed by the trenches 200.

First protection layers 141 are formed on inner walls of the trenches 200. According to an embodiment, the first protection layers 141 may be formed using a spacer forming process. For instance, according to an embodiment, the formation of the first protection layers 141 may include forming insulating layers in the trenches 200 and removing bottom surfaces of the insulating layers by an anisotropic plasma etching. During the formation of the first protection layers 141, portions of the first sacrificial layer 111 and the first protection layers 141 may be etched out.

Referring to FIG. 16, a first recess region 205 is formed by selectively removing the first sacrificial layer 111 exposed by the trenches 200. The first recess region 205 is a gap region horizontally extending from the trenches 200. The first recess region 205 is formed to expose lower sidewalls of the vertical layer 170. The exposed sidewalls of the mold structure 100 are protected by the first protection layer 141 during the removal of the first sacrificial layer 111. The first protection layer 141 includes a material having an etch selectivity to the first sacrificial layer 111 and the vertical layer 150. For instance, according to an embodiment, the first protection layer 141 may be formed of the same or substantially the same material as the second sacrificial layers 130.

Referring to FIG. 17, sidewalls of the vertical layers 150 exposed by the first recess region 205 are removed. As a consequence, the vertical layer 150 is separated into a lower insulating pattern 151 in the substrate 10 and a preliminary upper insulating pattern 152 spaced apart from the substrate 10. The lower insulating pattern 151 is formed to cover lower sidewalls and a bottom surface of the first semiconductor layer 170. The first protection layer 141 protects the sidewall of the mold structure 100 during the removal of the portion of the vertical layer 150.

The subsequent processes are performed in the same or substantially the same manner as described with reference to FIGS. 9 through 13. The first protection layers 141 are removed during the removal of the second sacrificial layers 130 as described with reference to FIG. 10.

Figure 18:
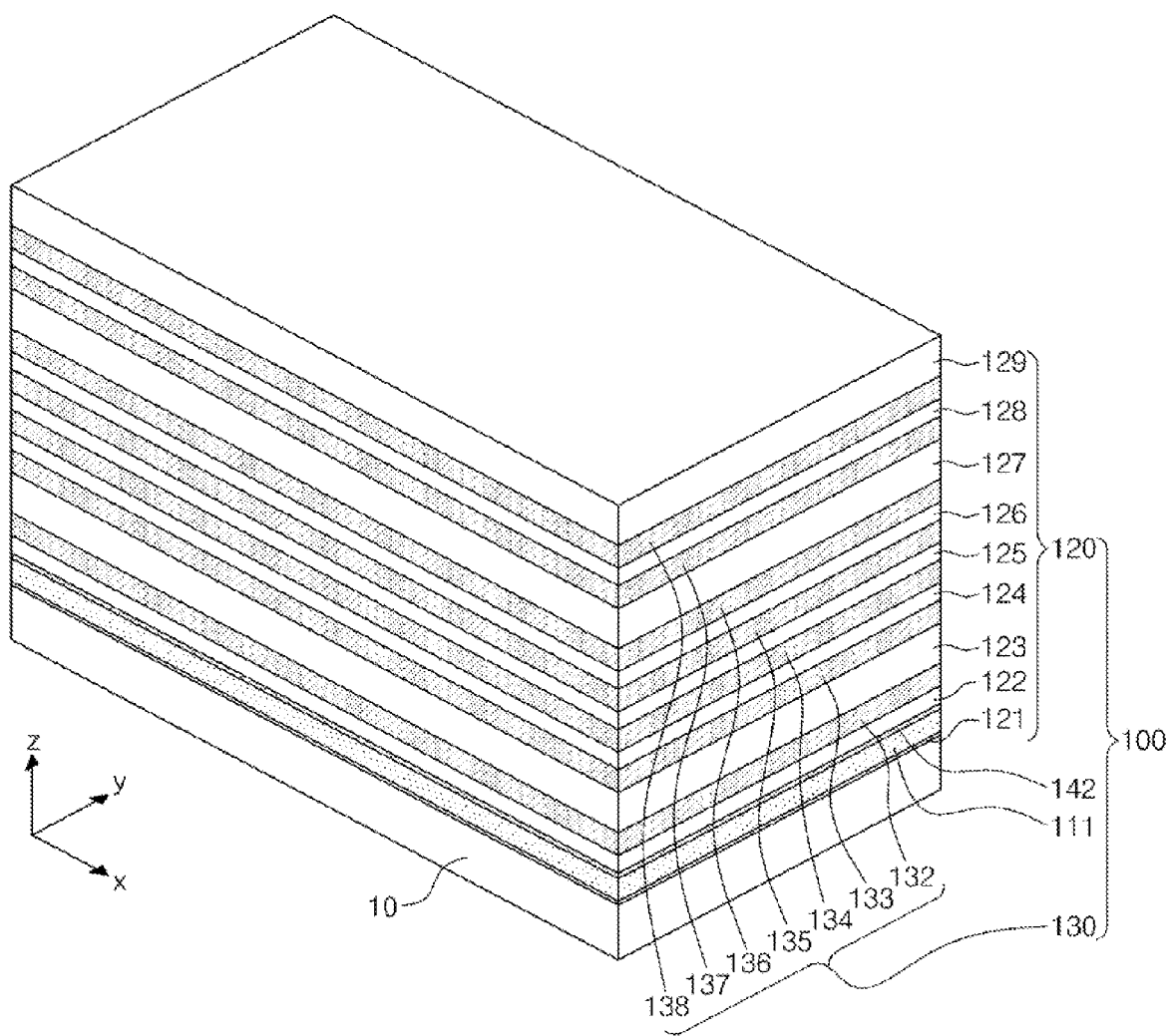
Figure 19:
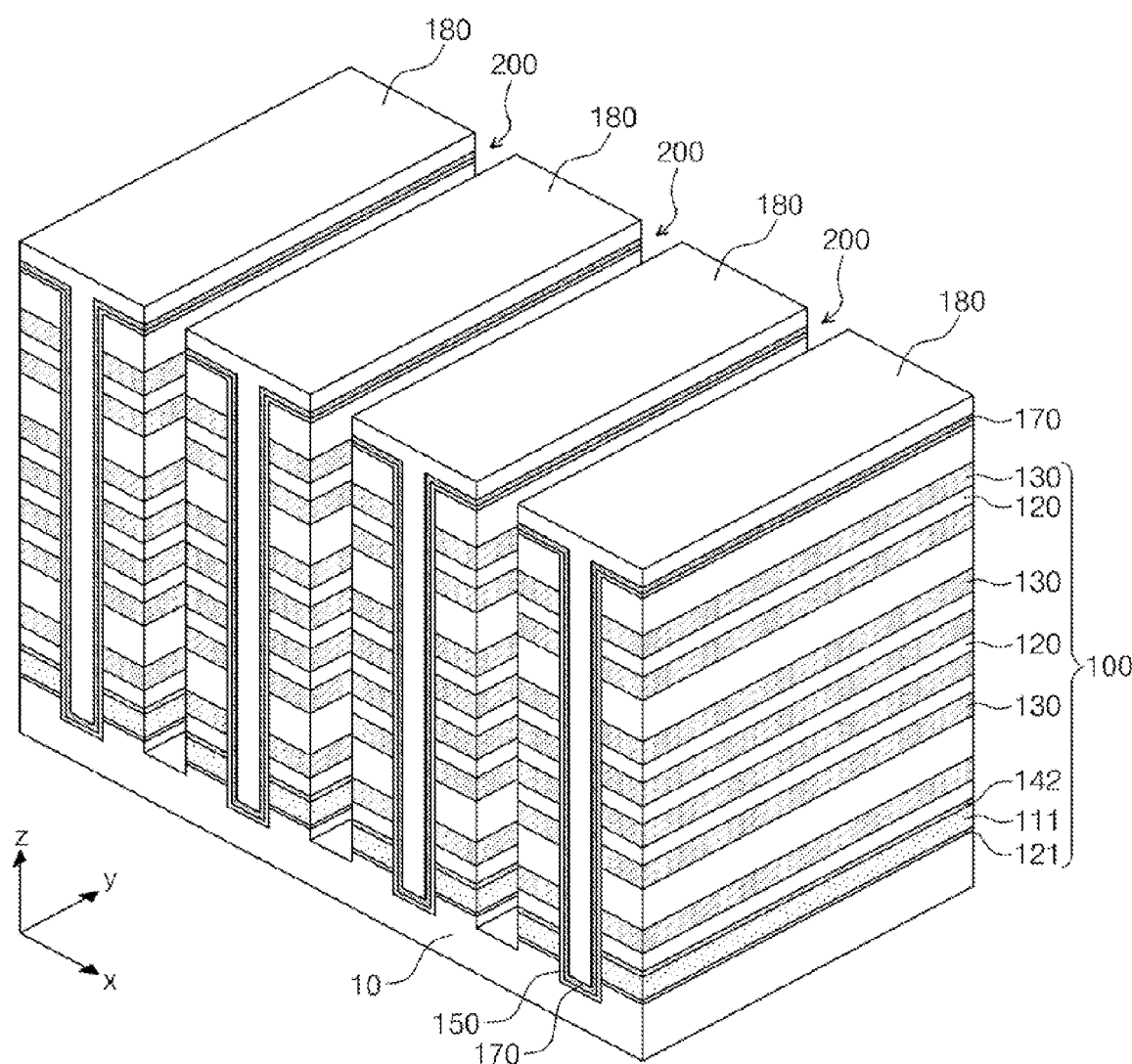
Figure 20:
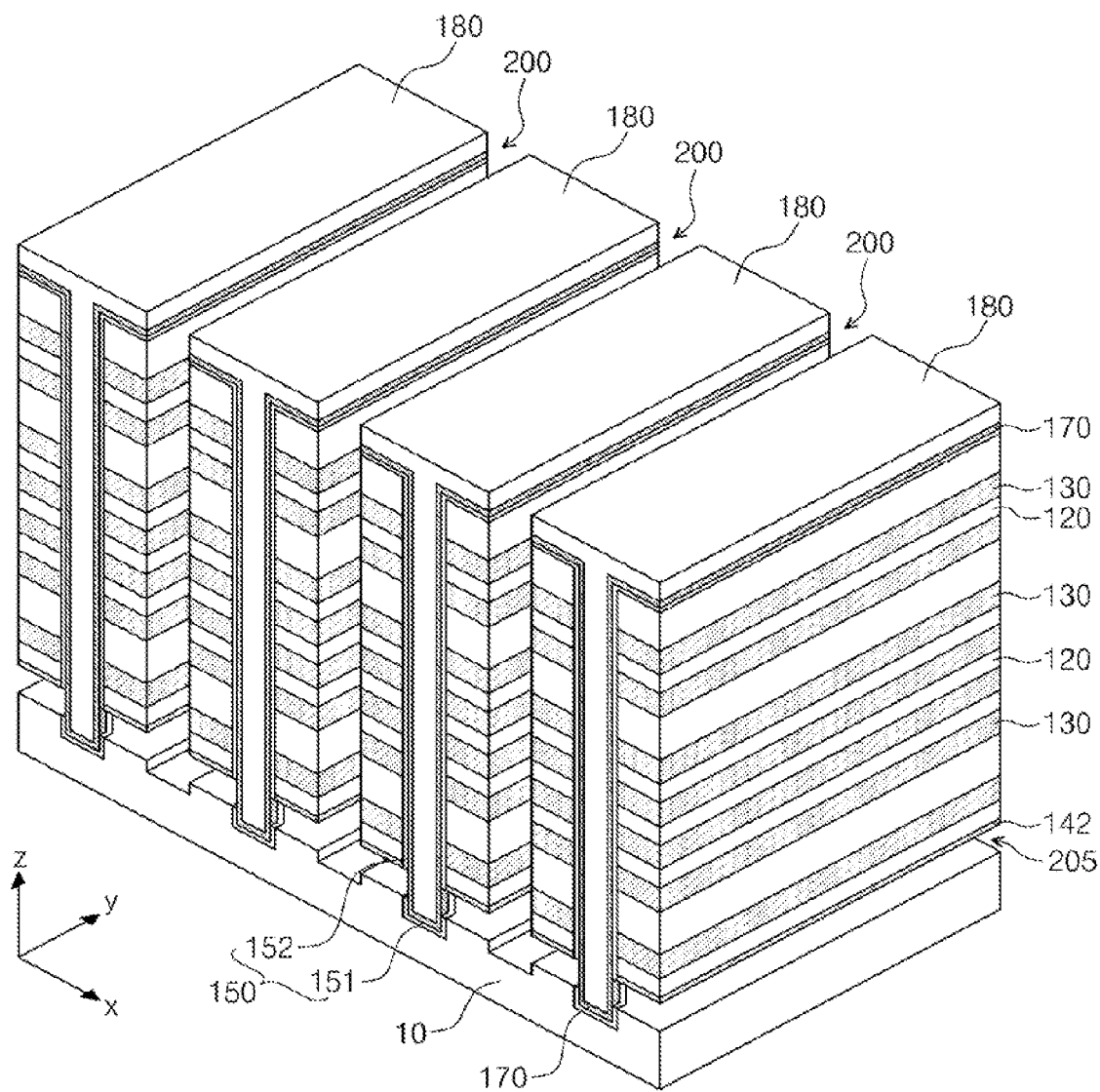

FIGS. 18 through 20 illustrate some modifications to the embodiments described with reference to FIGS. 1 through 13. Referring to FIG. 18, a mold structure 100 is formed on the substrate 10. The mold structure 100 includes a first sacrificial layer 111, a second sacrificial group 130 including second sacrificial layers 132 to 138, and an insulating group 120 including insulating layers 121 to 129. According to an embodiment, the mold structure 100 may include a second protection layer 142 between the first sacrificial layer 111 and the insulating layer 122. The second protection layer 142 is formed of a material having an etch selectivity to the first sacrificial layer 111 and the vertical layer 150. For instance, according to an embodiment, the second protection layer 142 may be formed of the same or substantially the same material as the second sacrificial layers 130.

FIG. 19 illustrates a structure obtained by applying the process steps described with reference to FIGS. 2 through 6 to the mold structure 100 of FIG. 18. Inner walls of the mold structure 100 are exposed by the trenches 200. The trenches 200 expose sidewalls of the second protection layer 142.

Referring to FIG. 20, a first recess region 205 is formed by etching the first sacrificial layer 111 and the vertical layer 150. During the etching of the vertical layer 150, the lowermost insulating layer 121 and portions of the vertical layer 150 are removed to expose a top surface of the substrate 10. During the removal of the first sacrificial layer 111, the second protection layer 142 protects a bottom surface of the insulating layer 120 exposed by the first recess region 205. The second protection layer 142 also protects a bottom surface of the insulating layer 120 exposed by the first recess region 205 during the removal of the vertical layer 150.

The subsequent processes are performed in the same or substantially the same manner as described with reference to FIGS. 9 through 13. The second protection layer 142 is removed during the removal of the second sacrificial layers 130 described with reference to FIG. 10.

Figure 21:
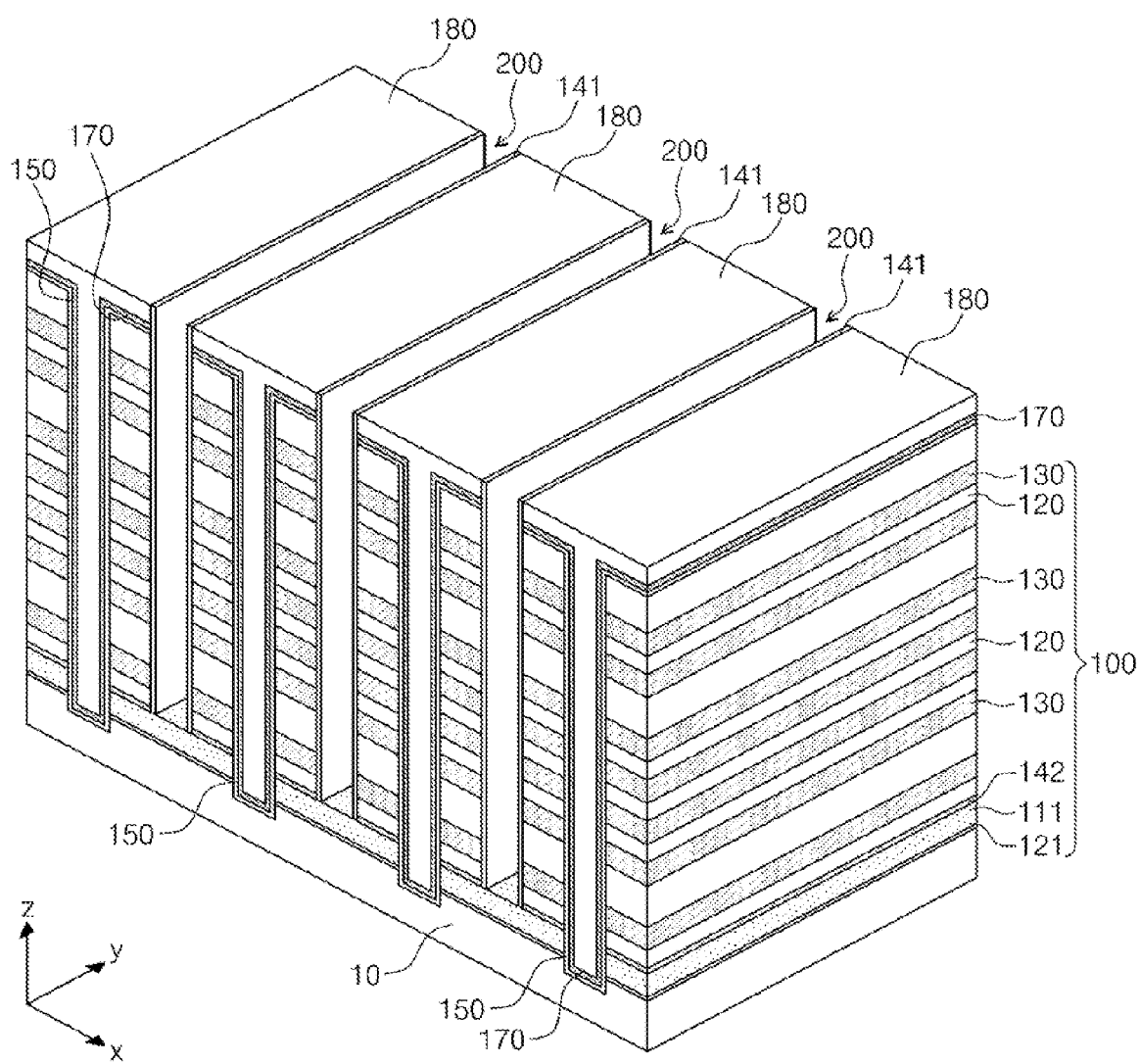

FIG. 21 illustrates a modification to the embodiment described with reference to FIGS. 1 through 13. Referring to FIG. 21, both the first and second protection layers 141 and 142 are provided on the substrate 10. The first and second protection layers 141 and 142 prevent the insulating layers 120 and the second sacrificial layers 130 from being damaged while etching the first sacrificial layer 111 and the vertical pattern 140.

Figure 22A:
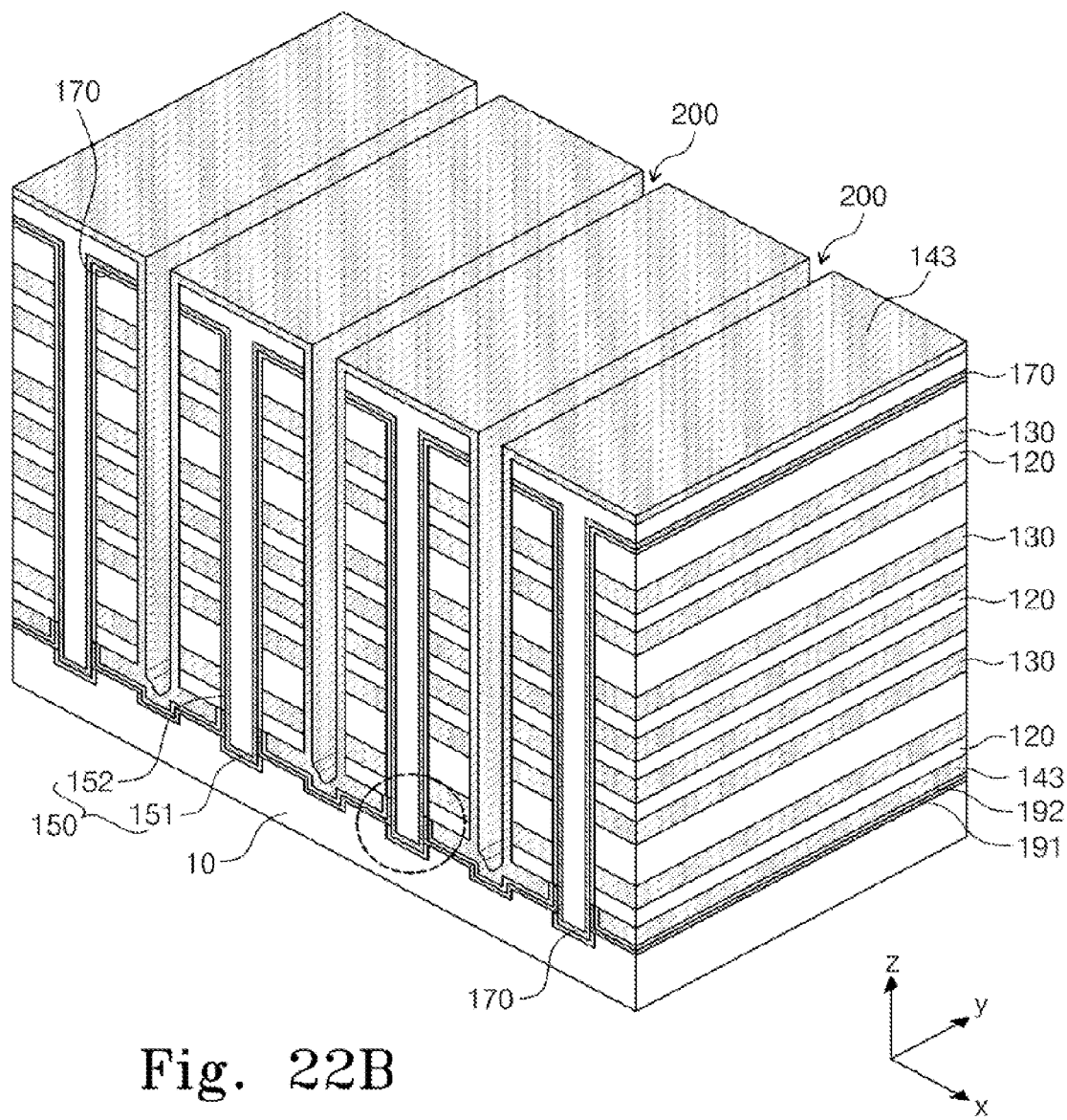
Figure 22B:
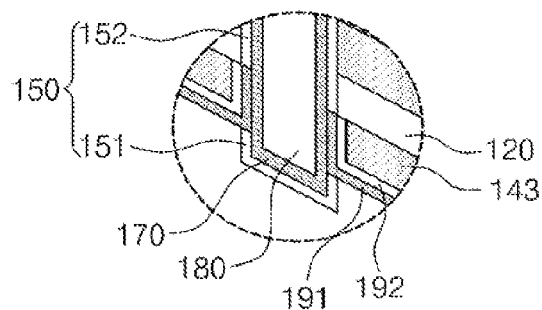

FIG. 22 illustrates a modification to the embodiment described with reference to FIGS. 1 through 13. Referring to FIG. 22, a third protection layer 143 is formed after forming the structure described with reference to FIG. 9. The third protection layer 143 is formed along sidewalls of the trenches 200. According to an embodiment, the third protection layer 143 may be formed to fill the first recess region 205 illustrated in FIG. 9. The third protection layer 143 prevents the semiconductor connection layer 191 and the gate insulating layer 192 from being damaged during the removal of the second sacrificial layers 130 described with reference to FIG. 10. The third protection layer 143 is formed of a material having an etch selectivity to the insulating layer 120. The subsequent processes are performed in the same or substantially the same manner as described with reference to FIGS. 10 through 13. The third protection layer 143 is removed during the removal of the second sacrificial layers 130 described with reference to FIG. 10.

Hereinafter, a three-dimensional semiconductor device and a method of fabricating the three-dimensional semiconductor device according to an exemplary embodiment of the inventive concept will be described with reference to FIGS. 23 through 27.

Figure 23:
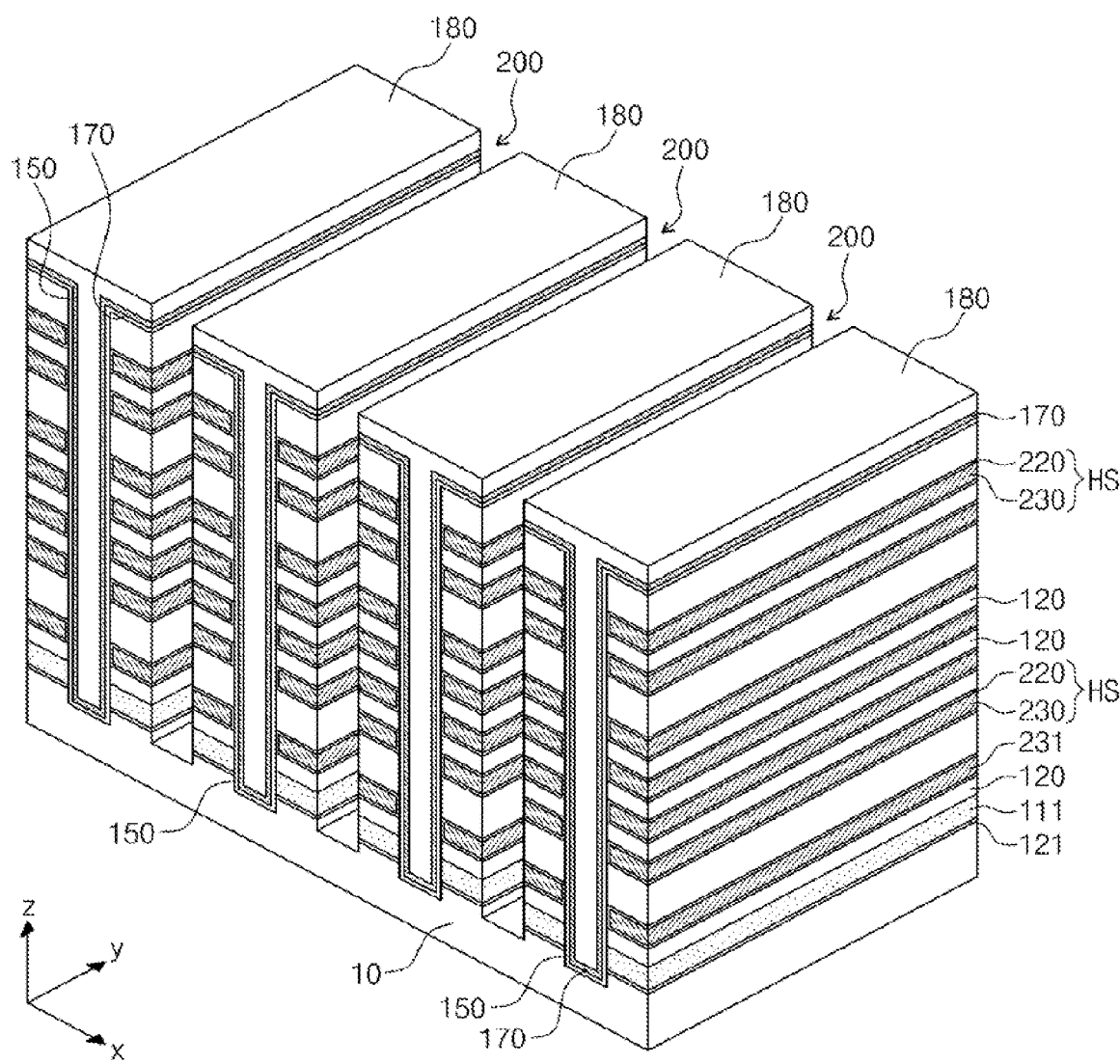
FIGS. 23, 24, 25A, 25B, 26A, 26B, 27A, and 27B are perspective views illustrating a three-dimensional semiconductor device and a method of fabricating the three-dimensional semiconductor device according to an exemplary embodiment of the inventive concept.

Referring to FIG. 23, horizontal structures HS are fabricated from the structure described with reference to FIG. 6. For instance, according to an embodiment, second recess regions (not shown) may be formed by selectively removing the second sacrificial layers 130 exposed by the trenches 200, and the horizontal structures HS may be formed to fill the second recess regions. The formation of the horizontal structure HS includes forming a horizontal pattern 220 to cover an inner wall of the second recess region and forming a first conductive pattern 230 to fill the remaining space of the second recess region. The first sacrificial layer 111 remains unetched during the formation of the horizontal structures HS.

Figure 24:
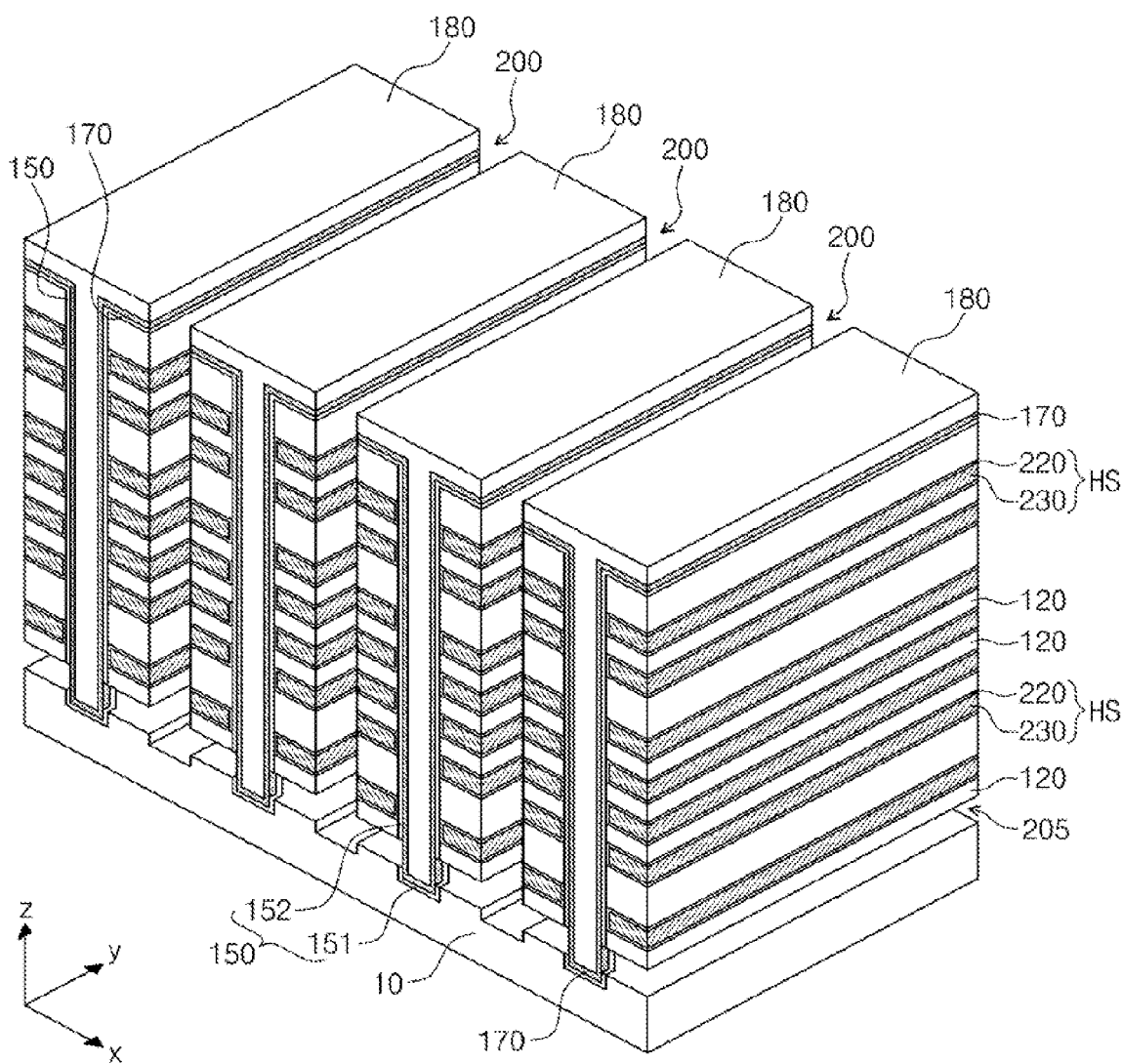

Referring to FIG. 24, the first sacrificial layer 111 and a portion of the vertical layer 150 are removed. The etching of the vertical layer 150 also removes the lowermost insulating layer 121. A first recess region 205 is formed by the removal of the lowermost insulating layer 121.

Figure 25A:
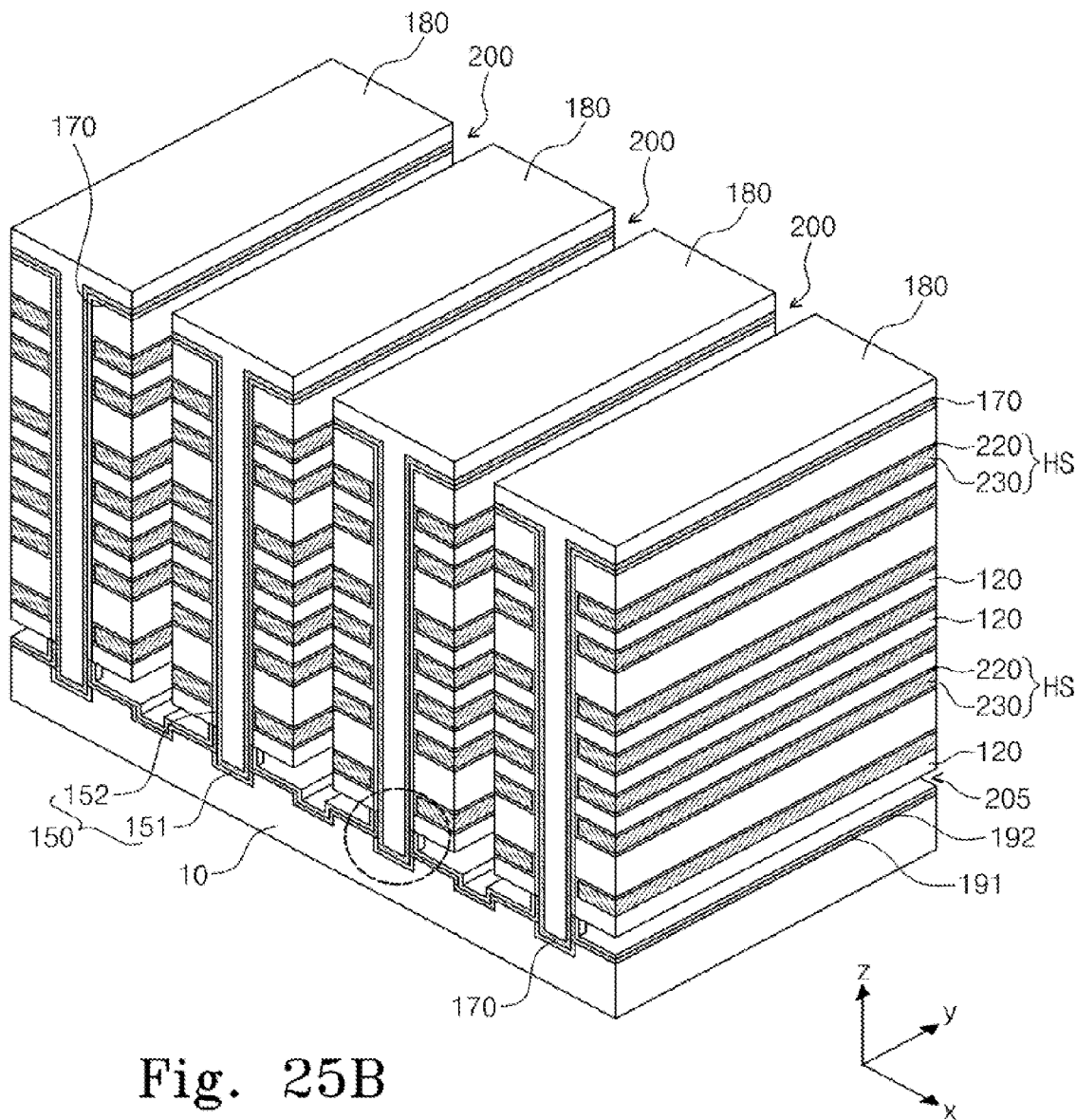
Figure 25B:
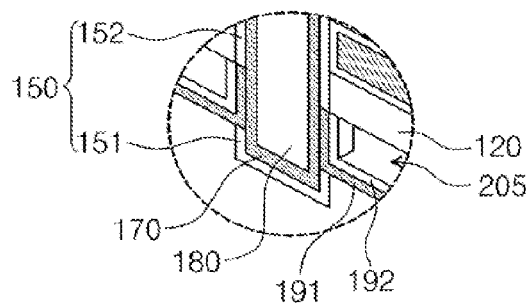

Referring to FIG. 25, a semiconductor connecting layer 191 and a gate insulating layer 192 are formed on the first semiconductor layer 170 and on the substrate 10 exposed by the first recess region 205 and the trenches 200. The semiconductor connecting layer 191 extends from an outer sidewall of the first semiconductor layer 170 to the exposed top surface of the substrate 10. Thus, the first semiconductor layer 170 is connected to the substrate 10 via the semiconductor connecting layer 191. The gate insulating layer 192 is formed on the semiconductor connecting layer 191.

Figure 26A:
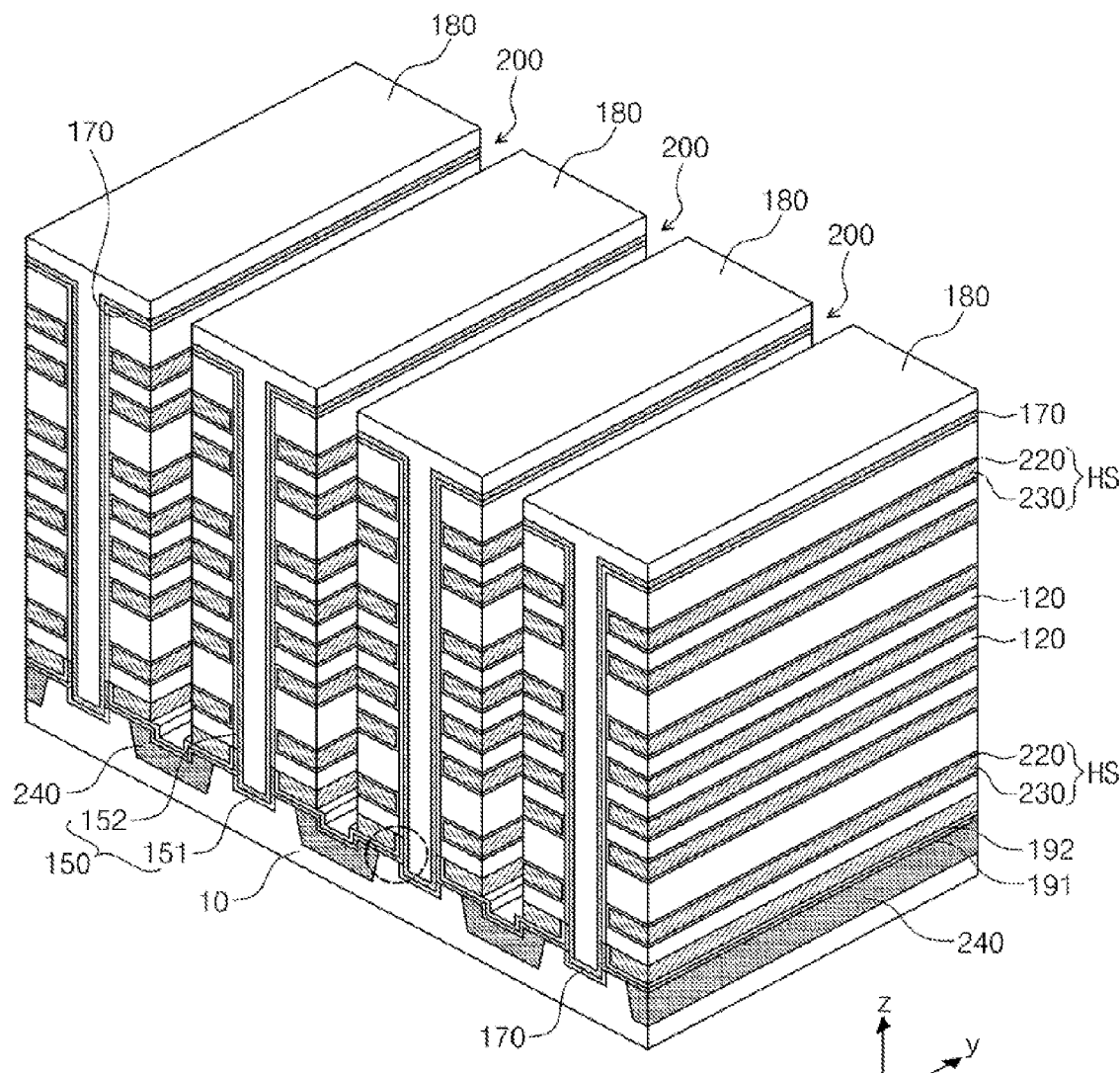
Figure 26B:
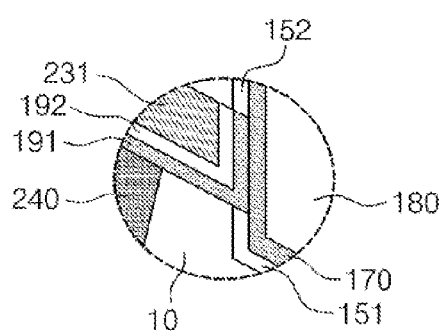

Referring to FIG. 26, a second conductive pattern 231 is formed to fill the first recess region 205. The formation of the second conductive pattern 231 includes forming a conductive layer to fill the first recess region 205 and removing the conductive layer from the trenches 200 to remain the second conductive pattern 231 in the first recess region 205. According to an embodiment, the horizontal pattern 220 may not be formed in the first recess region 205 unlike FIG. 13.

Figure 27A:
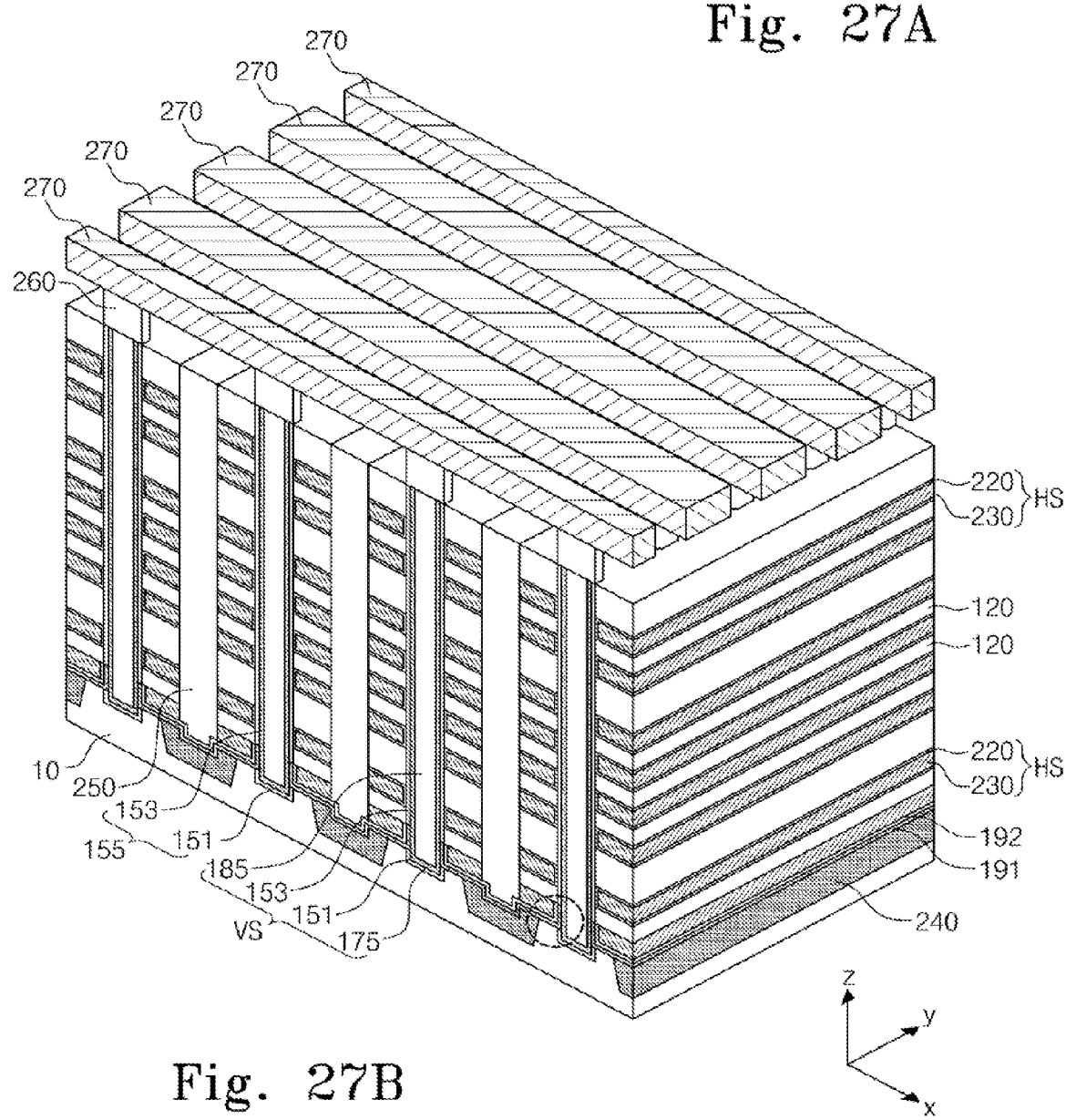
Figure 27B:
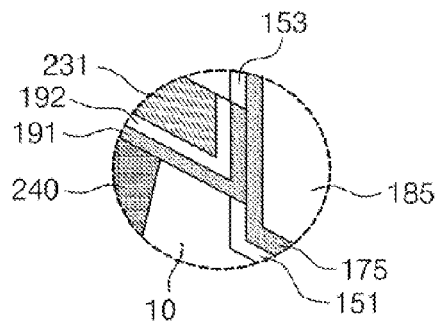

FIG. 27 illustrates a structure obtained by applying the process steps described with reference to FIGS. 12 and 13 to the structure of FIG. 26. According to an embodiment, the horizontal pattern 220 may not be provided between the second conductive pattern 231 and the gate insulating layer 192 unlike FIG. 13.

FIGS. 28 through 40 are perspective views illustrating a three-dimensional semiconductor device and a method of fabricating the three-dimensional semiconductor device according to an embodiment of the inventive concept.

Figure 28:
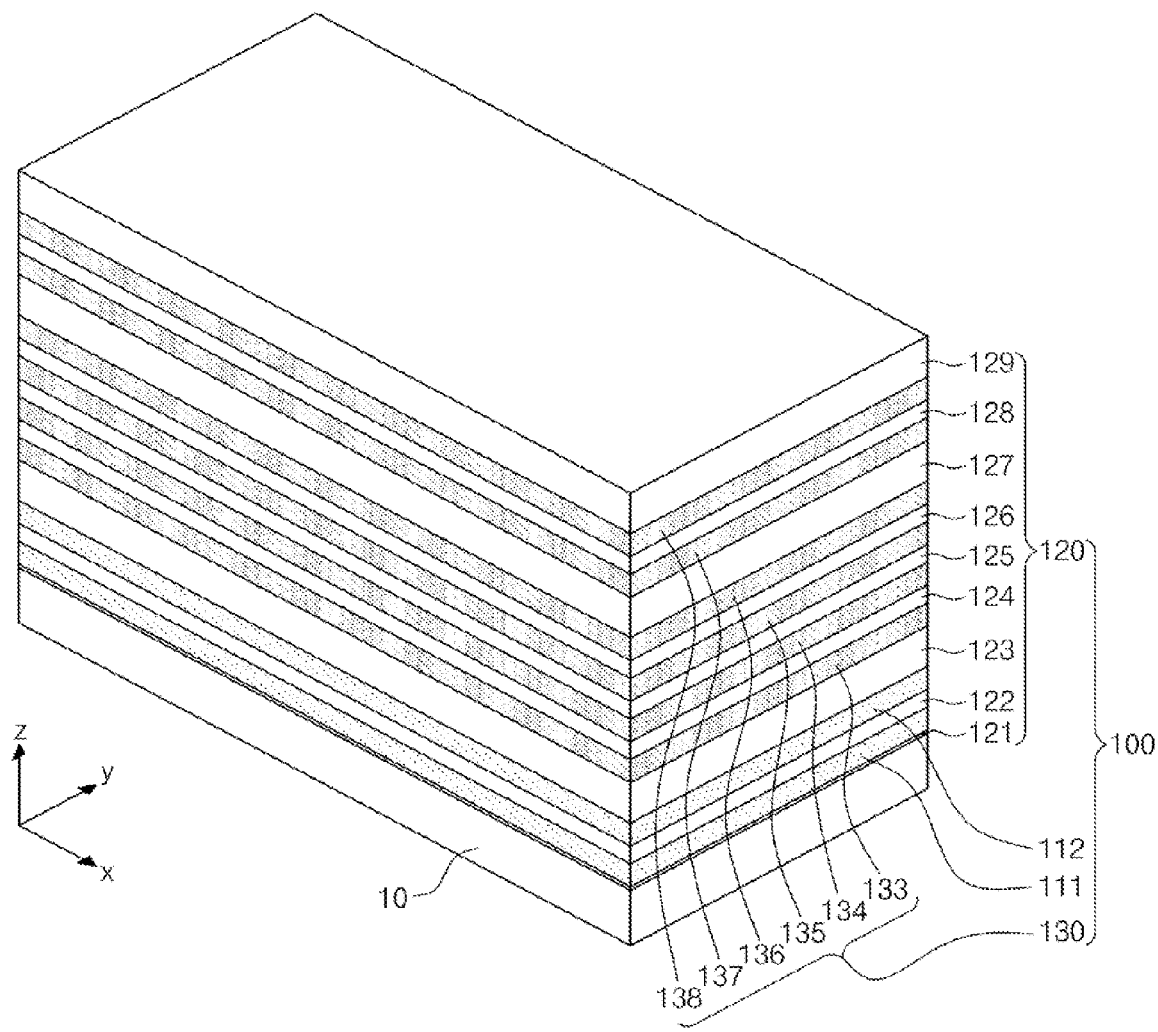
FIGS. 28 through 36, 37A, 37B, 38, 39A, 39B, 40A, and 40B are perspective views illustrating a three-dimensional semiconductor device and a method of fabricating the three-dimensional semiconductor device according to an embodiment of the inventive concept.

Referring to FIG. 28, a mold structure 100 is formed on the substrate 10. The mold structure 100 includes a first sacrificial layer 111, a second sacrificial group 130 including second sacrificial layers 133 to 138, a third sacrificial layer 112, and an insulating group 120 including insulating layers 121 to 129. The insulating layers 121 to 129 and sacrificial layers including the first, second and third sacrificial layers 111, 112, and 133 to 138 are alternately stacked as shown in FIG. 28.

Figure 29:
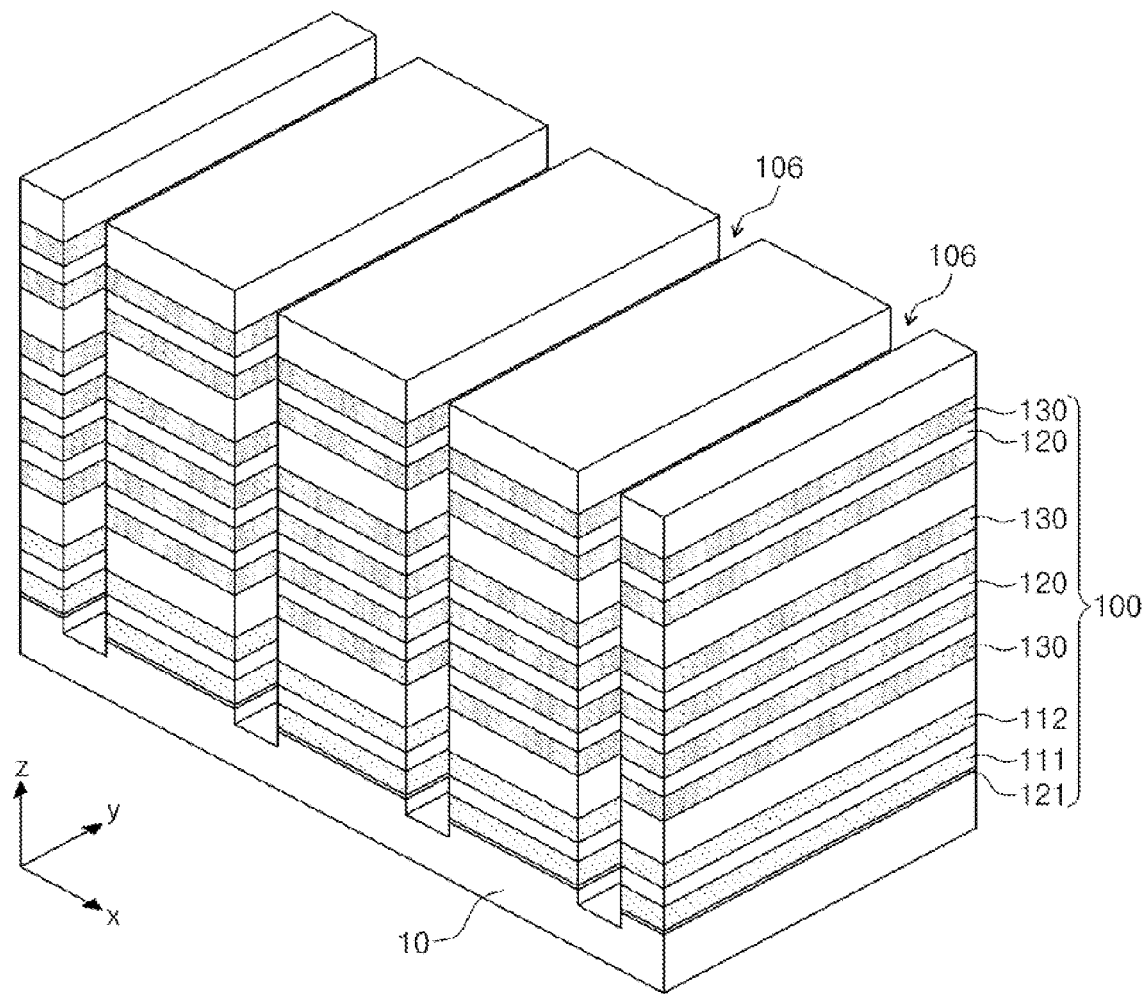

Referring to FIG. 29, openings 105 are formed to penetrate the mold structure 100. The openings 106 are formed to expose a top surface of the substrate 100 along a y-direction.

According to an embodiment, each of the openings 106 may be, for example, a hexahedral portion where aspect ratios of sections projected on the xy and xz planes are greater than about 5. For example, lengths in the y and z directions of the opening 106 may be five times a length in the x direction of the opening 106.

Figure 30:
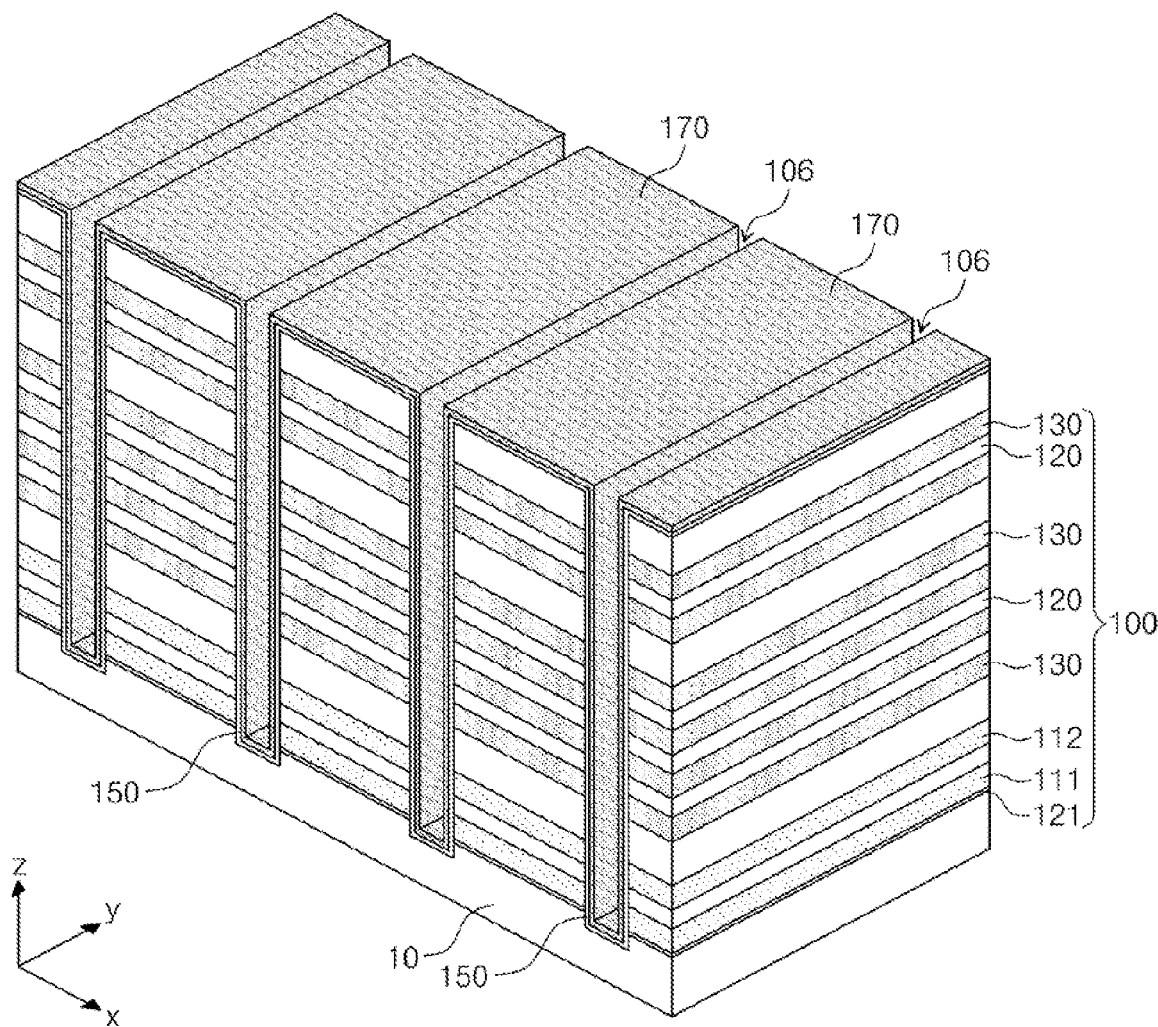

Referring to FIG. 30, a vertical layer 150 and a first semiconductor layer 170 are sequentially formed to cover inner walls of the openings 106. The vertical layer 150 extends horizontally from the openings 106 to cover a top surface of the mold structure 100. According to an embodiment, the first semiconductor layer 170 may include a polysilicon layer formed by, for example, CVD and/or ALD.

According to an embodiment, the vertical layer may include one layer and/or a plurality of layers. As will be described again in detail with reference to FIGS. 41 through 56 later, exemplary embodiments of the inventive concept may be diversely classified according to the layers used as the vertical layer.

Figure 31:
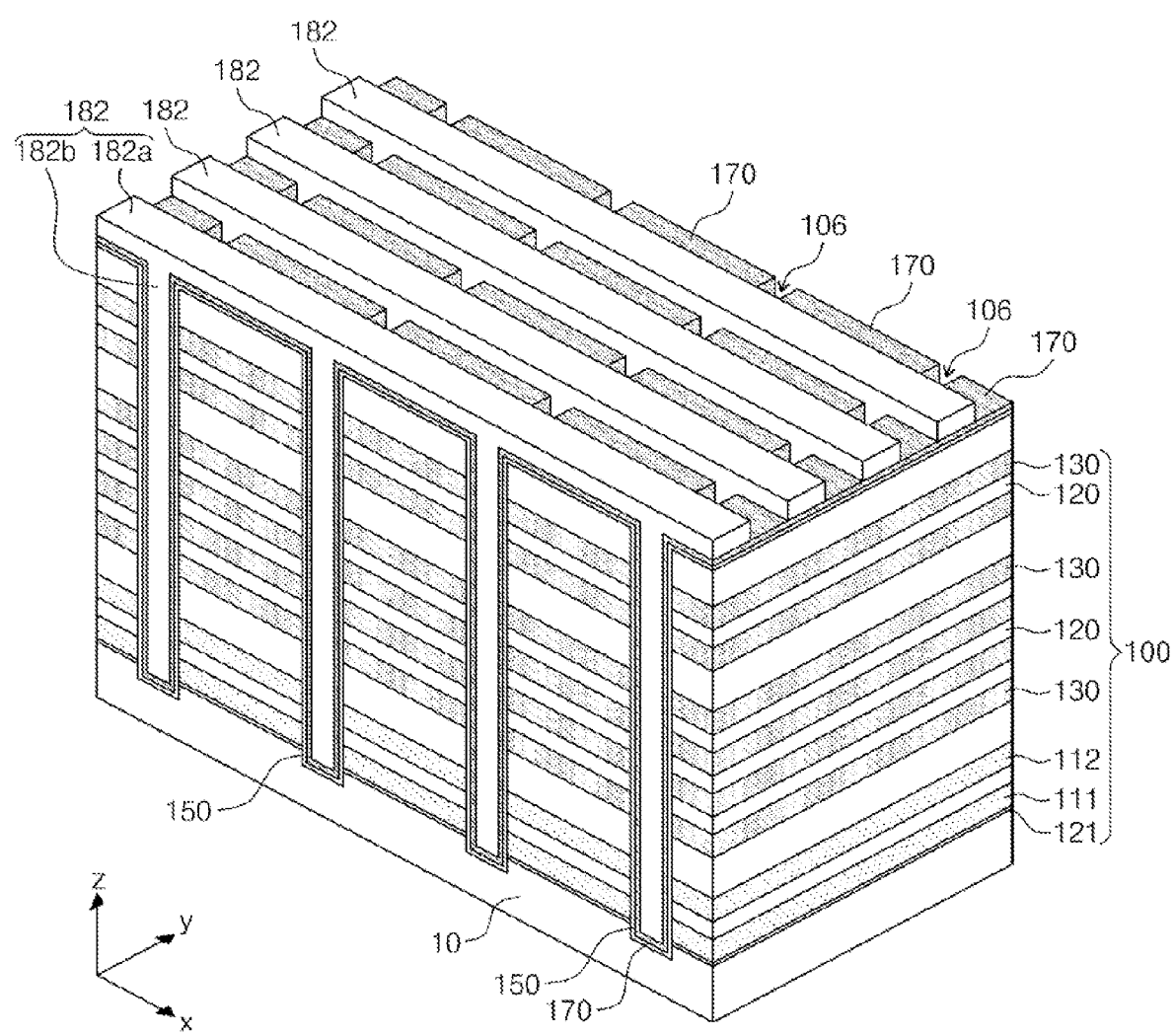

Referring to FIG. 31, gap-fill patterns 182 are formed on the resultant structure provided with the first semiconductor layer 170. The gap-fill pattern 182 includes an insulating material formed using spin-on-glass (SOG) and/or a silicon oxide layer. According to an embodiment, the formation of the gap-fill patterns 182 may include forming an insulative filling layer (not shown) on the structure including the first semiconductor layer 170 to fill the openings 106 and patterning the insulative filling layer to cross the openings 106. According to an embodiment, the patterning of the insulative filling layer may include, for example, anisotropically etching the insulative filling layer using an etchant with etch selectivity to the first semiconductor layer 170. According to an embodiment, the patterning of the insulative filling layer may be performed to the bottom of the opening 106 such that the gap-fill patterns 182 are separated from each other.

Each of the gap-fill patterns 182 includes an upper pattern 182a crossing the openings 106 and extension patterns 182b extending downwardly from the upper pattern 182a to partially fill the respective corresponding openings 106. Surfaces of the first semiconductor layer 170 are exposed between the extension patterns 182b. For example, the extension patterns 182b are formed to expose sidewalls and top surfaces of the first semiconductor layer 170 between the extension patterns 182b.

Figure 32:
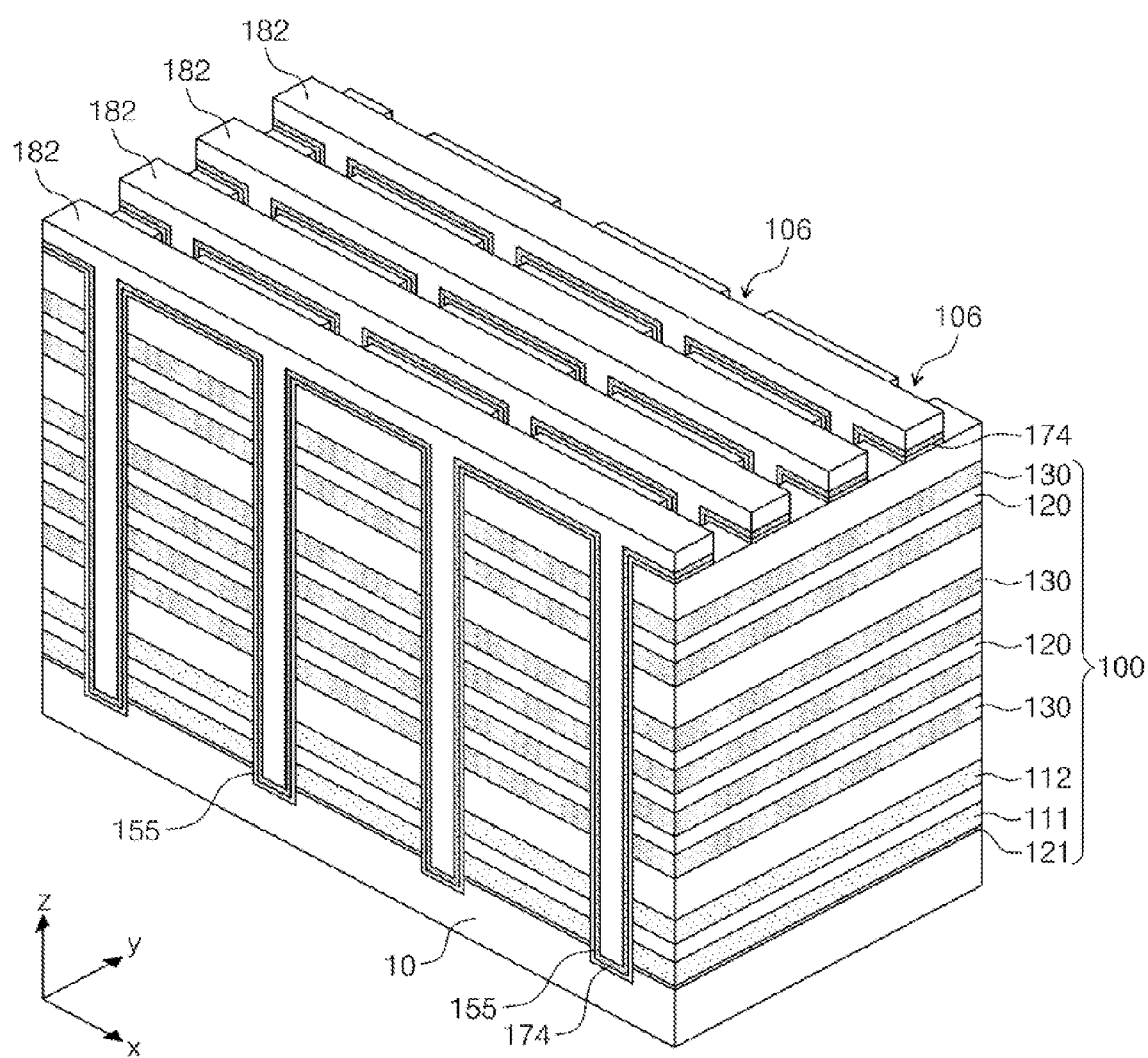

Referring to FIG. 32, the first semiconductor layer 170 is patterned using the gap-fill pattern 182 as an etch mask. According to an embodiment, the patterning of the first semiconductor layer 170 may include isotropically etching the first semiconductor layer 170 using an etch recipe having an etch selectivity to the vertical layer 150. As a result of the patterning of the first semiconductor layer 170, the first semiconductor layer 170 is horizontally separated to form first semiconductor patterns 174.

According to an embodiment, during the patterning of the first semiconductor layer 170, the vertical layer 150 may be also etched to expose sidewalls of the mold structure 100, so that the vertical layer 150 may be horizontally separated to form two-dimensionally arranged vertical patterns 155. For instance, according to an embodiment, the vertical patterns 155 may be disposed between the gap-fill patterns 182 and the mold structure 100 and arranged two-dimensionally on the substrate 10. According to an embodiment, although the first semiconductor patterns 174 may be separated from each other by the patterning of the first semiconductor layer 170, the vertical layer 150 may remain on inner walls of the openings 106. For example, according to an embodiment, the patterning of the first semiconductor layer 170 may be performed without exposing the sidewalls of the mold structure 100.

Figure 33:
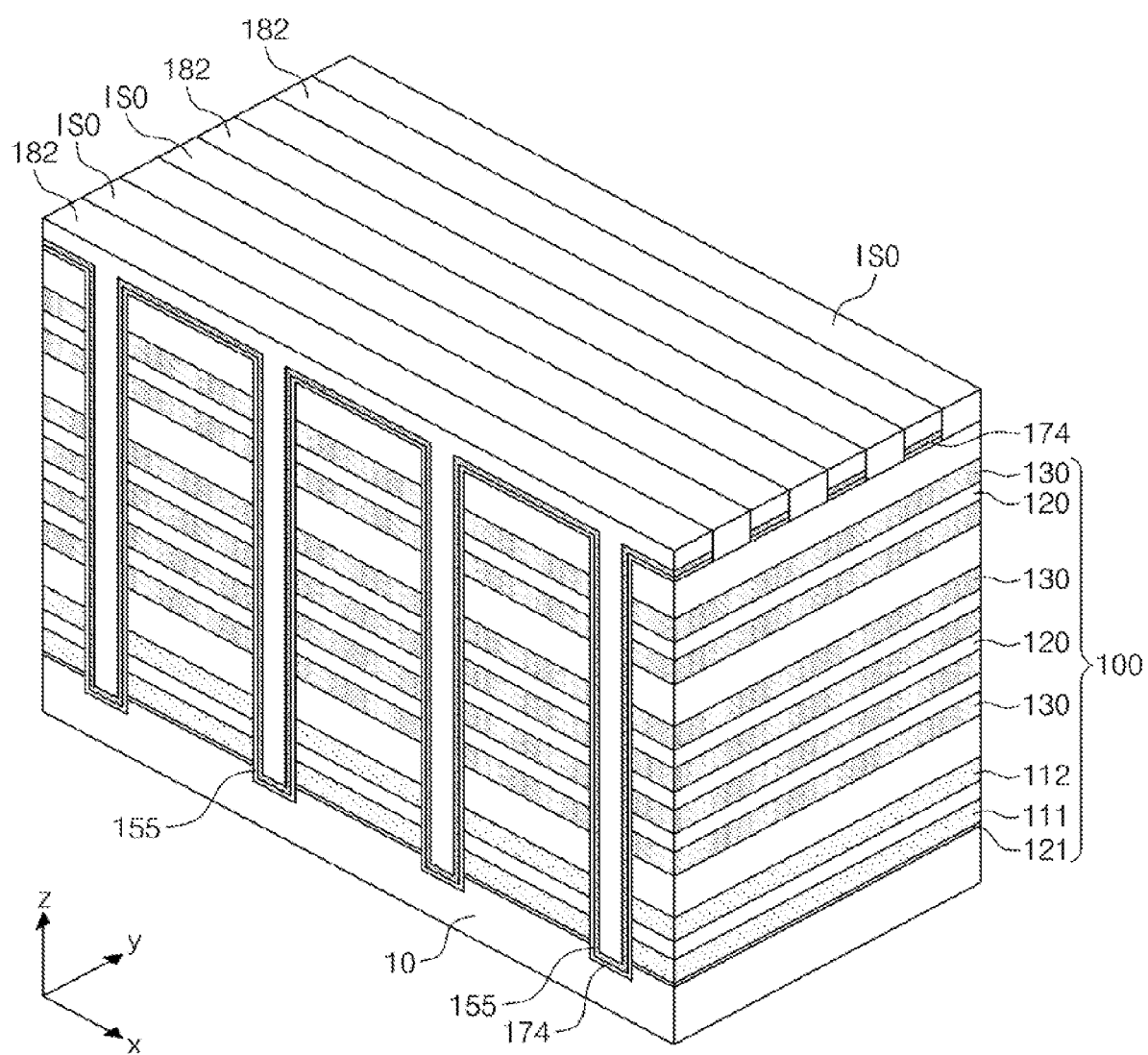
Figure 34:
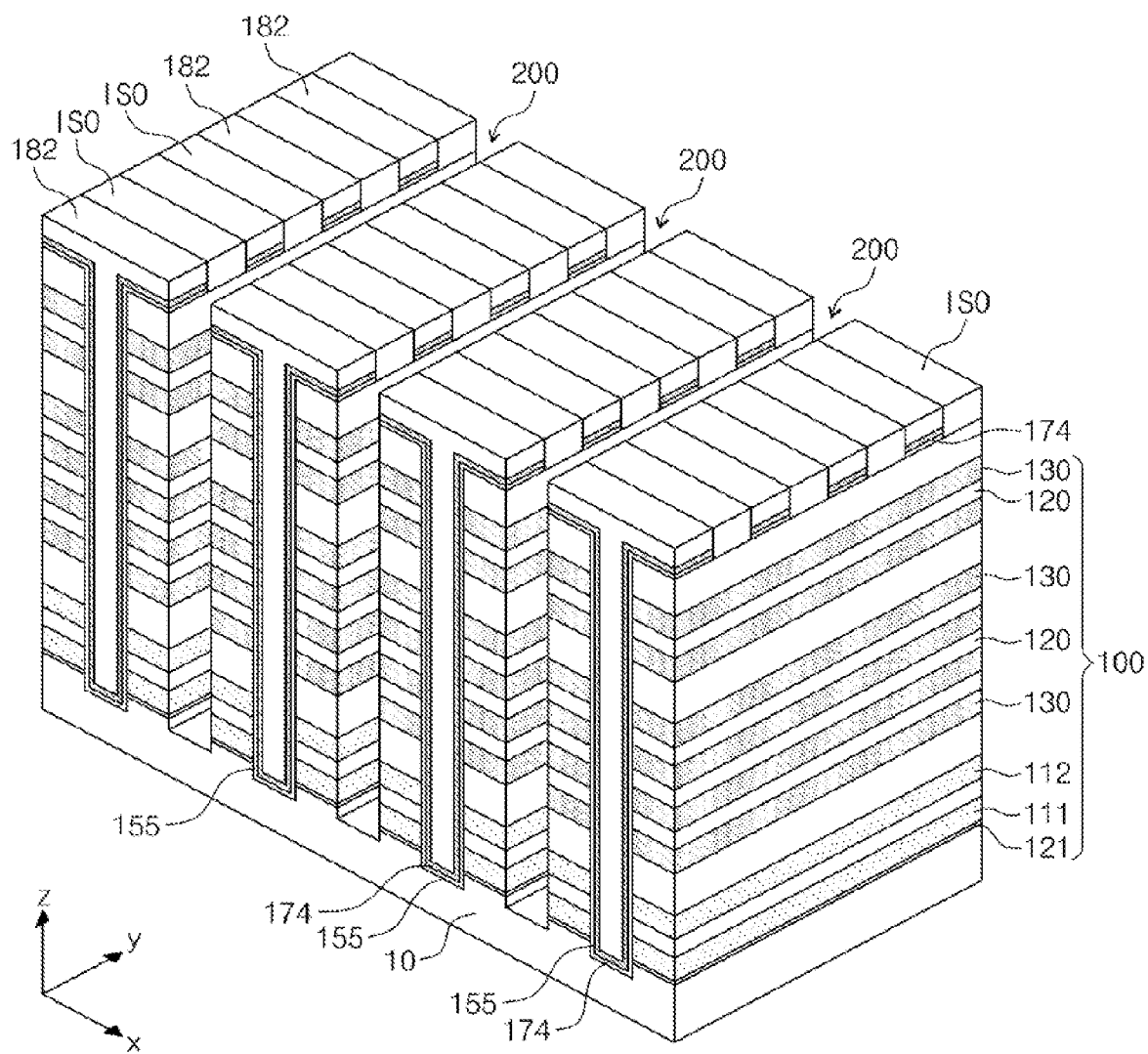

Referring to FIGS. 33 and 34, string separating portions ISO are formed to fill the openings 106 between the gap-fill patterns 182. Thereafter, the trenches 200 are formed to penetrate the mold structure 100 and expose sidewalls of the sacrificial layers 111, 112 and 130 and the insulating layers 120. According to an embodiment, the trenches 200 may be formed to penetrate the mold structure 100 between the openings 106. According to an embodiment, the trenches 200 may be formed to expose the substrate 10 along a direction parallel to the openings 106.

The string separating portions ISO are formed of at least an insulating material. According to an embodiment, the string separating portions ISO each may be formed to have a similar shape as the gap-fill pattern 182. For example, according to an embodiment, each of the string separating portions ISO may include an upper separation pattern horizontally crossing the openings 106 and extension parts (not shown) extending downwardly from the upper separation pattern to fill the openings 106.

Figure 35:
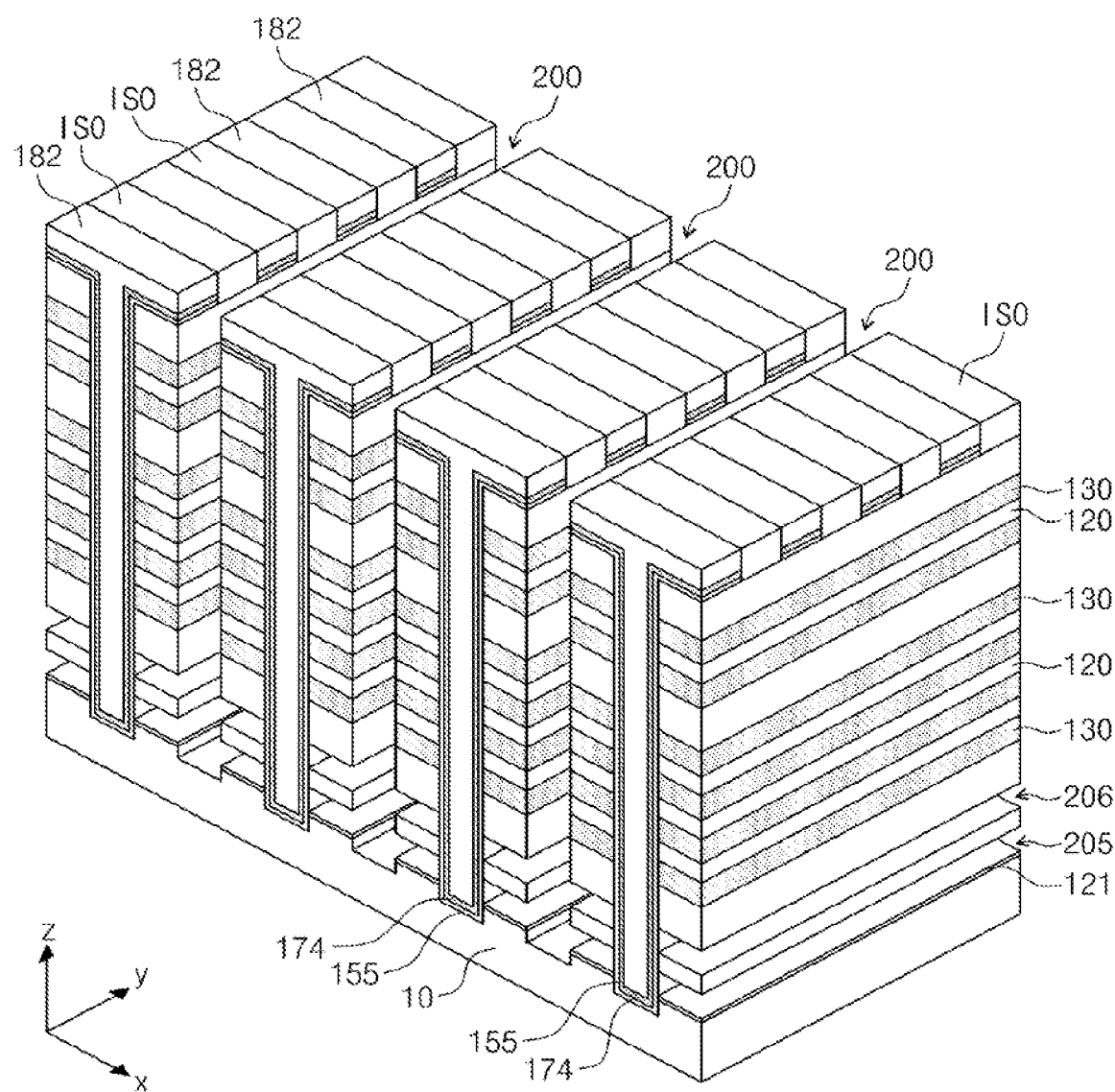

Referring to FIG. 35, a first recess region 205 and a third recess region 206 are formed by selectively removing the first and third sacrificial layers 111 and 112, respectively, exposed by the trenches 200. The first and third recess regions 205 and 206 each is a gap region extending horizontally from the trenches 200. The first and third recess regions 205 and 206 expose some sidewalls of the vertical patterns 155. The first and third recess regions 205 and 206 are formed to extend along the y-direction. According to an embodiment, the selective removal of the first and third sacrificial layers 111 and 112 may be performed using an etchant with etch selectivity to the insulating layers 120 and the second sacrificial layers 130. The lowermost insulating layer 121 remains after the removal of the first and third sacrificial layers 111 and 112 as shown in FIG. 35. Alternatively, at least a portion of the lowermost insulating layer 121 may be removed during the removal of the first and third sacrificial layers 111 and 112.

Figure 36:
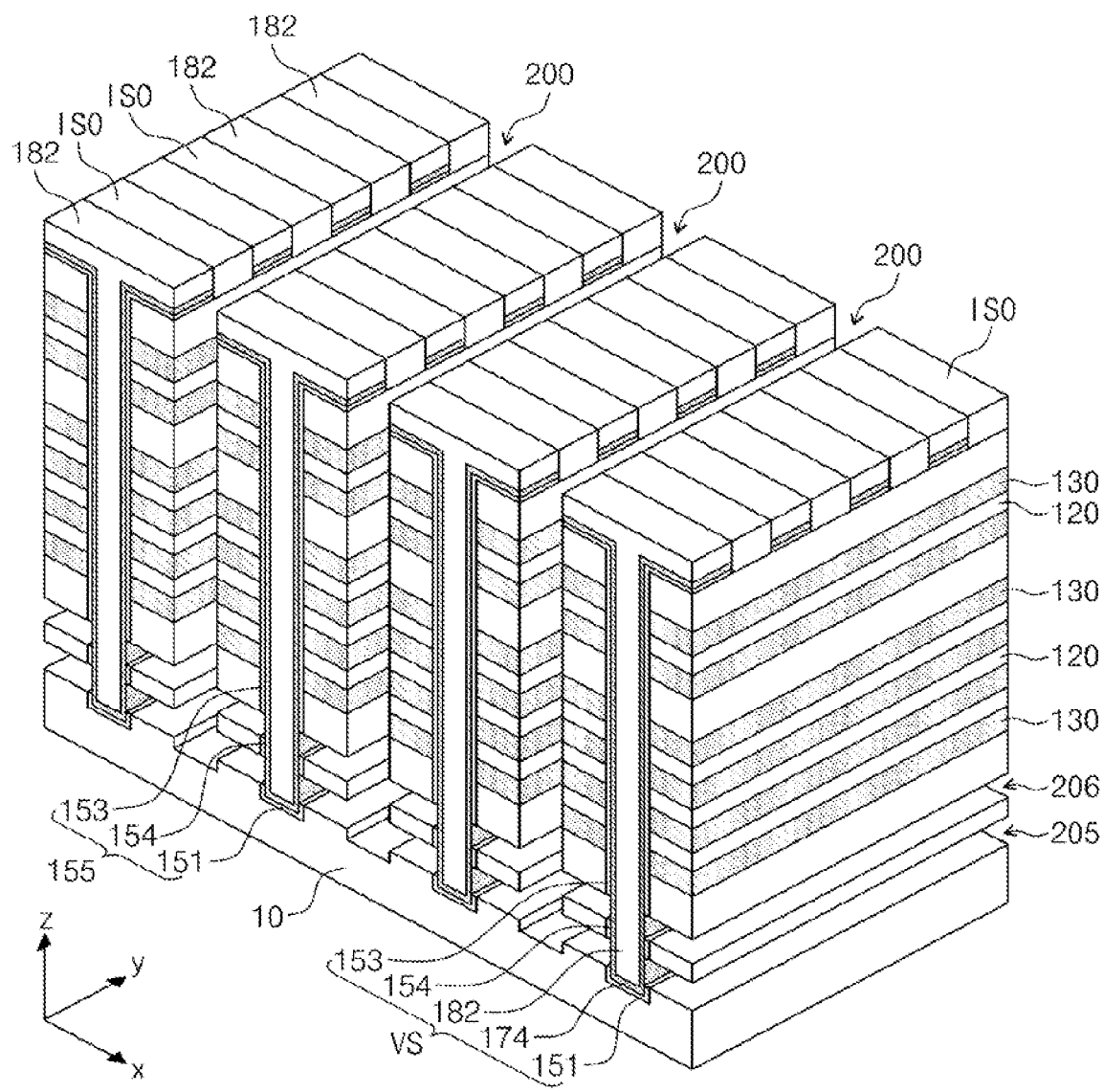

Referring to FIG. 36, a sidewall of the vertical pattern 155 exposed by the first and third recess regions 205 and 206 is removed. Due to the removal of the vertical pattern 155, the vertical pattern 155 is separated into a lower insulating pattern 151 in the substrate 10, an upper insulating pattern 153 spaced apart from the substrate 10, and an intermediate insulating pattern 154 disposed between the lower insulating pattern 151 and the upper insulating pattern 153. The lower insulating pattern 151 is formed to cover lower sidewalls and a bottom surface of the semiconductor pattern 174. In the case that the vertical layer 150 includes a plurality of layers, the etching of the vertical pattern 155 includes a plurality of etching steps, each of which is selected depending on materials and/or thicknesses the layers constituting the vertical pattern 155. A sidewall of the semiconductor pattern 174 is partially exposed by etching the vertical pattern 155. According to an embodiment, while etching the vertical pattern 155, the lowermost insulating layer 121 may be removed along with the vertical pattern 155 to expose a top surface of the substrate 10. For instance, according to an embodiment, when the lowermost insulating layer 121 and the vertical pattern 155 are formed of the same or substantially the same material (e.g., silicon oxide), the vertical pattern 155 and the lowermost insulating layer 121 may be etched at the same time. According to an embodiment, a portion of the semiconductor pattern 174 may be etched together with the vertical pattern 155 during etching the vertical pattern 155. According to an embodiment, the first and third sacrificial layers 111 and 112 and the vertical layer 150 may be successively etched during one etching process.

The vertical pattern 155, the semiconductor pattern 175 and the gap-fill pattern 182 constitutes a vertical structure VS. A plurality of the vertical structures VS are two-dimensionally formed on the substrate 10 to penetrate the mold structure 100.

Figure 37A:
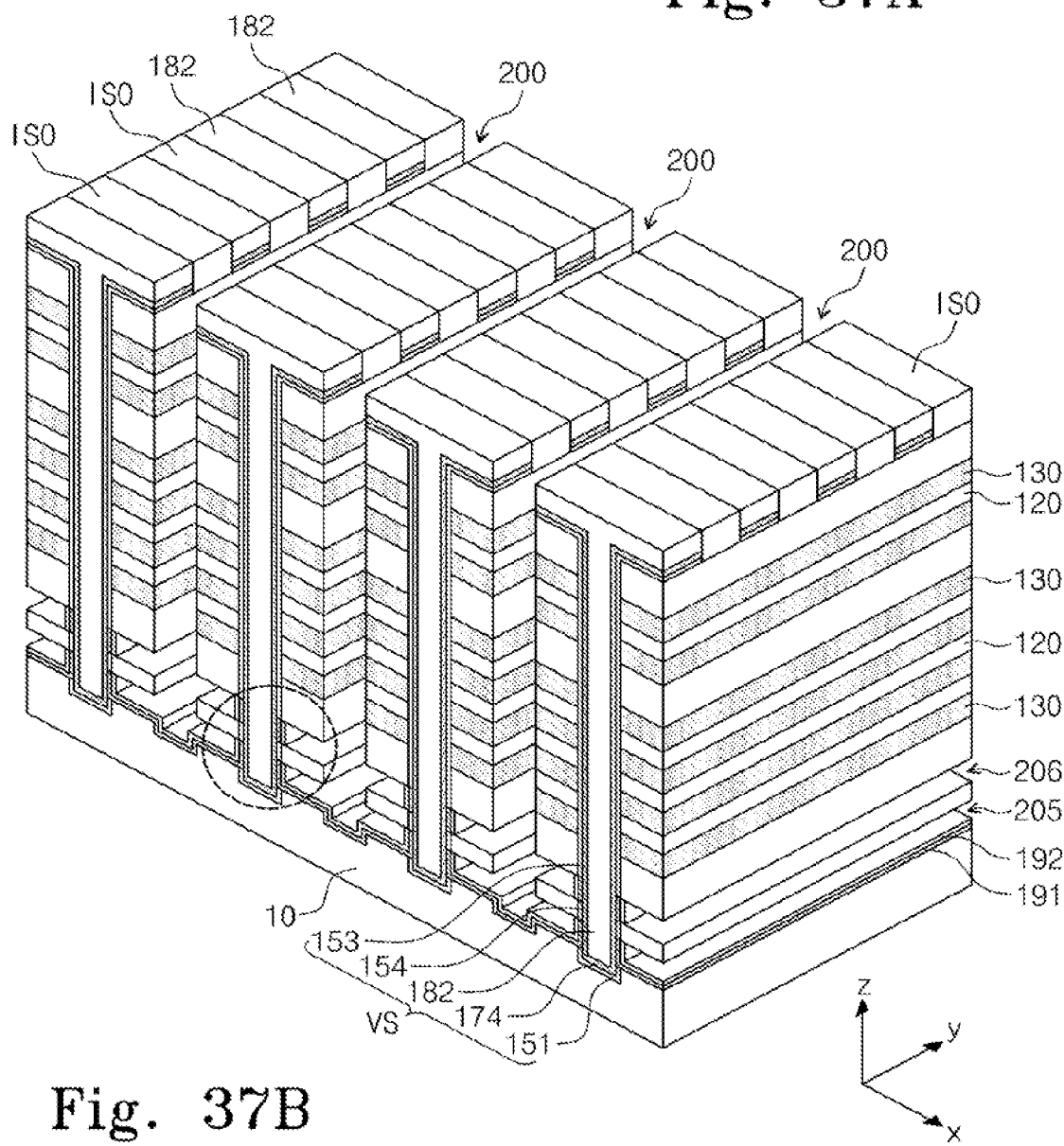
Figure 37B:
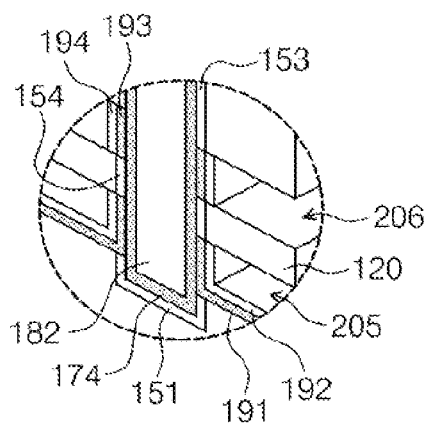

Referring to FIG. 37, a semiconductor connecting layer 191 is formed on the semiconductor pattern 174 and the substrate 10 exposed by the first and third recess regions 205 and 206. The semiconductor connecting layer 191 extends from an outer sidewall of the semiconductor pattern 174 to the substrate 10, such that the semiconductor pattern 174 is connected to the substrate 10 via the semiconductor connecting layer 191. A second semiconductor layer 193 is formed on the semiconductor pattern 174 exposed by the third recess region 206.

According to an embodiment, the semiconductor connecting layer 191 and the second semiconductor layer 193 may be formed using an epitaxial process, in which exposed surfaces of the semiconductor pattern 174 and the substrate 10 are used as seed layers. The semiconductor connecting layer 191 and the second semiconductor layer 193 are formed on the semiconductor pattern 174 and the substrate 10. Alternatively, the semiconductor connecting layer 191 and the second semiconductor layer 193 may be formed using an ALD or CVD process.

A first gate insulating layer 192 is formed on the semiconductor connecting layer 191. According to an embodiment, the first gate insulating layer 192 may be a thermal oxide layer formed by thermally oxidizing an exposed surface of the semiconductor connecting layer 191. Alternatively, the first gate insulating layer 192 may be an insulating layer formed using an ALD or CVD process. According to an embodiment, although not shown in FIG. 37, the first gate insulating layer 192 may be formed on the bottom surfaces of the insulating layers 120 exposed by the first and third recess regions 205 and 206. According to an embodiment, the first gate insulating layer 192 may be different in material and/or thickness from the vertical pattern 155. According to an embodiment, a second gate insulating layer 194 may be formed on the second semiconductor layer 193 during the formation of the first gate insulating layer 192.

Figure 38:
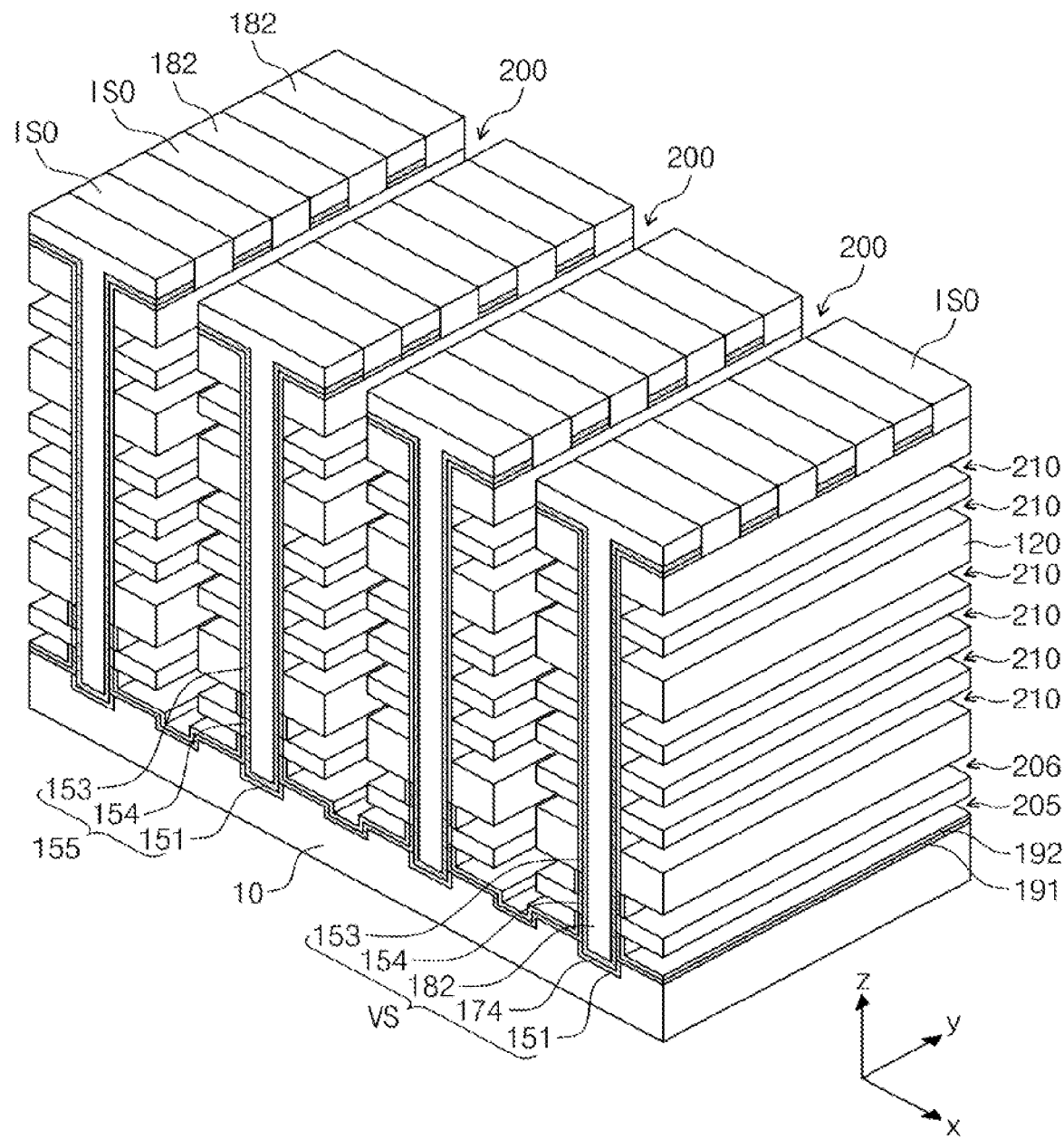

Referring to FIG. 38, second recess regions 210 are formed between the insulating layers 120 by selectively removing the second sacrificial layers 130 exposed by the trenches 200. The second recess regions 210 are gap regions laterally extending from the trenches 200. The second recess regions 210 are formed to expose the sidewalls of the upper insulating pattern 153.

Figure 39A:
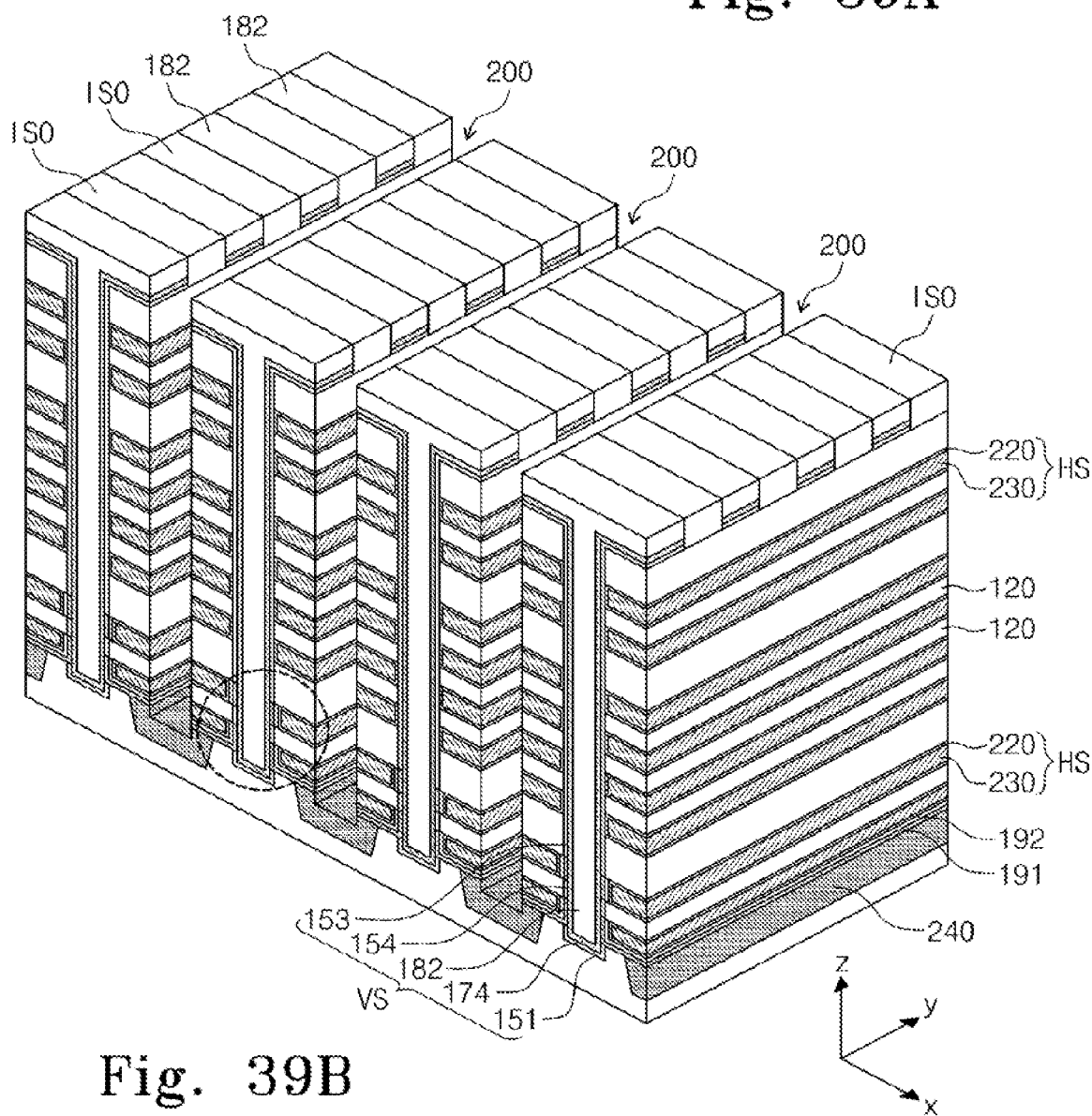
Figure 39B:
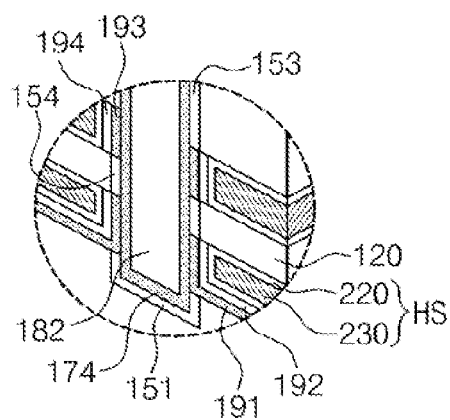

Referring to FIG. 39, horizontal structures HS are formed in the he first, second, and third recess regions 205, 206, and 210. Each of the horizontal structures HS includes a horizontal pattern 220 covering the inner wall of the first, second, or third recess regions 205, 206, or 210 and a conductive pattern 230 filling the remaining space of the first, second, or third recess regions 205, 206, or 210.

According to an embodiment, the formation of the horizontal structure HS may include sequentially forming a horizontal layer and a conductive layer to fill the first, second, and third recess regions 205, 206, and 210, and then removing the conductive layer from the trenches 200 to form the conductive patterns 230 in the first, second, and third recess regions 205, 206, and 210. According to an embodiment, portions of the semiconductor connecting layer 191 and the gate insulating layer 192 may be removed in the trenches 200 during the formation of the horizontal structure HS.

Figure 40A:
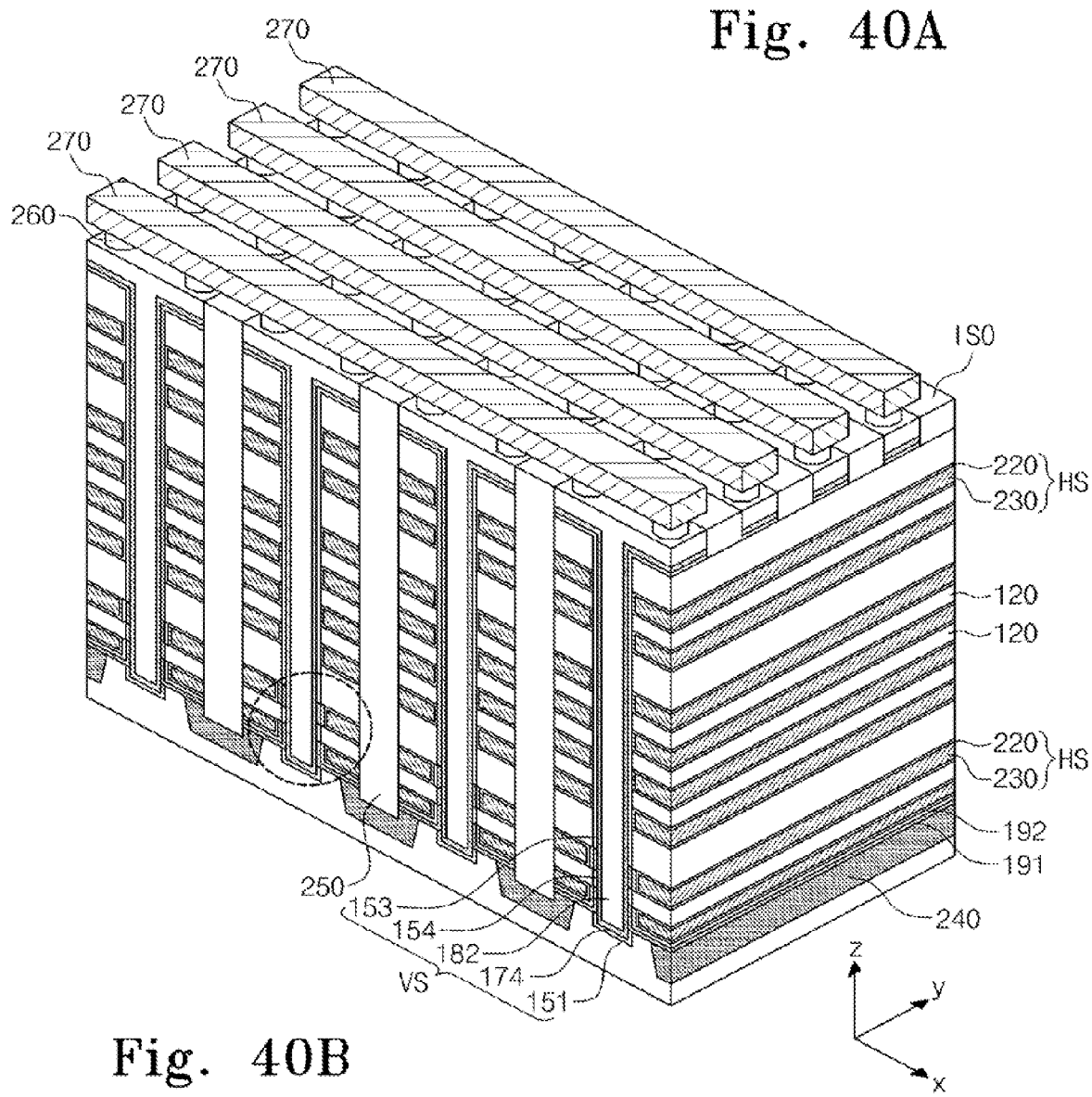
Figure 40B:
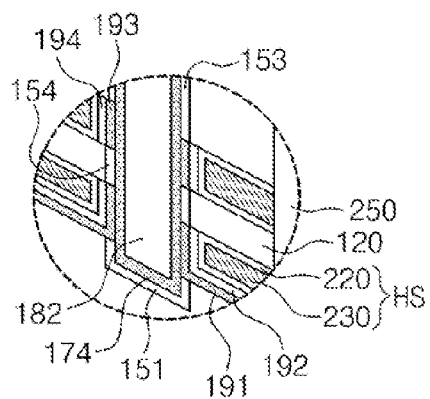

Referring to FIG. 40, electrode separation patterns 250 are formed in the trenches 200. Upper plugs 260 are formed on the vertical structures VS, respectively, and upper lines 270 are formed on the upper plugs 260 to connect the upper plugs 260 with each other. The upper plugs 260 penetrate the gap-fill patterns 182 to be electrically connected to the semiconductor patterns 174.

According to an embodiment of the inventive concept, the semiconductor pattern may be electrically connected to the substrate via the semiconductor connecting layer extending from a sidewall of the semiconductor pattern. Accordingly, it is possible to simply fabricate a memory device capable of erasing memory cells based on the body or bulk erase scheme.

FIGS. 41 through 56 are perspective views illustrating structures of information storing layers according to exemplary embodiments of the inventive concept. In an exemplary charge trap type nonvolatile memory device, the horizontal pattern 220 and the vertical pattern 155 may be part of a memory element of a memory cell transistor. The memory element includes a plurality of information storing layers. The number and types of thin layers constituting each of the horizontal and vertical patterns 220 and 155 may vary, and as a result, exemplary embodiments of the inventive concept may be classified. For example, exemplary embodiments of the inventive concept with respect to the information storing layer may be classified as in the following Table 1.

TABLE 1

| Information storage layer | | | | | | | |
|---|---|---|---|---|---|---|---|
| VS | | | | HS | | | Corresponding figure |
| SP | TIL | CL | CPL | BIL1 | | 230 | 41/49[1] |
| SP | TIL | CL | | BIL1 | | 230 | 42/50 |
| SP | TIL | | CL | BIL1 | | 230 | 43/51 |
| SP | TIL | CL | | BIL1 | BIL2 | 230 | 44/52 |
| SP | TIL | | CL | BIL1 | BIL2 | 230 | 45/53 |
| SP | TIL | CL | CPL | BIL1 | | 230 | 46/54[2] |
| SP | TIL | CL | CPL | BIL1 | | 230 | 47/55[3] |
| SP | TIL | CL | CPL | BIL1 | BIL2 | 230 | 48/56 |

TIL: Tunnel Insulating Layer
CL: Charge storing Layer
SP: Semiconductor Pattern
BIL: Blocking Insulating Layer
CPL: Capping Layer
[1]CPL with uniform thickness
[2]CPL with recessed sidewall
[3]CPL separated vertically In an exemplary flash memory, the information storing layer may include a tunnel insulating layer TIL, a charge storing layer CL, and a first blocking insulating layer BIL1 (e.g., as shown in Table 1 and illustrated in FIGS. 41 through 56). According to an exemplary embodiment, the information storing layer may include a second blocking insulating layer BIL2 between the first blocking insulating layer BIL1 and the conductive pattern 230. The information storing layer includes a capping layer CPL interposed between the charge storing layer CL and the first blocking insulating layer BIL1. According to an embodiment, layers included in the information storing layer may be formed using a deposition technique that provides, for example, application high step coverage, such as, for example a CVD and/or ALD technique.

As shown in Table 1 and illustrated in FIGS. 41 through 56, the vertical structure VS includes the tunnel insulating layer TIL, and the horizontal structure HS includes at least one of the first and second blocking insulating layers BIL1 and BIL2. According to an exemplary embodiment (e.g., as illustrated in FIGS. 41, 42, 44, 46 through 50, 52, and 54 through 56), the vertical structure VS may include the charge storing layer CL. According to an exemplary embodiment (e.g., as illustrated in FIGS. 43, 45, 51, and 53), the horizontal structure HS may include the charge storing layer CL.

According to an embodiment, when the vertical structure VS includes the charge storing layer CL (e.g., as illustrated in FIGS. 41, 46 through 49, and 54 through 56), the vertical structure VS may include the capping layer CPL. According to an embodiment, the vertical structure VS and the horizontal structure HS may directly contact and may not include the capping layer CPL (e.g., as illustrated in FIGS. 42 through 45, and 50 through 53).

Figure 41:
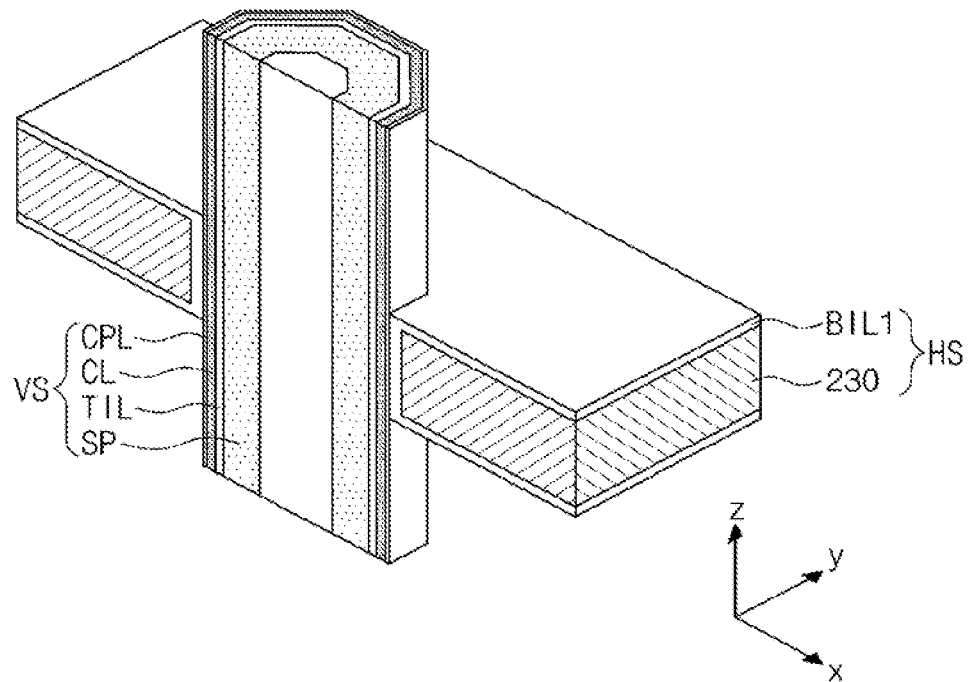
FIGS. 41 through 45, 46A, 46B, 47 through 53, 54A, 54B, 55, and 56 are perspective views illustrating information storing layers according to exemplary embodiments of the inventive concept.
Figure 42:
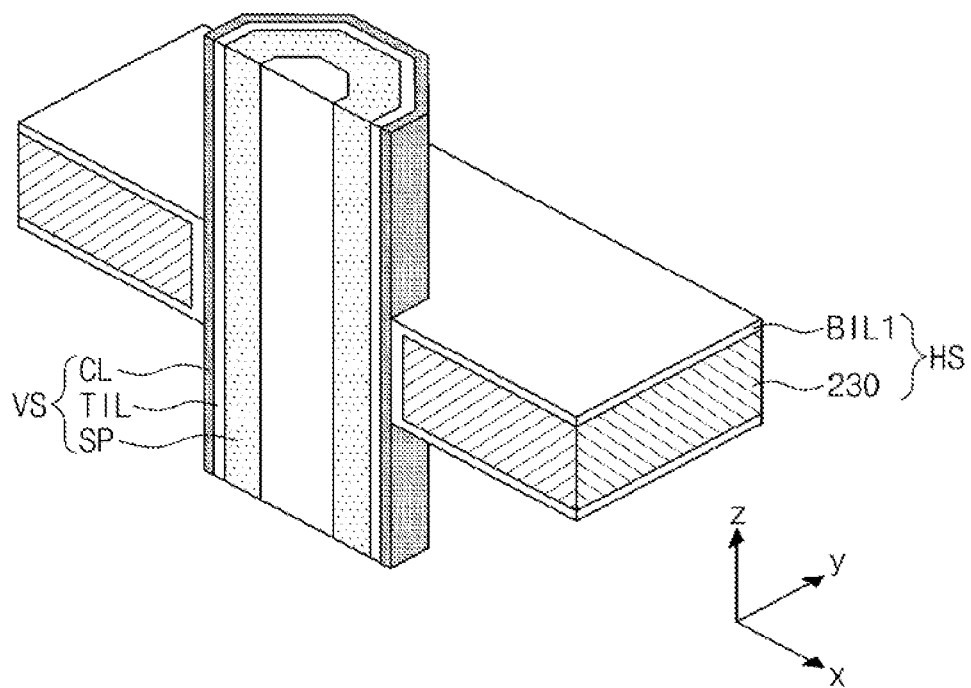
Figure 43:
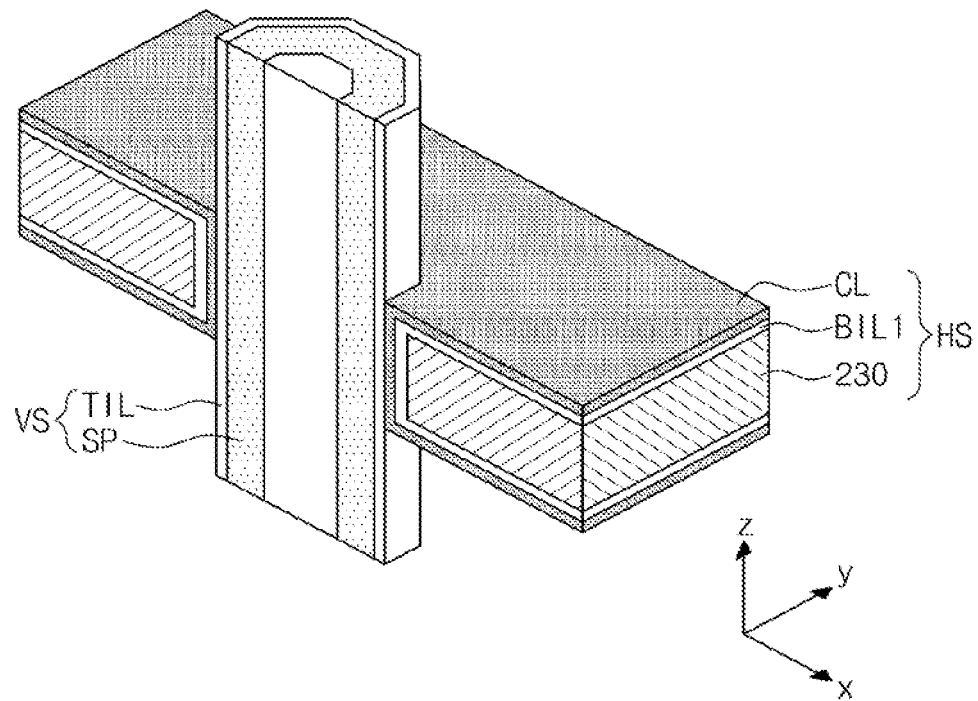
Figure 44:
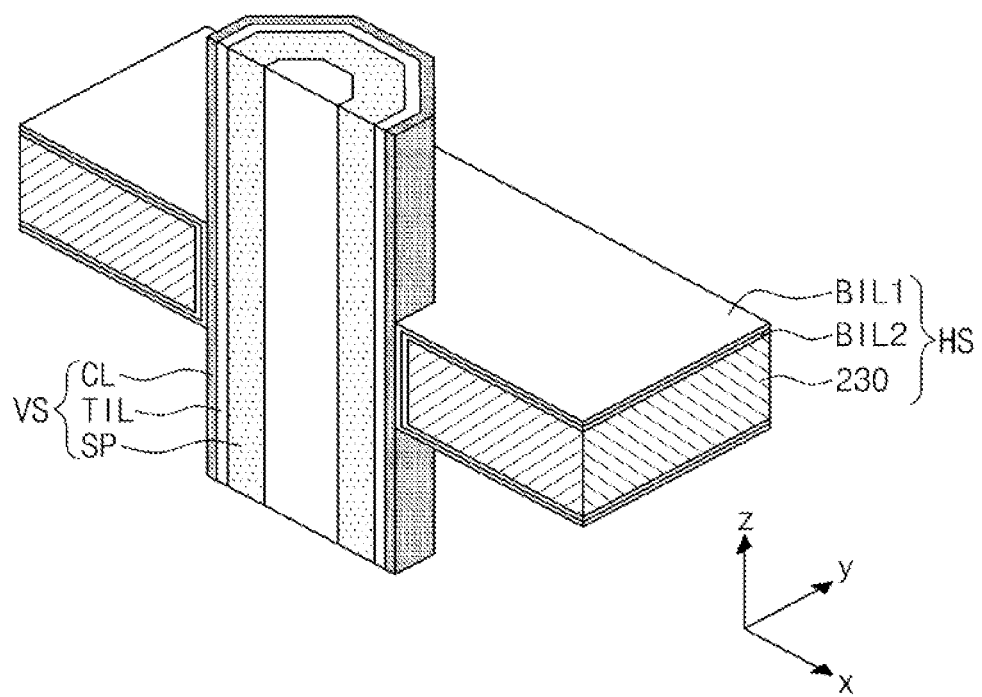
Figure 45:
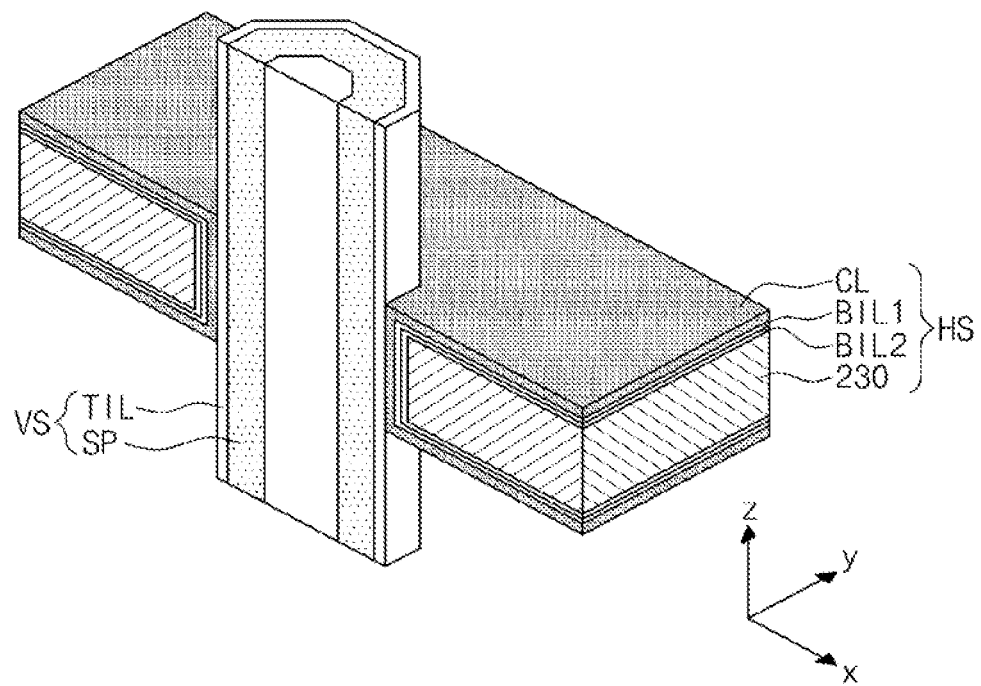
Figure 46A:
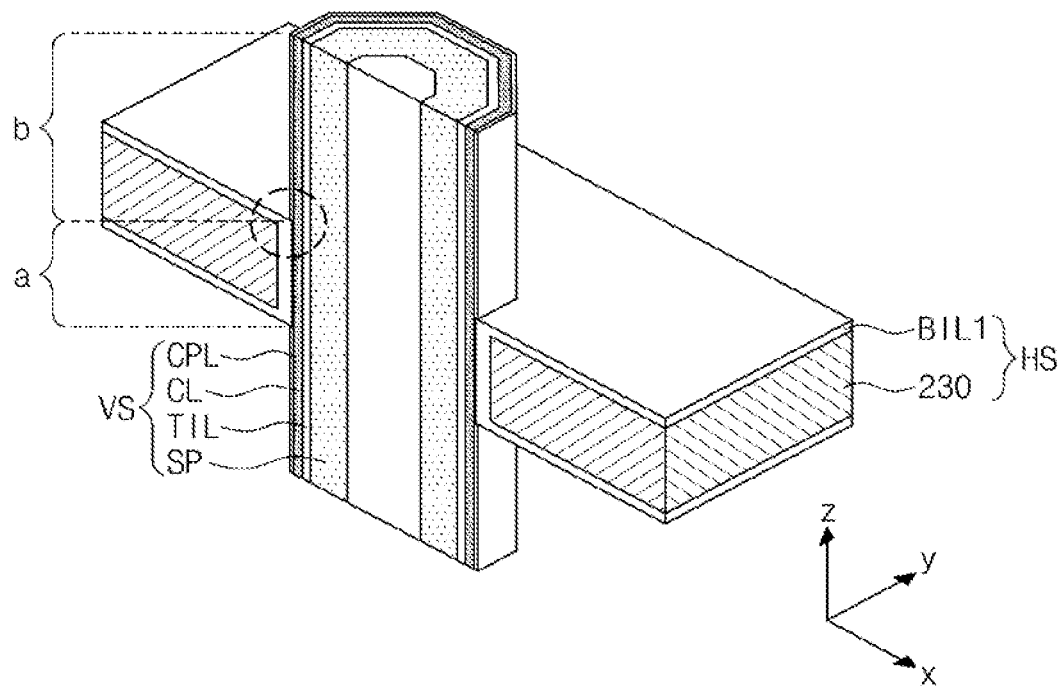
Figure 46B:
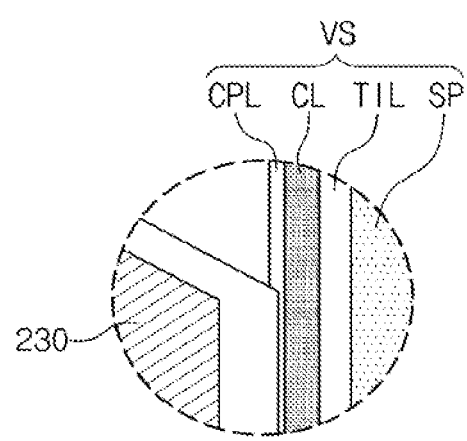
Figure 47:
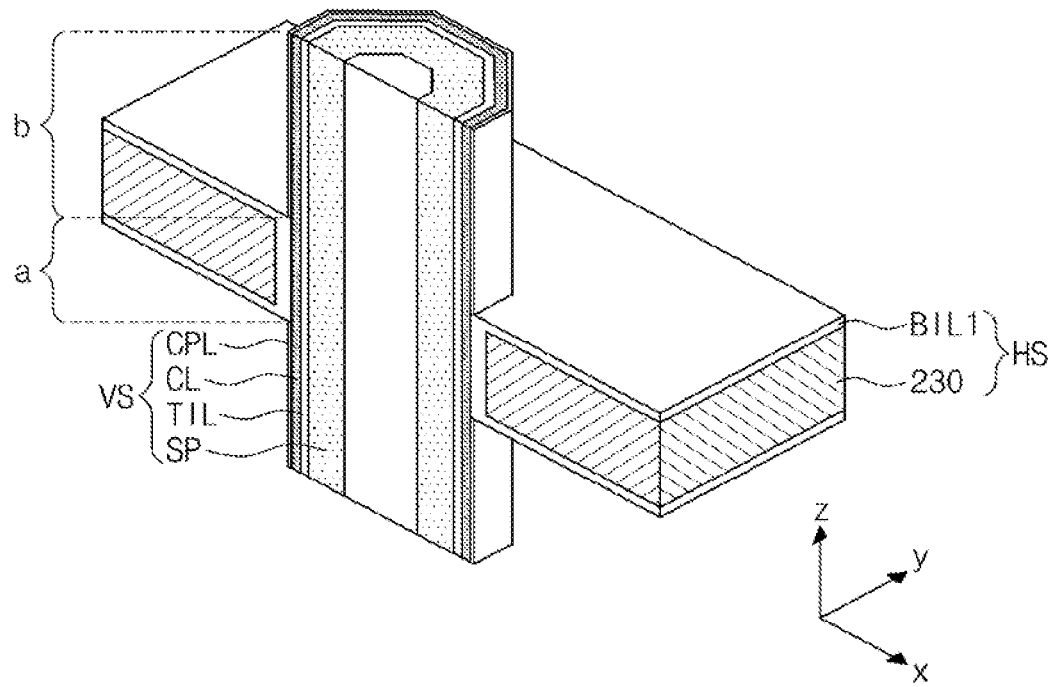
Figure 48:
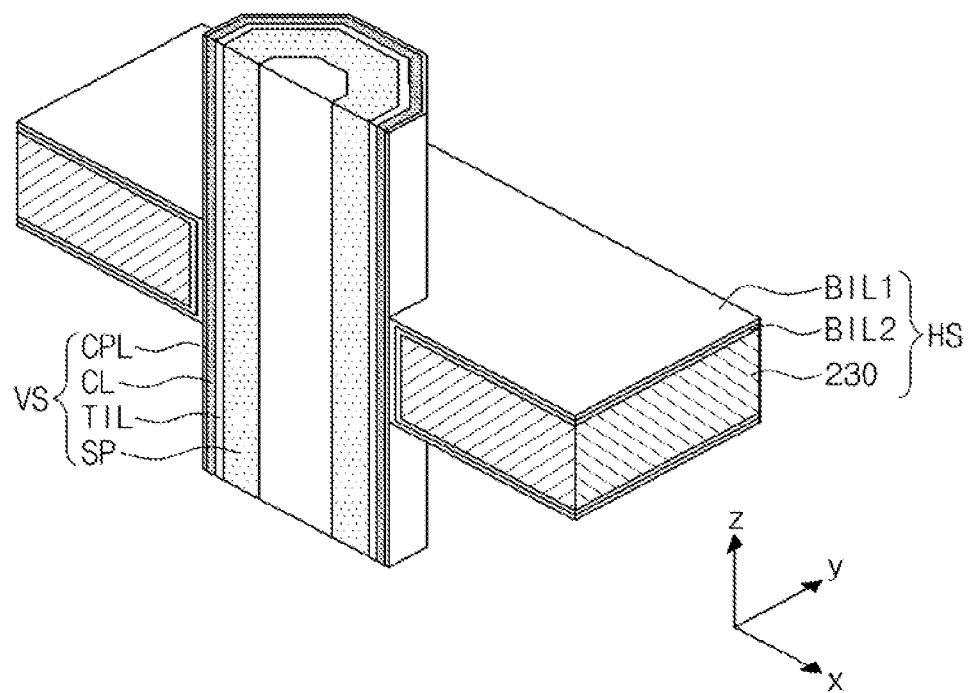
Figure 49:
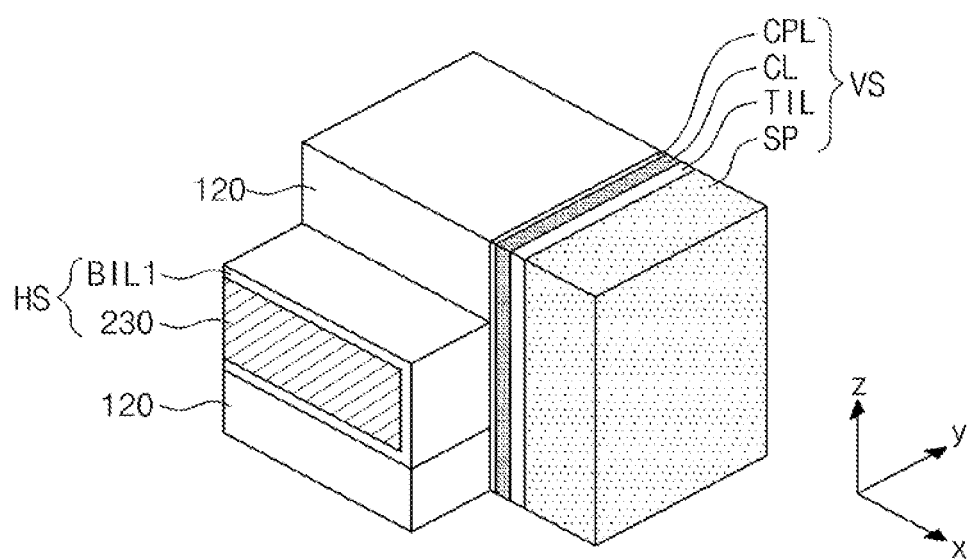
Figure 50:
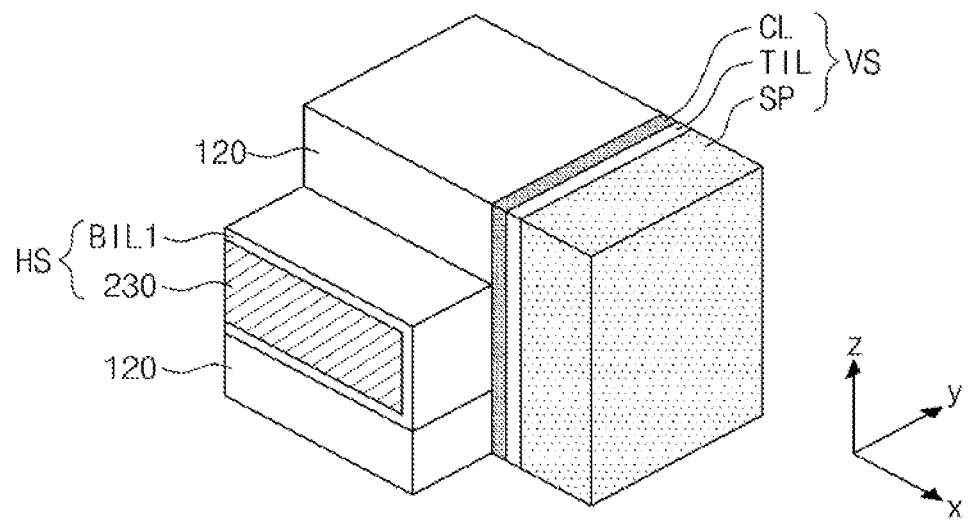
Figure 51:
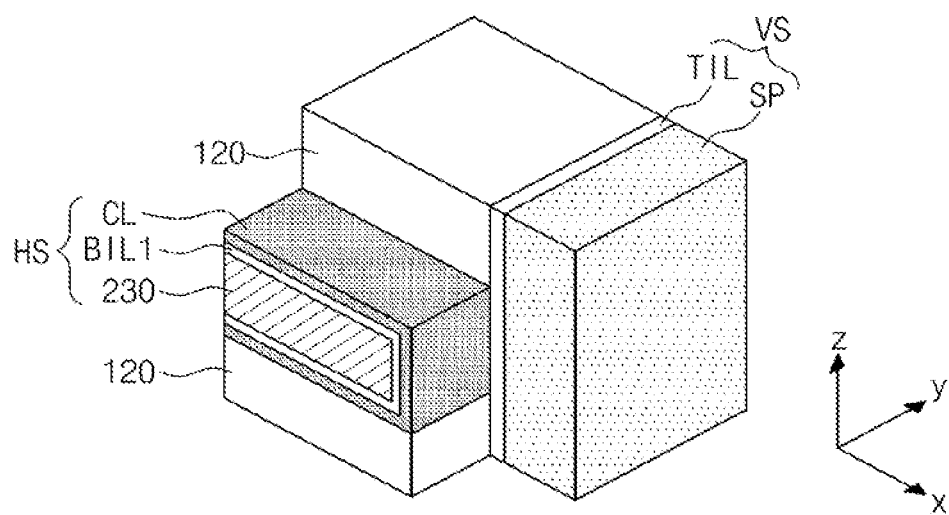
Figure 52:
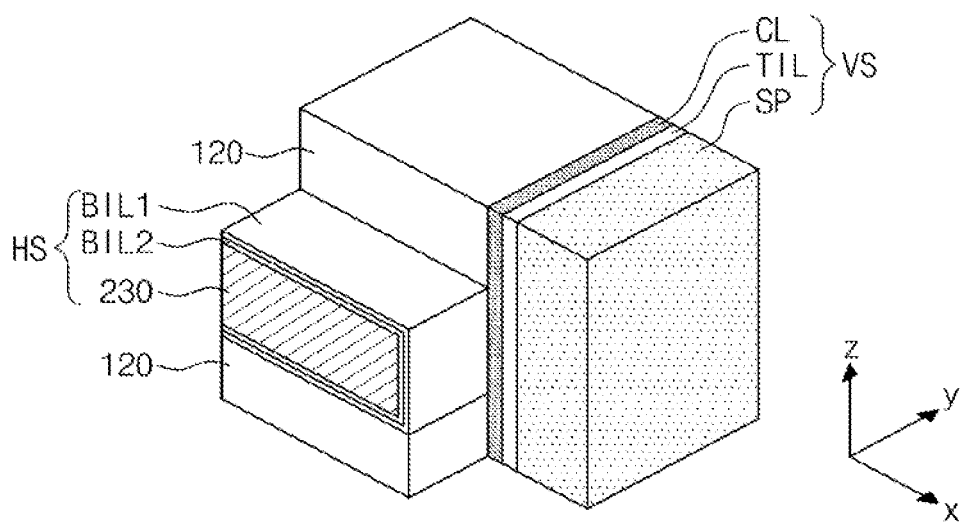
Figure 53:
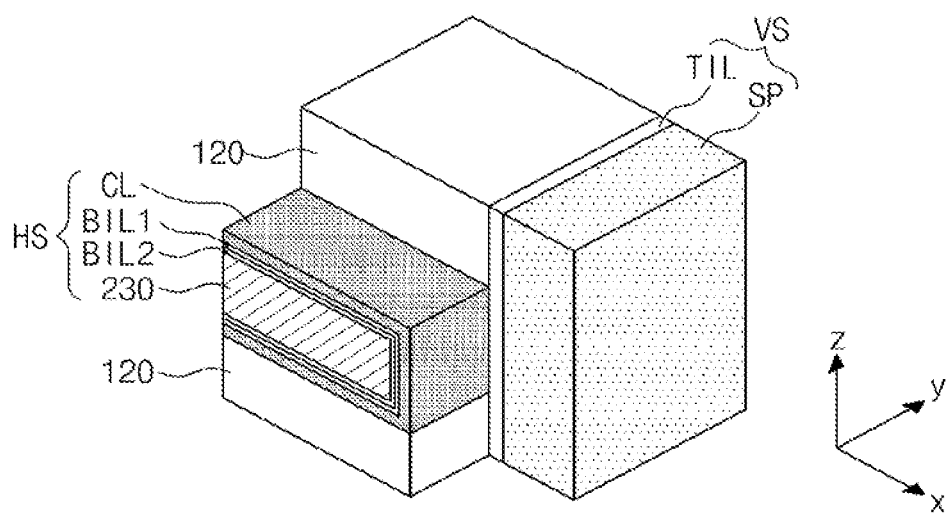
Figure 54A:
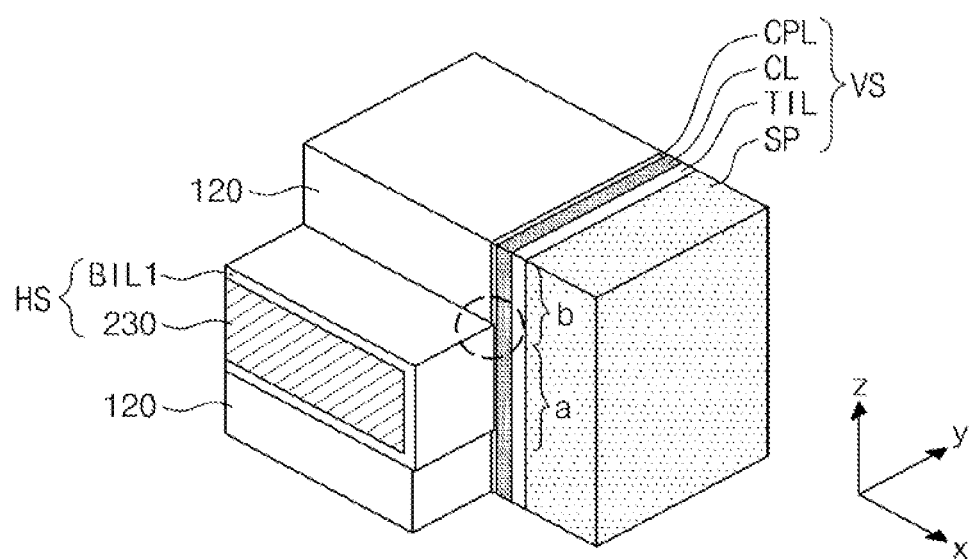
Figure 54B:
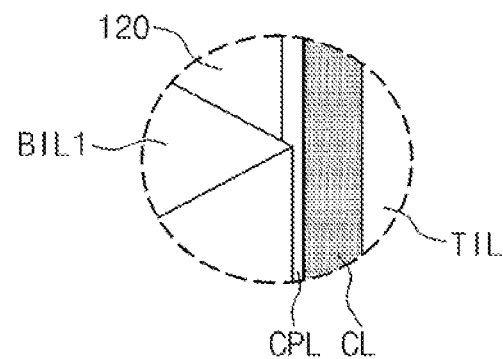
Figure 55:
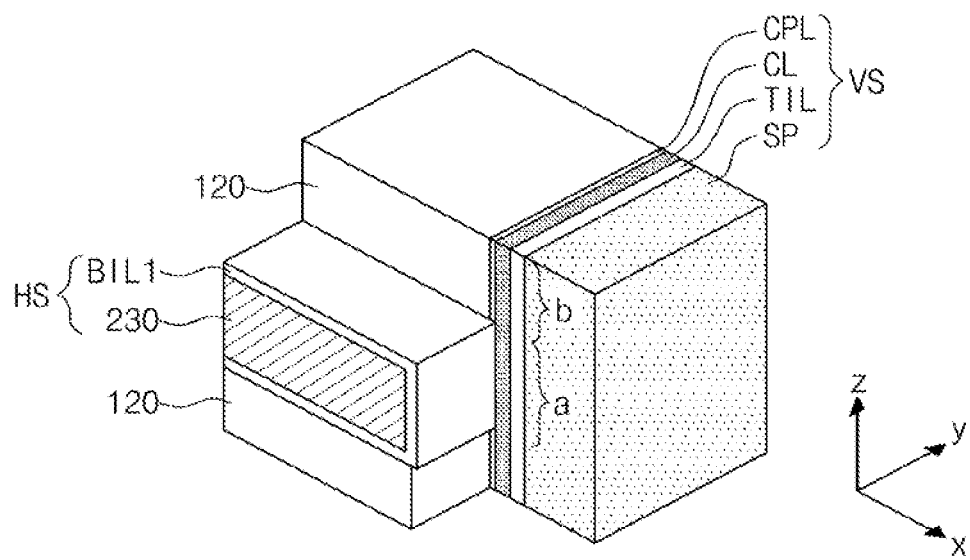

According to an embodiment, the sidewall thickness of the capping layer CPL may be non-uniform. For example, according to an embodiment, during the forming of the recess regions 210, the sidewall of the capping layer CPL adjacent to the horizontal structure HS may be horizontally recessed. A thickness of the capping layer CPL is thicker at a region "b" (or a vertical adjacent region) between neighboring horizontal structures HS than at a region "a" (or a channel region) adjacent to the horizontal structure HS as illustrated in FIGS. 46 and 54. The vertical adjacent region b is a region located between neighboring channel regions a. Alternatively, the capping layer CPL may remain at the vertical adjacent region "b", and the horizontal structure HS may directly contact the sidewall of the charge storing layer CL at the channel region "a" as illustrated in FIGS. 47 and 55. According to an embodiment, the sidewall thickness of the capping layer CPL may be substantially uniform as illustrated in FIGS. 41 and 49.

According to an exemplary embodiment, the horizontal structure HS may include both of the first and second blocking insulating layers BIL1 and BIL2 as illustrated in FIGS. 44, 45, 48, 52, 53, and 56.

According to an embodiment, the charge storing layer CL may include one or more insulating layers with abundant trap sites and/or one or more insulating layers with nano particles. According to an embodiment, the charge storing layer CL may be formed, for example, by CVD and/or ALD. For example, according to an embodiment, the charge storing layer CL may include one of a trap insulating layer and/or an insulating layer with a floating gate electrode and/or conductive nano dots. According to an embodiment, the charge storing layer CL may include a silicon nitride layer, a silicon oxynitride layer, a silicon-rich nitride layer, a nano crystalline silicon layer, and/or a laminated trap layer.

According to an embodiment, the tunnel insulating layer TIL may include a material with a larger band gap than a band gap of the charge storing layer CL. According to an embodiment, the tunnel insulating layer TIL may be formed by, for example, CVD and/or ALD. For example, according to an embodiment, the tunnel insulating layer TIL may include a silicon oxide layer. The tunnel insulating layer TIL undergoes a thermal treatment after a deposition process. According to an embodiment, the thermal treatment process may be, for example, a rapid thermal nitridation (RTN) process and/or an annealing process performed in an atmosphere including nitrogen and/or oxygen.

The first and second blocking insulating layers BIL1 and BIL2 include different materials from each other, and one of the first and second blocking insulating layers BIL1 and BIL2 may include a material having a band bap smaller than a band gap of the tunnel insulating layer TIL and larger than a band gap of the charge storing layer CL. According to an embodiment, the first and second blocking insulating layers BIL1 and BIL2 may be formed by, for example, CVD and/or ALD. According to an embodiment, at least one of BIL1 and BIL2 may be formed by wet oxidation. According to an exemplary embodiment, the first blocking insulating layer BIL1 may include a high-k dielectric layer (e.g., an aluminum oxide layer and/or a hafnium oxide layer). According to an embodiment, the second blocking insulating layer BIL2 may include, for example, a material with a smaller dielectric constant than the a dielectric constant of the first blocking insulating layer BIL1. According to an exemplary embodiment, the second blocking insulating layer BIL2 may include a high-k dielectric layer, and the first blocking insulating layer BIL1 may include a material with a smaller dielectric constant than a smaller dielectric constant of the second blocking insulating layer BIL2. According to an exemplary embodiment, a third blocking insulating layer (not shown) may be included between the charge storing layer CL and the conductive pattern 230.

The capping layer CPL includes a material having an etch selectivity to the charge storing layer CL and/or the sacrificial layer 130. For example, according to an embodiment, if the sacrificial layer 130 is a silicon nitride layer, the capping layer CPL may be a silicon oxide layer. During a process for removing the sacrificial layer 130 to form the recess regions 210, the capping layer CPL functions as an etch stop layer to prevent or reduce etch damage to the charge storing layer CL. According to an embodiment, if the capping layer CPL remains between the conductive pattern 230 and the charge storing layer CL (e.g., as shown in FIGS. 41, 46, 48, 49, 54, and 56), the capping layer CPL may include a material that may prevent leakage (e.g., back-tunneling) of charges stored in the charge storing layer CL. For example, according to an embodiment, the capping layer CPL may include one of a silicon oxide layer and a high-k dielectric layer.

Figure 57:
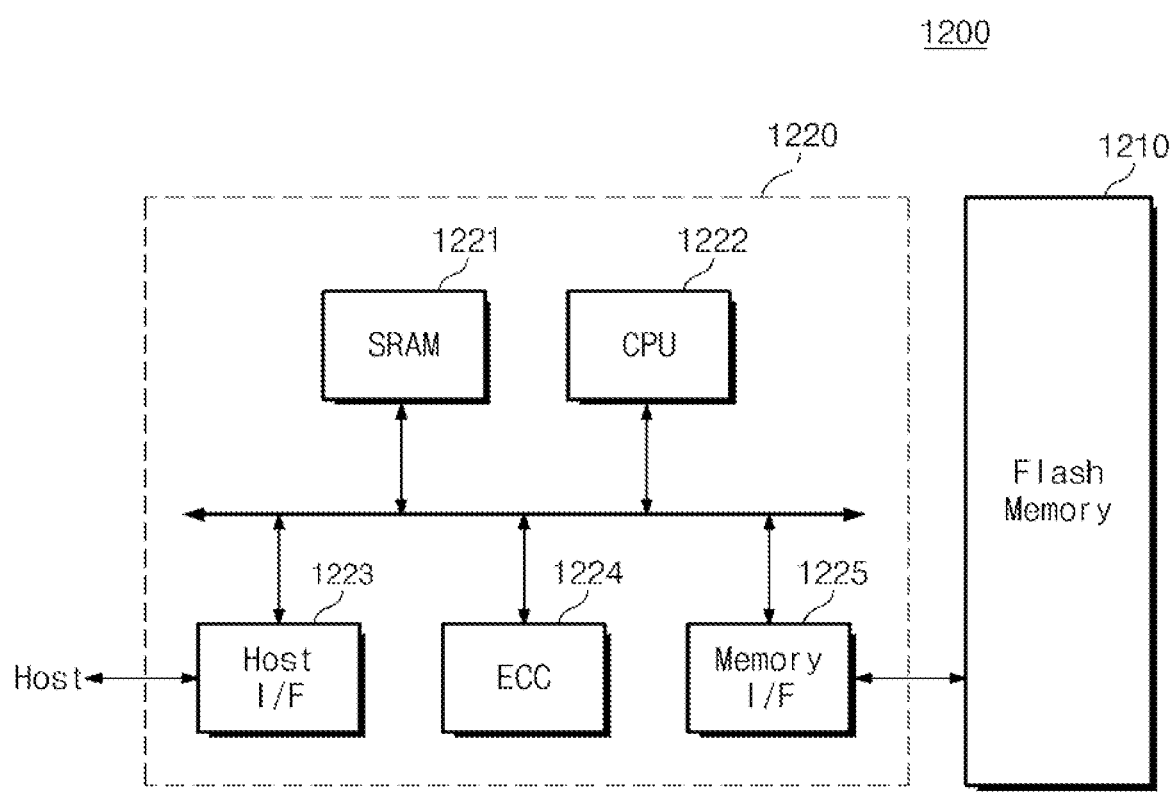
FIG. 57 is a block diagram illustrating a memory card including a memory device according to an exemplary embodiment of the inventive concept.

FIG. 57 is a block diagram illustrating a memory card 1200 including a memory device 1210 according to an exemplary embodiment of the inventive concept.

Figure 56:
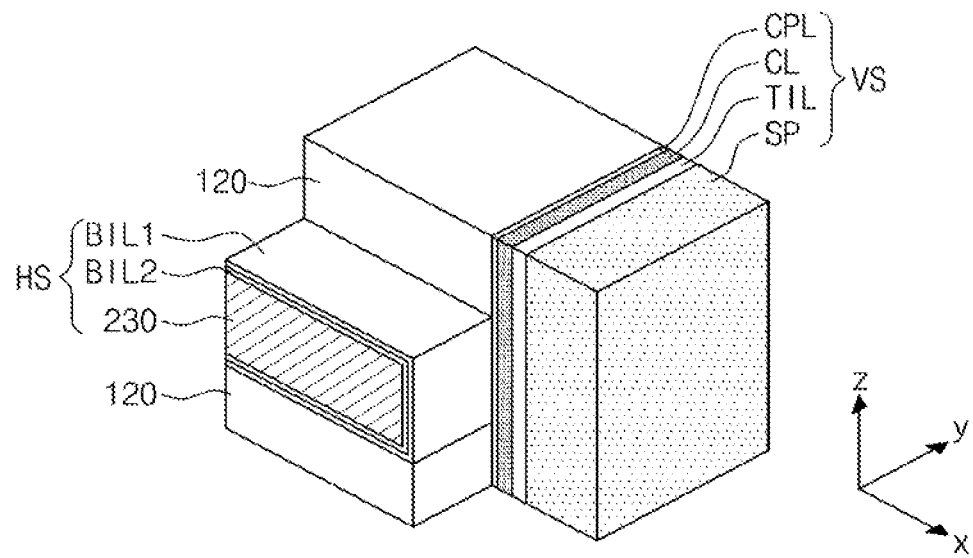

Referring to FIG. 57, the memory card 1200 for supporting high-capacity data storage includes a memory device 1210, for example, including a 3D memory device as described with respect to FIGS. 1 through 56. The memory card 1200 includes a memory controller 1220 that controls general data exchanges between a host and the memory device 1210.

A static random access memory (SRAM) 1221 is used as an operating memory of a processing unit (also referred to as "CPU") 1222. A host interface 1223 includes a data exchange protocol of a host connected to the memory card 1200. An error correction block ("ECC") 1224 detects and corrects errors included in data read from the multi-bit device 1210. A memory interface 1225 interfaces with the memory device 1210. The processing unit 1222 performs general control operations for data exchange of the memory controller 1220. According to an embodiment, the memory card 1200 may further include a ROM (not shown) storing code data to interface with a host.

According to an embodiment, the memory device or the memory card may be realized using the memory device 1210 with improved dummy cell erasing characteristics. For example, according to an embodiment, the memory device may be provided in a memory system, such as a solid state disk (SSD). According to an embodiment, a highly reliable memory system may be realized by preventing a read error caused from a dummy cell.

Figure 58:
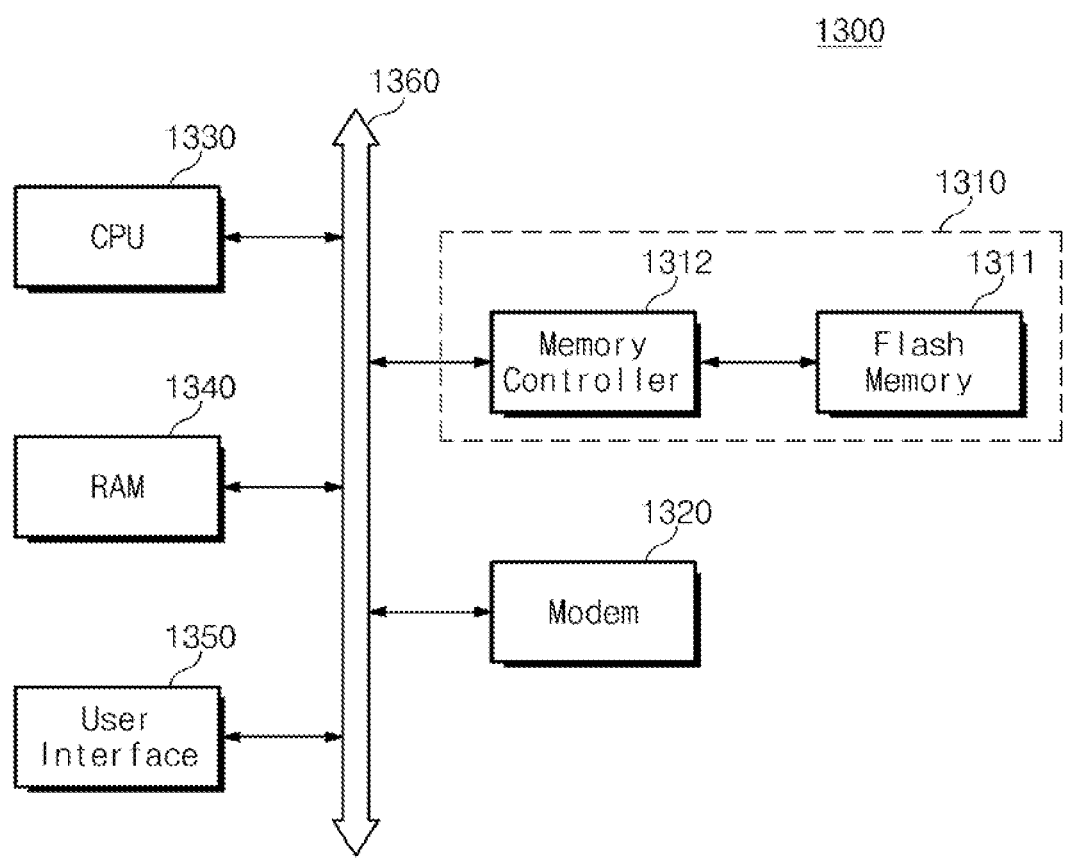
FIG. 58 is a block diagram illustrating an information processing system including a memory system according to an exemplary embodiment of the inventive concept.

FIG. 58 is a block diagram illustrating an information processing system 1300 including a memory system 1310 according to an exemplary embodiment of the inventive concept. According to an embodiment, the memory system 1310 may be mounted on an information processing system, such as, for example, a mobile device and/or a desktop computer. Referring to FIG. 58, the information processing system 1300 includes a memory system 1310, a modem 1320, a central processing unit ("CPU") 1330, a RAM 1340, and a user interface 1350, which are electrically connected to a system bus 1360. The memory system 1310 is the same or substantially the same as the memory system described with respect to FIG. 57. Data processed by the CPU 1330 and/or input from an outside source (not shown) are stored in the memory system 1310. According to an embodiment, a memory system 1310 may include a solid state drive SSD. The information processing system 1300 stably stores a large amount of data in the memory system 1310. As reliability of the information processing system 1300 increases, the memory system 1310 may reduce resources used for error correction, thus providing the information processing system 1310 with a high-speed data exchange function. According to an embodiment, the information processing system 1300 may include an application chipset, a camera image processor (CIS), and/or an input/output device.

According to an exemplary embodiment of the inventive concept, a memory device and/or a memory system may be mounted using various kinds of packages. For instance, according to an embodiment, the memory device and/or the memory system may be mounted in a package, such as Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

According to the embodiments of the inventive concept, the semiconductor pattern may be electrically connected to the substrate by the semiconductor connecting layer extending from the sidewall of the semiconductor pattern. Accordingly, it is possible to simply fabricate a memory device capable of erasing memory cells based on the body or bulk erase scheme.

While exemplary embodiments of the inventive concept have been particularly shown and described, it will be understood by one of ordinary skill in the art that variations in form and detail may be made therein without departing from the spirit and scope of the attached claims.

What is claimed is:

1. A method of fabricating a three-dimensional semiconductor device, comprising:
    forming a mold structure on a substrate, the mold structure comprising a first sacrificial layer and second sacrificial layers on the first sacrificial layer;
    forming an opening penetrating the mold structure to expose the substrate;
    sequentially forming a vertical pattern and a semiconductor pattern in the opening;
    patterning the mold structure to form a trench spaced apart from the opening, wherein the trench exposes the first sacrificial layer;
    removing the exposed first sacrificial layer and a portion of the vertical pattern contacting the first sacrificial layer to form a first recess region that exposes the substrate and a sidewall of the semiconductor pattern; and
    forming a semiconductor connecting layer that extends from the exposed sidewall of the semiconductor pattern to connect the semiconductor pattern to the substrate.

2. The method of claim 1, wherein the first sacrificial layer comprises at least one of a silicon germanium layer or a silicon carbide layer, and the second sacrificial layers each comprises a silicon nitride layer.

3. The method of claim 1, wherein forming the mold structure comprises:
    forming the first sacrificial layer on the substrate; and
    alternately forming insulating layers and the second sacrificial layers on the first sacrificial layer.

4. The method of claim 1, further comprising:
    removing the second sacrificial layers exposed by the trench to form second recess regions; and
    forming horizontal structures that fill the first and second recess regions,
    wherein forming the horizontal structure comprises:
        forming a horizontal pattern covering inner walls of the first and second recess regions; and
        forming conductive patterns that fill remaining spaces of the first and second recess regions.

5. The method of claim 4, further comprising forming a second protection layer covering a sidewall and a bottom surface of the trench,
    wherein the second protection layer is formed along the first recess region.

6. The method of claim 1, further comprising forming a third protection layer on an inner wall of the trench.

7. The method of claim 1, further comprising:
    removing the second sacrificial layers exposed by the trench to form second recess regions; and
    forming horizontal structures in the first and second recess regions,
    wherein forming the horizontal structures comprises:
        forming horizontal patterns covering inner walls of the second recess regions and first conductive patterns filling remaining spaces of the second recess regions;
        forming a gate insulating layer on the semiconductor connecting layer; and
        forming a second conductive pattern to fill a remaining space of the first recess region.

* * * * *